United States Patent
Arghavani et al.

(10) Patent No.: US 9,922,977 B2
(45) Date of Patent: Mar. 20, 2018

(54) TRANSISTOR WITH THRESHOLD VOLTAGE SET NOTCH AND METHOD OF FABRICATION THEREOF

(71) Applicant: Mie Fujitsu Semiconductor Limited, Kuwana, Mie (JP)

(72) Inventors: Reza Arghavani, Scotts Valley, CA (US); Pushkar Ranade, Los Gatos, CA (US); Lucian Shifren, San Jose, CA (US); Scott E. Thompson, Gainesville, FL (US); Catherine de Villeneuve, San Jose, CA (US)

(73) Assignee: Mie Fujitsu Semiconductor Limited, Kuwana (JP)

(*) Notice: Subject to any disclaimer, the term of this patent is extended or adjusted under 35 U.S.C. 154(b) by 0 days.

(21) Appl. No.: 15/192,288

(22) Filed: Jun. 24, 2016

(65) Prior Publication Data

US 2016/0336318 A1 Nov. 17, 2016

Related U.S. Application Data

(60) Continuation of application No. 14/296,527, filed on Jun. 5, 2014, now Pat. No. 9,418,987, which is a
(Continued)

(51) Int. Cl.
*H01L 29/10* (2006.01)
*H01L 27/092* (2006.01)
(Continued)

(52) U.S. Cl.
CPC .... *H01L 27/0921* (2013.01); *H01L 21/82345* (2013.01); *H01L 21/823412* (2013.01);
(Continued)

(58) Field of Classification Search
CPC . H01L 27/088; H01L 27/0921; H01L 29/105; H01L 29/1083; H01L 29/365;
(Continued)

(56) References Cited

U.S. PATENT DOCUMENTS

| | | |
|---|---|---|
| 3,958,266 A | 5/1976 | Athanas |
| 4,000,504 A | 12/1976 | Berger |

(Continued)

FOREIGN PATENT DOCUMENTS

| | | |
|---|---|---|
| CN | 1701442 | 11/2005 |
| CN | 101421839 | 4/2009 |

(Continued)

OTHER PUBLICATIONS

Webster's Concise Dictionary of the English Language. Encyclopedic Edition. 2003 Edition, Sidney Landay—Editor in Chie, pp. 228, 229, 445.*

(Continued)

*Primary Examiner* — Galina Yushina
(74) *Attorney, Agent, or Firm* — Baker Botts L.L.P.

(57) ABSTRACT

A structure and method of fabrication thereof relate to a Deeply Depleted Channel (DDC) design, allowing CMOS based devices to have a reduced $\sigma V_T$ (variation in $V_T$) compared to conventional bulk CMOS and can allow the threshold voltage $V_T$ of FETs having dopants in the channel region to be set much more precisely. A novel dopant profile indicative of a distinctive notch enables tuning of the $V_T$ setting within a precise range. This $V_T$ set range may be extended by appropriate selection of metals of a gate electrode material so that a very wide range of $V_T$ settings is accommodated on the die. The DDC design also can have a strong body effect compared to conventional bulk CMOS transistors, which can allow for significant dynamic control of power consumption in DDC transistors. The result is the (Continued)

ability to independently control $V_T$ (with a low $\sigma V_T$) and $V_{DD}$ (the operating voltage supplied to the transistor), so that the body bias can be tuned separately from $V_T$ for a given device.

7 Claims, 41 Drawing Sheets

Related U.S. Application Data division of application No. 12/971,955, filed on Dec. 17, 2010, now Pat. No. 8,759,872.

(60) Provisional application No. 61/357,492, filed on Jun. 22, 2010.

(51) Int. Cl.

| | | |
|---|---|---|
| H01L 21/8234 | (2006.01) | |
| H01L 27/088 | (2006.01) | |
| H01L 29/36 | (2006.01) | |
| H01L 29/66 | (2006.01) | |
| H01L 29/78 | (2006.01) | |
| H01L 21/8238 | (2006.01) | |
| H01L 29/06 | (2006.01) | |
| H01L 29/49 | (2006.01) | |

(52) U.S. Cl.
CPC ........ *H01L 21/823493* (2013.01); *H01L 21/823807* (2013.01); *H01L 21/823842* (2013.01); *H01L 21/823878* (2013.01); *H01L 21/823892* (2013.01); *H01L 27/088* (2013.01); *H01L 29/0653* (2013.01); *H01L 29/105* (2013.01); *H01L 29/1083* (2013.01); *H01L 29/365* (2013.01); *H01L 29/4966* (2013.01); *H01L 29/66537* (2013.01); *H01L 29/7836* (2013.01)

(58) Field of Classification Search
CPC ......... H01L 29/66537; H01L 29/7836; H01L 29/0653; H01L 29/4966; H01L 21/823412; H01L 21/82312; H01L 21/823807; H01L 21/823842; H01L 21/823892; H01L 21/82345; H01L 21/823493

See application file for complete search history.

(56) References Cited

U.S. PATENT DOCUMENTS

| | | |
|---|---|---|
| 4,021,835 A | 5/1977 | Etoh |
| 4,242,691 A | 12/1980 | Kotani |
| 4,276,095 A | 6/1981 | Beilstein, Jr. |
| 4,315,781 A | 2/1982 | Henderson |
| 4,518,926 A | 5/1985 | Swanson |
| 4,559,091 A | 12/1985 | Allen |
| 4,578,128 A | 3/1986 | Mundt |
| 4,617,066 A | 10/1986 | Vasudev |
| 4,662,061 A | 5/1987 | Malhi |
| 4,761,384 A | 8/1988 | Neppl |
| 4,780,748 A | 10/1988 | Cunningham |
| 4,819,043 A | 4/1989 | Yazawa |
| 4,885,477 A | 12/1989 | Bird |
| 4,908,681 A | 3/1990 | Nishida |
| 4,945,254 A | 7/1990 | Robbins |
| 4,956,311 A | 9/1990 | Liou |
| 5,034,337 A | 7/1991 | Mosher |
| 5,144,378 A | 9/1992 | Hikosaka |
| 5,156,989 A | 10/1992 | Williams |
| 5,156,990 A | 10/1992 | Mitchell |
| 5,166,765 A | 11/1992 | Lee |
| 5,208,473 A | 5/1993 | Komori |
| 5,294,821 A | 3/1994 | Iwamatsu |
| 5,298,763 A | 3/1994 | Shen |
| 5,369,288 A | 11/1994 | Usuki |
| 5,373,186 A | 12/1994 | Schubert |
| 5,384,476 A | 1/1995 | Nishizawa |
| 5,426,279 A | 6/1995 | Dasgupta |
| 5,426,328 A | 6/1995 | Yilmaz |
| 5,444,008 A | 8/1995 | Han |
| 5,552,332 A | 9/1996 | Tseng |
| 5,559,368 A | 9/1996 | Hu |
| 5,608,253 A | 3/1997 | Liu |
| 5,622,880 A | 4/1997 | Burr |
| 5,624,863 A | 4/1997 | Helm |
| 5,625,568 A | 4/1997 | Edwards |
| 5,641,980 A | 6/1997 | Yamaguchi |
| 5,663,583 A | 9/1997 | Matloubian |
| 5,675,172 A | 10/1997 | Miyamoto |
| 5,712,501 A | 1/1998 | Davies |
| 5,719,422 A | 2/1998 | Burr |
| 5,726,488 A | 3/1998 | Watanabe |
| 5,726,562 A | 3/1998 | Mizuno |
| 5,731,626 A | 3/1998 | Eaglesham |
| 5,736,419 A | 4/1998 | Naem |
| 5,753,555 A | 5/1998 | Hada |
| 5,754,826 A | 5/1998 | Gamal |
| 5,756,365 A | 5/1998 | Kakumu |
| 5,763,921 A | 6/1998 | Okumura |
| 5,780,899 A | 7/1998 | Hu |
| 5,847,419 A | 12/1998 | Imai |
| 5,856,003 A | 1/1999 | Chiu |
| 5,861,334 A | 1/1999 | Rho |
| 5,877,049 A | 3/1999 | Liu |
| 5,885,876 A | 3/1999 | Dennen |
| 5,889,315 A | 3/1999 | Farrenkopf |
| 5,895,954 A | 4/1999 | Yasumura |
| 5,899,714 A | 5/1999 | Farremkopf |
| 5,918,129 A | 6/1999 | Fulford, Jr. |
| 5,923,067 A | 7/1999 | Voldman |
| 5,923,985 A | 7/1999 | Aoki et al. |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning |
| 6,001,695 A | 12/1999 | Wu |
| 6,020,227 A | 2/2000 | Bulucea |
| 6,043,139 A | 3/2000 | Eaglesham |
| 6,060,345 A | 5/2000 | Hause |
| 6,060,364 A | 5/2000 | Maszara |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son |
| 6,121,153 A | 9/2000 | Kikkawa |
| 6,144,079 A | 11/2000 | Shirahata |
| 6,147,383 A | 11/2000 | Kuroda |
| 6,153,920 A | 11/2000 | Gossmann |
| 6,184,112 B1 | 2/2001 | Maszara |
| 6,190,979 B1 | 2/2001 | Radens |
| 6,194,259 B1 | 2/2001 | Nayak |
| 6,198,157 B1 | 3/2001 | Ishida |
| 6,218,892 B1 | 4/2001 | Soumyanath |
| 6,218,895 B1 | 4/2001 | De |
| 6,221,724 B1 | 4/2001 | Yu |
| 6,229,188 B1 | 5/2001 | Aoki |
| 6,232,164 B1 | 5/2001 | Tsai |
| 6,235,597 B1 | 5/2001 | Miles |
| 6,245,618 B1 | 6/2001 | An |
| 6,268,640 B1 | 7/2001 | Park |
| 6,271,070 B2 | 8/2001 | Kotani |
| 6,271,551 B1 | 8/2001 | Schmitz |
| 6,288,429 B1 | 9/2001 | Iwata |
| 6,297,132 B1 | 10/2001 | Zhang |
| 6,300,177 B1 | 10/2001 | Sundaresan |
| 6,313,489 B1 | 11/2001 | Letavic |

(56) References Cited

U.S. PATENT DOCUMENTS

| | | |
|---|---|---|
| 6,319,799 B1 | 11/2001 | Ouyang |
| 6,320,222 B1 | 11/2001 | Forbes |
| 6,323,525 B1 | 11/2001 | Noguchi |
| 6,326,666 B1 | 12/2001 | Bernstein |
| 6,335,233 B1 | 1/2002 | Cho |
| 6,358,806 B1 | 3/2002 | Puchner |
| 6,380,019 B1 | 4/2002 | Yu |
| 6,391,752 B1 | 5/2002 | Colinge |
| 6,426,260 B1 | 7/2002 | Hshieh |
| 6,426,279 B1 | 7/2002 | Huster |
| 6,432,754 B1 | 8/2002 | Assaderaghi |
| 6,444,550 B1 | 9/2002 | Hao |
| 6,444,551 B1 | 9/2002 | Ku |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall |
| 6,482,714 B1 | 11/2002 | Hieda |
| 6,489,224 B1 | 12/2002 | Burr |
| 6,492,232 B1 | 12/2002 | Tang |
| 6,500,739 B1 | 12/2002 | Wang |
| 6,501,131 B1 | 12/2002 | Divakaruni |
| 6,503,801 B1 | 1/2003 | Rouse |
| 6,503,805 B2 | 1/2003 | Wang |
| 6,506,640 B1 | 1/2003 | Ishida |
| 6,518,623 B1 | 2/2003 | Oda |
| 6,521,470 B1 | 2/2003 | Lin |
| 6,534,373 B1 | 3/2003 | Yu |
| 6,541,328 B2 | 4/2003 | Whang |
| 6,541,829 B2 | 4/2003 | Nishinohara |
| 6,548,842 B1 | 4/2003 | Bulucea |
| 6,551,885 B1 | 4/2003 | Yu |
| 6,552,377 B1 | 4/2003 | Yu |
| 6,573,129 B2 | 6/2003 | Hoke |
| 6,576,535 B2 | 6/2003 | Drobny |
| 6,593,799 B2 | 7/2003 | De |
| 6,600,200 B1 | 7/2003 | Lustig |
| 6,620,671 B1 | 9/2003 | Wang |
| 6,624,488 B1 | 9/2003 | Kim |
| 6,627,473 B1 | 9/2003 | Oikawa |
| 6,630,710 B1 | 10/2003 | Augusto |
| 6,638,847 B1 | 10/2003 | Cheung |
| 6,660,605 B1 | 12/2003 | Liu |
| 6,662,350 B2 | 12/2003 | Fried |
| 6,667,200 B2 | 12/2003 | Sohn |
| 6,670,260 B1 | 12/2003 | Yu |
| 6,693,333 B1 | 2/2004 | Yu |
| 6,724,065 B2 * | 4/2004 | Sato ............... G11C 11/412 257/296 |
| 6,730,568 B2 | 5/2004 | Sohn |
| 6,737,724 B2 | 5/2004 | Hieda |
| 6,743,291 B2 | 6/2004 | Ang |
| 6,743,684 B2 | 6/2004 | Liu |
| 6,751,519 B1 | 6/2004 | Satya |
| 6,753,230 B2 | 6/2004 | Sohn |
| 6,760,900 B2 | 7/2004 | Rategh |
| 6,787,424 B1 | 9/2004 | Yu |
| 6,797,553 B2 | 9/2004 | Adkisson |
| 6,797,602 B1 | 9/2004 | Kluth |
| 6,797,994 B1 | 9/2004 | Hoke |
| 6,808,004 B2 | 10/2004 | Kamm |
| 6,808,994 B1 | 10/2004 | Wang |
| 6,813,750 B2 | 11/2004 | Usami |
| 6,821,825 B2 | 11/2004 | Todd |
| 6,821,852 B2 | 11/2004 | Rhodes |
| 6,822,297 B2 | 11/2004 | Nandakumar |
| 6,831,292 B2 | 12/2004 | Currie |
| 6,835,639 B2 | 12/2004 | Rotondaro |
| 6,852,602 B2 | 2/2005 | Kanzawa |
| 6,852,603 B2 | 2/2005 | Chakravarthi |
| 6,881,641 B2 | 4/2005 | Wieczorek |
| 6,881,987 B2 | 4/2005 | Sohn |
| 6,891,439 B2 | 5/2005 | Jachne |
| 6,893,947 B2 | 5/2005 | Martinez |
| 6,900,519 B2 | 5/2005 | Cantell |
| 6,901,564 B2 | 5/2005 | Stine |
| 6,916,698 B2 | 7/2005 | Mocuta |
| 6,917,237 B1 | 7/2005 | Tschanz |
| 6,927,463 B2 | 8/2005 | Iwata |
| 6,928,128 B1 | 8/2005 | Sidiropoulos |
| 6,930,007 B2 | 8/2005 | Bu |
| 6,930,360 B2 | 8/2005 | Yamauchi |
| 6,957,163 B2 | 10/2005 | Ando |
| 6,963,090 B2 | 11/2005 | Passlack |
| 6,995,397 B2 | 2/2006 | Yamashita |
| 7,002,214 B1 | 2/2006 | Boyd |
| 7,008,836 B2 | 3/2006 | Algotsson |
| 7,013,359 B1 | 3/2006 | Li |
| 7,015,546 B2 | 3/2006 | Herr |
| 7,015,741 B2 | 3/2006 | Tschanz |
| 7,022,559 B2 | 4/2006 | Barnak |
| 7,036,098 B2 | 4/2006 | Eleyan |
| 7,038,258 B2 | 5/2006 | Liu |
| 7,039,881 B2 | 5/2006 | Regan |
| 7,042,051 B2 | 5/2006 | Ootsuka |
| 7,045,456 B2 | 5/2006 | Murto |
| 7,061,058 B2 | 6/2006 | Chakravarthi |
| 7,064,039 B2 | 6/2006 | Liu |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,513 B2 | 8/2006 | Bard |
| 7,089,515 B2 | 8/2006 | Hanafi |
| 7,091,093 B1 | 8/2006 | Noda |
| 7,105,399 B1 | 9/2006 | Dakshina-Murthy |
| 7,109,099 B2 | 9/2006 | Tan |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch |
| 7,169,675 B2 | 1/2007 | Tan |
| 7,170,120 B2 | 1/2007 | Datta |
| 7,176,137 B2 | 2/2007 | Perug |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,208,354 B2 | 4/2007 | Bauer |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,230,680 B2 | 6/2007 | Fujisawa |
| 7,235,822 B2 | 6/2007 | Li |
| 7,256,639 B1 | 8/2007 | Koniaris |
| 7,259,428 B2 | 8/2007 | Inaba |
| 7,260,562 B2 | 8/2007 | Czajkowski |
| 7,297,994 B2 | 11/2007 | Wieczorek |
| 7,301,208 B2 | 11/2007 | Handa |
| 7,304,350 B2 | 12/2007 | Misaki |
| 7,307,471 B2 | 12/2007 | Gammie |
| 7,312,500 B2 | 12/2007 | Miyashita |
| 7,323,754 B2 | 1/2008 | Ema |
| 7,332,439 B2 | 2/2008 | Lindert |
| 7,348,629 B2 | 3/2008 | Chu |
| 7,354,833 B2 | 4/2008 | Liaw |
| 7,380,225 B2 | 5/2008 | Joshi |
| 7,398,497 B2 | 7/2008 | Sato |
| 7,402,207 B1 | 7/2008 | Besser |
| 7,402,872 B2 | 7/2008 | Murthy |
| 7,416,605 B2 | 8/2008 | Zollner |
| 7,442,971 B2 | 10/2008 | Wirbeleit |
| 7,449,733 B2 | 11/2008 | Inaba |
| 7,469,164 B2 | 12/2008 | Du-Nour |
| 7,470,593 B2 | 12/2008 | Rouh |
| 7,485,536 B2 | 2/2009 | Jin |
| 7,487,474 B2 | 2/2009 | Ciplickas |
| 7,491,988 B2 | 2/2009 | Tolchinsky |
| 7,494,861 B2 | 2/2009 | Chu |
| 7,496,862 B2 | 2/2009 | Chang |
| 7,496,867 B2 | 2/2009 | Turner |
| 7,501,324 B2 | 3/2009 | Babcock |

(56) References Cited

U.S. PATENT DOCUMENTS

| | | |
|---|---|---|
| 7,503,020 B2 | 3/2009 | Allen |
| 7,514,766 B2 | 4/2009 | Yoshida |
| 7,521,323 B2 | 4/2009 | Surdeanu |
| 7,531,836 B2 | 5/2009 | Liu |
| 7,538,364 B2 | 5/2009 | Twynam |
| 7,538,412 B2 | 5/2009 | Schulze |
| 7,562,233 B1 | 7/2009 | Sheng |
| 7,564,105 B2 | 7/2009 | Chi |
| 7,566,600 B2 | 7/2009 | Mouli |
| 7,569,456 B2 | 8/2009 | Ko |
| 7,586,322 B1 | 9/2009 | Xu |
| 7,595,243 B1 | 9/2009 | Bulucea |
| 7,598,142 B2 | 10/2009 | Ranade |
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Saxe |
| 7,645,665 B2 | 1/2010 | Kubo |
| 7,655,523 B2 | 2/2010 | Babcock |
| 7,673,273 B2 | 3/2010 | Madurawe |
| 7,675,126 B2 | 3/2010 | Cho |
| 7,675,317 B2 | 3/2010 | Perisetty |
| 7,678,638 B2 | 3/2010 | Chu |
| 7,682,887 B2 | 3/2010 | Dokumaci |
| 7,683,442 B1 | 3/2010 | Burr |
| 7,696,000 B2 | 4/2010 | Liu |
| 7,700,424 B2 | 4/2010 | Boland |
| 7,704,822 B2 | 4/2010 | Jeong |
| 7,704,844 B2 | 4/2010 | Zhu |
| 7,709,828 B2 | 5/2010 | Braithwaite |
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |
| 7,750,374 B2 | 7/2010 | Capasso |
| 7,750,381 B2 | 7/2010 | Hokazono |
| 7,750,405 B2 | 7/2010 | Nowak |
| 7,750,682 B2 | 7/2010 | Bernstein |
| 7,755,144 B2 | 7/2010 | Li |
| 7,755,146 B2 | 7/2010 | Helm |
| 7,759,206 B2 | 7/2010 | Luo |
| 7,761,820 B2 | 7/2010 | Berger |
| 7,808,045 B2 | 10/2010 | Kawahara |
| 7,808,410 B2 | 10/2010 | Kim |
| 7,811,873 B2 | 10/2010 | Mochizuki |
| 7,811,881 B2 | 10/2010 | Cheng |
| 7,821,066 B2 | 10/2010 | Lebby |
| 7,829,402 B2 | 11/2010 | Matocha |
| 7,831,873 B1 | 11/2010 | Trimberger |
| 7,846,822 B2 | 12/2010 | Seebauer |
| 7,855,118 B2 | 12/2010 | Hoentschel |
| 7,859,013 B2 | 12/2010 | Chen |
| 7,863,163 B2 | 1/2011 | Bauer |
| 7,867,835 B2 | 1/2011 | Lee |
| 7,883,977 B2 | 2/2011 | Babcock |
| 7,888,205 B2 | 2/2011 | Herner |
| 7,888,747 B2 | 2/2011 | Hokazono |
| 7,895,546 B2 | 2/2011 | Lahner |
| 7,897,495 B2 | 3/2011 | Ye |
| 7,906,413 B2 | 3/2011 | Cardone |
| 7,910,419 B2 | 3/2011 | Fenouillet-Beranger |
| 7,919,791 B2 | 4/2011 | Flynn |
| 7,926,018 B2 | 4/2011 | Moroz |
| 7,935,984 B2 | 5/2011 | Nakano |
| 7,941,776 B2 | 5/2011 | Majumder |
| 7,945,800 B2 | 5/2011 | Gomm |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell |
| 7,989,900 B2 | 8/2011 | Haensch |
| 7,994,573 B2 | 8/2011 | Pan |
| 8,012,827 B2 | 9/2011 | Yu |
| 8,029,620 B2 | 10/2011 | Kim |
| 8,039,332 B2 | 10/2011 | Bernard |
| 8,046,598 B2 | 10/2011 | Lee |
| 8,048,791 B2 | 11/2011 | Hargrove |
| 8,048,810 B2 | 11/2011 | Tsai |
| 8,051,340 B2 | 11/2011 | Cranford, Jr. |
| 8,053,340 B2 | 11/2011 | Colombeau |
| 8,063,466 B2 | 11/2011 | Kurita |
| 8,067,279 B2 | 11/2011 | Sadra |
| 8,067,280 B2 | 11/2011 | Wang |
| 8,067,302 B2 | 11/2011 | Li |
| 8,076,719 B2 | 12/2011 | Zeng |
| 8,097,529 B2 | 1/2012 | Krull |
| 8,103,983 B2 | 1/2012 | Agarwal |
| 8,105,891 B2 | 1/2012 | Yeh |
| 8,106,424 B2 | 1/2012 | Schruefer |
| 8,106,481 B2 | 1/2012 | Rao |
| 8,110,487 B2 | 2/2012 | Griebenow |
| 8,114,761 B2 | 2/2012 | Mandrekar |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr |
| 8,143,678 B2 | 3/2012 | Kim |
| 8,148,774 B2 | 4/2012 | Mori |
| 8,163,619 B2 | 4/2012 | Yang |
| 8,169,002 B2 | 5/2012 | Chang |
| 8,170,857 B2 | 5/2012 | Joshi |
| 8,173,499 B2 | 5/2012 | Chung |
| 8,173,502 B2 | 5/2012 | Yan |
| 8,176,461 B1 | 5/2012 | Trimberger |
| 8,178,430 B2 | 5/2012 | Kim |
| 8,179,530 B2 | 5/2012 | Levy |
| 8,183,096 B2 | 5/2012 | Wirbeleit |
| 8,183,107 B2 | 5/2012 | Mathur |
| 8,185,865 B2 | 5/2012 | Gupta |
| 8,187,959 B2 | 5/2012 | Pawlak |
| 8,188,542 B2 | 5/2012 | Yoo |
| 8,196,545 B2 | 6/2012 | Kurosawa |
| 8,201,122 B2 | 6/2012 | Dewey, III |
| 8,214,190 B2 | 7/2012 | Joshi |
| 8,217,423 B2 | 7/2012 | Liu |
| 8,225,255 B2 | 7/2012 | Ouyang |
| 8,227,307 B2 | 7/2012 | Chen |
| 8,236,661 B2 | 8/2012 | Dennard |
| 8,239,803 B2 | 8/2012 | Kobayashi |
| 8,247,300 B2 | 8/2012 | Babcock |
| 8,255,843 B2 | 8/2012 | Chen |
| 8,258,026 B2 | 9/2012 | Bulucea |
| 8,266,567 B2 | 9/2012 | El Yahyaoui |
| 8,286,180 B2 | 10/2012 | Foo |
| 8,288,798 B2 | 10/2012 | Passlack |
| 8,299,562 B2 | 10/2012 | Li |
| 8,324,059 B2 | 12/2012 | Guo |
| 2001/0014495 A1 | 8/2001 | Yu |
| 2002/0042184 A1 | 4/2002 | Nandakumar |
| 2002/0043665 A1* | 4/2002 | Ootsuka ......... H01L 21/823807 257/196 |
| 2002/0105034 A1 | 8/2002 | Iwata |
| 2003/0006415 A1 | 1/2003 | Yokogawa |
| 2003/0047763 A1 | 3/2003 | Hieda et al. |
| 2003/0094627 A1 | 5/2003 | Ootsuka et al. |
| 2003/0119292 A1* | 6/2003 | Lee ................. H01L 21/823842 438/596 |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215991 A1 | 11/2003 | Sohn |
| 2003/0215992 A1 | 11/2003 | Sohn |

(56) References Cited

U.S. PATENT DOCUMENTS

| | | |
|---|---|---|
| 2004/0075118 A1 | 4/2004 | Heinemann |
| 2004/0075143 A1 | 4/2004 | Bae |
| 2004/0084731 A1 | 5/2004 | Matsuda |
| 2004/0087090 A1 | 5/2004 | Grudowski |
| 2004/0126947 A1 | 7/2004 | Sohn |
| 2004/0175893 A1 | 9/2004 | Vatus |
| 2004/0180488 A1 | 9/2004 | Lee |
| 2005/0056877 A1 | 3/2005 | Rueckes |
| 2005/0093021 A1 | 5/2005 | Ouyang |
| 2005/0106824 A1 | 5/2005 | Alberto |
| 2005/0230781 A1 | 10/2005 | Ema |
| 2005/0250289 A1 | 11/2005 | Babcock |
| 2005/0276094 A1 | 12/2005 | Yamaoka |
| 2005/0280075 A1 | 12/2005 | Ema |
| 2006/0017100 A1 | 1/2006 | Bol |
| 2006/0022270 A1 | 2/2006 | Boyd |
| 2006/0049464 A1 | 3/2006 | Rao |
| 2006/0068555 A1 | 3/2006 | Zhu |
| 2006/0071278 A1 | 4/2006 | Takao |
| 2006/0091481 A1 | 5/2006 | Li |
| 2006/0154428 A1 | 7/2006 | Dokumaci |
| 2006/0157794 A1 | 7/2006 | Doyle |
| 2006/0163674 A1 | 7/2006 | Cho |
| 2006/0197158 A1 | 9/2006 | Babcock |
| 2006/0203581 A1 | 9/2006 | Joshi |
| 2006/0220114 A1 | 10/2006 | Miyashita |
| 2006/0223248 A1 | 10/2006 | Venugopal |
| 2006/0273299 A1 | 12/2006 | Stephenson |
| 2007/0040222 A1 | 2/2007 | Van Camp |
| 2007/0117326 A1 | 5/2007 | Tan |
| 2007/0158790 A1 | 7/2007 | Rao |
| 2007/0194383 A1 | 8/2007 | Kato |
| 2007/0212861 A1 | 9/2007 | Chidambarrao |
| 2007/0242497 A1 | 10/2007 | Joshi |
| 2008/0067589 A1 | 3/2008 | Ito |
| 2008/0108208 A1 | 5/2008 | Arevalo |
| 2008/0138953 A1 | 6/2008 | Challa |
| 2008/0169493 A1 | 7/2008 | Lee |
| 2008/0169516 A1 | 7/2008 | Chung |
| 2008/0197439 A1 | 8/2008 | Goerlach |
| 2008/0203522 A1 | 8/2008 | Mandelman |
| 2008/0237661 A1 | 10/2008 | Ranade |
| 2008/0258198 A1 | 10/2008 | Bojarczuk |
| 2008/0272409 A1 | 11/2008 | Sonkusale |
| 2008/0308870 A1 | 12/2008 | Faul |
| 2009/0003105 A1 | 1/2009 | Itoh |
| 2009/0004806 A1 | 1/2009 | Siprak |
| 2009/0057746 A1 | 3/2009 | Sugll |
| 2009/0057762 A1 | 3/2009 | Bangsaruntip |
| 2009/0108350 A1 | 4/2009 | Cai |
| 2009/0121298 A1 | 5/2009 | Furukawa |
| 2009/0134468 A1 | 5/2009 | Tsuchiya |
| 2009/0224319 A1 | 9/2009 | Kohli |
| 2009/0302383 A1 | 12/2009 | Knaipp et al. |
| 2009/0302388 A1 | 12/2009 | Cai |
| 2009/0309140 A1 | 12/2009 | Khamankar |
| 2009/0321849 A1 | 12/2009 | Miyamura |
| 2010/0012988 A1 | 1/2010 | Yang |
| 2010/0038724 A1 | 2/2010 | Anderson |
| 2010/0100856 A1 | 4/2010 | Mittal |
| 2010/0148153 A1 | 6/2010 | Hudait |
| 2010/0149854 A1 | 6/2010 | Vora |
| 2010/0187641 A1 | 7/2010 | Zhu |
| 2010/0207182 A1 | 8/2010 | Paschal |
| 2010/0270600 A1 | 10/2010 | Inukai |
| 2011/0059588 A1 | 3/2011 | Kang |
| 2011/0073961 A1 | 3/2011 | Dennard |
| 2011/0074498 A1* | 3/2011 | Thompson ...... H01L 21/823412 327/543 |
| 2011/0079860 A1 | 4/2011 | Verhulst |
| 2011/0079861 A1* | 4/2011 | Shifren ........... H01L 21/823412 257/402 |
| 2011/0095811 A1 | 4/2011 | Chi |
| 2011/0121404 A1* | 5/2011 | Shifren ........... H01L 21/823412 257/392 |
| 2011/0147828 A1 | 6/2011 | Murthy |
| 2011/0169082 A1 | 7/2011 | Zhu |
| 2011/0175170 A1 | 7/2011 | Wang |
| 2011/0180880 A1 | 7/2011 | Chudzik |
| 2011/0193164 A1 | 8/2011 | Zhu |
| 2011/0212590 A1 | 9/2011 | Wu |
| 2011/0230039 A1 | 9/2011 | Mowry |
| 2011/0242921 A1 | 10/2011 | Tran |
| 2011/0248352 A1* | 10/2011 | Shifren ........... H01L 21/823807 257/369 |
| 2011/0294278 A1 | 12/2011 | Eguchi |
| 2011/0309447 A1 | 12/2011 | Arghavani |
| 2012/0021594 A1 | 1/2012 | Gurtej |
| 2012/0034745 A1 | 2/2012 | Colombeau |
| 2012/0056275 A1 | 3/2012 | Cai |
| 2012/0065920 A1 | 3/2012 | Nagumo |
| 2012/0108050 A1 | 5/2012 | Chen |
| 2012/0132998 A1 | 5/2012 | Kwon |
| 2012/0138953 A1 | 6/2012 | Cai |
| 2012/0146155 A1 | 6/2012 | Hoentschel |
| 2012/0167025 A1 | 6/2012 | Gillespie |
| 2012/0187491 A1 | 7/2012 | Zhu |
| 2012/0190177 A1 | 7/2012 | Kim |
| 2012/0223363 A1 | 9/2012 | Kronholz |

FOREIGN PATENT DOCUMENTS

| | | |
|---|---|---|
| CN | 200910109443.3 | 8/2009 |
| CN | 101661889 | 9/2011 |
| EP | 0274278 | 7/1988 |
| EP | 0312237 | 4/1989 |
| EP | 0531621 | 3/1993 |
| EP | 0683515 | 11/1995 |
| EP | 0889502 | 1/1999 |
| EP | 1 450 394 A1 | 8/2004 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | H09246534 | 9/1997 |
| JP | 2000-243958 | 9/2000 |
| JP | 2001-308129 A | 11/2001 |
| JP | 2003031803 | 1/2003 |
| JP | 2004087671 | 3/2004 |
| JP | 2010034569 | 2/2010 |
| KR | 794094 | 1/2008 |
| TW | 200943388 | 10/2009 |
| WO | WO 2011/062788 | 5/2011 |

OTHER PUBLICATIONS

Korean IP Office Notice of Preliminary Rejection issued in Appl. No. 10-2013-7001612; 15 pages including English Concise Explanation of Office Action, dated Aug. 8, 2016.

Korean Intellectual Property Office Notice of Preliminary Rejection in Appl. No. 10-2013-7001612; 5 pages including translation, dated Feb. 24, 2017.

US 7,011,991, 03/2006, Li (withdrawn).

Banerjee, et al. "Compensating Non-Optical Effects using Electrically-Driven Optical Proximity Correction", Proc. of SPIE vol. 7275 7275OE, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

(56) References Cited

OTHER PUBLICATIONS

Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.
Matshuashi, et al. "High-Performance Double-Layer Epitaxial-Channel RMOSFET Compatible with a Single Gate CMOSFET", Symposium on VLSI Technology Digest of Technical Papers, pp. 36-37, 1996.
Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.
Sheu, et al. "Modeling the Well-Edge Proximity Effect in Highly Scaled MOSFETs", IEEE Transactions on Electron Devices, vol. 53, No. 11, pp. 2792-2798, Nov. 2006.
Komaragiri, R. et al., "Depletion-Free Poly Gate Electrode Architecture for/Sub 100 Nanometer CMOS Devices with High-K Gate Dielectrics", IEEE IEDM Tech Dig., San Francisco CA, 833-836, (Dec. 13-15, 2004), Dec. 2004.
Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.
Wong, H et al., "Nanoscale CMOS", Proceedings of the IEEE, Vo. 87, No. 4, pp. 537-570, Apr. 1999.
Holland, OW and Thomas, DK "A Method to Improve Activation of Implanted Dopants in SiC", Oak Ridge National Laboratory, Oak Ridge, TN, 2001.
Werner, P et al., "Carbon Diffusion in Silicon", Applied Physics Letters, vol. 73, No. 17, pp. 2465-2467, Oct. 1998.
Pinacho, R et al., "Carbon in Silicon: Modeling of Diffusion and Clustering Mechanisms", Journal of Applied Physics, vol. 92, No. 3, pp. 1582-1588, Aug. 2002.
Scholz, R et al., "Carbon-Induced Undersaturation of Silicon Self-Interstitials", Appl. Phys. Lett. 72(2), pp. 200-202, Jan. 1998.
Goesele, U et al., Diffusion Engineering by Carbon in Silicon, Mat. Res. Soc. Symp. vol. 610, 2000.
Ducroquet, F et al. "Fully Depleted Silicon-On-Insulator nMOSFETs with Tensile Strained High Carbon Content Sil-yCy Channel", ECS 210th Meeting, Abstract 1033, 2006.
Lavéant, P. "Incorporation, Diffusion and Agglomeration of Carbon in Silicon", Solid State Phenomena, vols. 82-84, pp. 189-194, 2002.
Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961.
Stolk, PA et al., "Physical Mechanisms of Transient Enhanced Dopant Diffusion in Ion-Implanted Silicon", J. Appl. Phys. 81(9), pp. 6031-6050, May 1997.
Scholz, RF et al., "The Contribution of Vacancies to Carbon Out-Diffusion in Silicon", Appl. Phys. Lett., vol. 74, No. 3, pp. 392-394, Jan. 1999.
Robertson, LS et al., "The Effect of Impurities on Diffusion and Activation of Ion Implanted Boron in Silicon", Mat. Res. Soc. Symp. vol. 610, 2000.
PCT Notification of Transmittal of the International Search Report and the Written Opinion of the International Searching Authority for International Application No. PCT/US2011/041156, dated Sep. 21, 2011; 12 pages.
Yan, et al., "Scaling the Si MOSFET: From Bulk to SOI to Bulk", IEEE Transactions on Electron Devices, IEEE Service Center, Pisacataway, NJ, US, vol. 39, No. 7, Jul. 1, 1992 pp. 1704-1710.
PCT Notice of Transmittal of the International Search Report and the Written Opinion of the International Search Authority, or the Declaration, PCT/US2011/041167; 11 pp. dated Sep. 9, 2011.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.
Chau, R et al., "A 50nm Depleted-Substrate CMOS Transistor (DST)", Electron Device Meeting 2001, IEDM Technical Digest, IEEE International, pp. 29.1.1-29.1.4.
Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24.
Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.
Wann, C. et al., "Channel Profile Optimization and Device Design for Low-Power High-Performance Dynamic-Threshold MOSFET", IEDM 96, pp. 113-116.
Thompson, S et al., "MOS Scaling: Transistor Challenges for the 21st Century", Intel Technology Journal Q3' 1998, pp. 1-19.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462.
Yan, Ran-Hong et al., "Scaling the Si MOSFET: From Bulk to SOI to Bulk", IEEE Transactions on Electron Devices, vol. 39, No. 7, Jul. 1992.
Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113.
Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.
Taiwanese Office Action issued in Appl. No. 100121618; 3 pages with English Concise Explanation of Office Action, dated May 4, 2016.
ISBN 0-13-138140-7 cover page and p. 162 CMOS Process Technology, Chapter 5, Sec. 5.10, Bipolar/CMO, Copyright 1990 by Prentice-Hall, Inc.
Taiwanese Office Action issued in Appl. No. 100121611; 8 pages with English Concise Explanation of Office Action, dated Oct. 15, 2015.
Taiwanese Office Action issued in Appl. No. 100121611; 7 pages with English Concise Explanation of Office Action, dated Sep. 21, 2015.
Japanese Office Action issued in Appl. No. 2013-516664; 5 pages with English translation, dated Feb. 24, 2015.
State Intellectual Property Office of the People's Republic of China, The First Office Action, Application No. 201180035830.2; with English language translation, 15 pages, dated Jun. 6, 2014 received Jul. 10, 2014.
State Intellectual Property Office of the People's Republic of China, Notification of the First Office Action, Application No. 201180040485.1; with English language translation, 15 pages, dated Sep. 2, 2014 received Oct. 15, 2014.
Chinese Official Action issued in Appl. No. 100121618; 15 pages including English Concise Explanation of Office Action, dated Dec. 29, 2016.
John Y. Chen; CMOS Devices and Technology for VLSI; 1990 by Prentice-Hall, Inc. 369 pages.
Korean Patent Office Notice of Allowance for Application No. 10-2013-7001612 (with machine translation), dated May 26, 2017.
Chinese First Office Action;.re: Application No. 2015104589537; 13 pages including English translation, dated Oct. 11, 2017.
Korean Intellectual Property Office Notice of Preliminary Rejection for Patent Application No. 10-2017-7022958 (with translation), dated Nov. 15, 2017.

\* cited by examiner

| Device | SuVolta 40nm | |
|---|---|---|
| Layer | NMOS | PMOS |
| NWL | Y | N |
| PWL | N | Y |
| SPW / NSCREEN | Y | N |
| SNW / PSCREEN | N | Y |
| LOGIC VTP (L/S/H) | N | Y |
| LOGIC VTN (L/S/H) | Y | N |
| SRAM VTP | N | Y |
| SRAM VTN | Y | N |
| High V VTP (2.5) | N | N |
| High V VTN (2.5) | N | N |
| Pre-doped poly | N | N |

TABLE 2

| Device Type | Shallow well | Non-shallow well | Legacy | Mask Adder |
|---|---|---|---|---|
| Option A | Y | N | N | +1 |
| Option B | Y | Y | N | +2 |
| Option C | Y | Y | Y | +3 |

TABLE 3

FIG. 3A

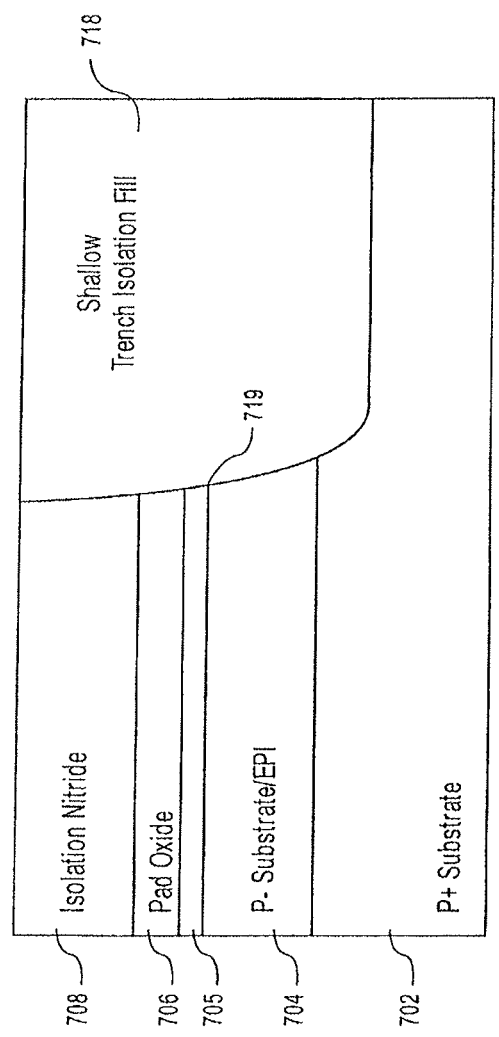

TRANSISTOR WITH THRESHOLD VOLTAGE SET NOTCH AND METHOD OF FABRICATION THEREOF

CROSS REFERENCE TO RELATED APPLICATION

This application is a continuation of U.S. application Ser. No. 14/296,527 filed Jun. 5, 2014 and entitled "Transistor with Threshold Voltage Set Notch and Method of Fabrication Thereof" which is a divisional of U.S. application Ser. No. 12/971,955, which claims the benefit of U.S. Provisional Application No. 61/357,492, each being hereby incorporated herein by reference.

TECHNICAL FIELD

This application relates in general to semiconductor devices and fabrication processes associated therewith and more particularly to a transistor with threshold voltage set notch and method of fabrication thereof.

BACKGROUND

For some time the semiconductor industry has been using bulk CMOS wafer technology to make integrated circuits. Wafers are diced into individual sections commonly known die or chips, with each chip being packaged into electronic devices. Bulk CMOS technology has proven to be particularly "scalable," meaning that bulk CMOS transistors can be made smaller and smaller while optimizing and reusing existing manufacturing processes and equipment in order to maintain acceptable production costs. Historically, as the size of a bulk CMOS transistor decreased, so did its power consumption, helping the industry provide increased transistor density and lower operating power. Thus, the semiconductor industry has been able to scale the power consumption of bulk CMOS transistors with their size, reducing the cost of operating transistors and the systems in which they reside.

In recent years, however, decreasing the power consumption of bulk CMOS transistors while reducing their size has become increasingly more difficult. Transistor power consumption directly affects chip power consumption, which, in turn, affects the cost of operating a system and, in some cases, the utility of the system. For example, if the number of transistors in the same chip area doubles while the power consumption per transistor remains the same or increases, the power consumption of the chip will more than double. This is due in part by the need to cool the resulting chip, which also requires more energy. As a result, this would more than double the energy costs charged to the end user for operating the chip. Such increased power consumption could also significantly reduce the usefulness of consumer electronics, for example, by reducing the battery life of mobile devices. It could also have other effects such as increasing heat generation and the need for heat dissipation, potentially decreasing reliability of the system, and negatively impacting the environment.

There has arisen among semiconductor engineers a widespread perception that continued reduction of power consumption of bulk CMOS is not feasible, in part because it is believed that the operating voltage $V_{DD}$ of the transistor can no longer be reduced as transistor size decreases. A CMOS transistor is either on or off. The CMOS transistor's state is determined by the value of a voltage applied to the gate of the transistor relative to a threshold voltage $V_T$ of the transistor. While a transistor is switched on, it consumes dynamic power, which can be expressed by the equation:

$$P_{dynamic} = CV_{DD}^2 f$$

where $V_{DD}$ is the operating voltage supplied to the transistor, C is the load capacitance of the transistor when it is switched on, and f is the frequency at which the transistor is operated. While a transistor is switched off, it consumes static power, which can be expressed by the equation:

$$P_{static} = I_{OFF} V_{DD}$$

where $I_{OFF}$ is the leakage current when the transistor is switched off. Historically, the industry has reduced transistor power consumption primarily by reducing the operating voltage $V_{DD}$, which reduces both dynamic and static power.

The ability to reduce the operating voltage $V_{DD}$ depends in part on being able to accurately set the threshold voltage $V_T$, but that has become increasingly difficult as transistor dimensions decrease. For transistors made using bulk CMOS processes, one of the primary parameters that sets the threshold voltage $V_T$ is the amount of dopants in the channel. Other factors that affect $V_T$ are halo implantation, source and drain low doped extensions, and channel thickness. In theory, matching transistor $V_T$ can be done precisely, such that the same transistors on the same chip will have the same $V_T$, but in reality the process and statistical variations in dopant concentration and placement mean that threshold voltages can vary significantly. Such mismatched transistors will not all switch on at the same time in response to the same gate voltage, and in extreme cases some may never switch on. Of even more concern, mismatched transistors result in increased leakage losses that waste power even when a transistor is not actively switching.

For transistors having a channel length of 100 nm or less, as few as thirty to fifty dopant atoms may be positioned in a channel at nominal dopant concentration levels. This compares with the thousands, or tens of thousands of atoms that are in positioned in the channel for previous generation transistors that have channel lengths greater than 100 nanometers or so. For nanometer scale transistors, the inherent statistical variation in numbers and placement of such few dopant atoms results in a detectable variation in $V_T$ known as random dopant fluctuations (RDF). Along with process and material variations, for nanometer scale bulk CMOS transistors with doped channel, RDF is a major determinant of variations in $V_T$ (typically referred to as sigma $V_T$ or $\sigma V_T$) and the amount of $\sigma V_T$ caused by RDF only increases as channel length decreases.

Processes and designs for novel transistors having greatly reduced $\sigma V_T$ are sought by the industry. However, many proposed solutions such as undoped channel FINFET would require substantial changes in transistor process manufacture and layout. This has slowed adoption, since the industry prefers to avoid redesigns that require substantial change in conventional and widely used integrated circuit manufacturing processes and transistor layout. This is particularly true for Systems on a Chip (SoC) or other highly integrated devices that include a wide variety of circuit types, such as analog input and output circuits (I/O), digital circuits, and other types of circuits. Moreover, given the different types of circuits on such highly integrated systems, if one or more types of circuits can be improved, and any necessary legacy circuits remain the same, the overall SoC should still be produced together to avoid extra steps in the manufacturing process. For example, if an improvement to the digital circuits can be accomplished, and the improvement did not apply to analog circuits, it would be desirable to have the circuits to be manufactured together simultaneously without adding further processing steps. The entire integrated circuit can be redesigned to accommodate operation at the reduced voltage power source. As referenced herein, the term "redesign" can include appropriate sizing of transistor gates prior to circuit fabrication. However, difficulties are encountered when redesign attempts are made. Extra process and masking steps, can be complex, costly and technically difficult.

Given the substantial costs and risks associated with transitioning to a new technology, manufacturers of semiconductors and electronic systems have long sought a way to extend the use of bulk CMOS. At least in part due to the inability to easily control $\sigma V_T$ variation in groups of transistors as $V_{DD}$ is substantially reduced below one volt, the continued reduction of power consumption in bulk CMOS has increasingly become viewed in the semiconductor industry as an insurmountable problem.

SUMMARY

There is substantial advantage in having a low power digital transistor process and structure that permits on-die analog I/O transistors to remain unchanged even when low power transistors replace standard transistors. Thus, it is desirable to have a mix of circuits where some are changed and others are unchanged legacy circuits, but where the process to manufacture them is not substantially changed. And to reduce costs and increase yields, it would be best to not substantially increase the number of manufacturing steps in producing the overall integrated circuit.

Thus, there is a need in the art for improved structures and fabrication methods for complementary metal oxide semiconductor (CMOS) transistors and integrated circuits, and also a transistor fabrication process that is compatible with the fabrication of both legacy and novel digital and analog transistors on a single integrated circuit die. As will be seen, various embodiments described herein provides such structures and processes to address shortcomings in the prior art and in an elegant manner.

A suite of novel and diverse structures and methods is provided to reduce power consumption in a wide array of electronic devices and systems. These novel and diverse structures may be implemented together with other devices including legacy devices on a common silicon substrate. Some of these structures and methods can be implemented largely by reusing existing bulk CMOS process flows and manufacturing technology, allowing the semiconductor industry as well as the broader electronics industry to avoid a costly and risky switch to alternative technologies. Some of the structures and methods relate to a Deeply Depleted Channel (DDC) design, allowing CMOS based devices to have a reduced $\sigma V_T$ compared to conventional bulk CMOS and can allow the threshold voltage $V_T$ of FETs having dopants in the channel region to be set much more precisely. There are many ways to configure the DDC to achieve different benefits, and additional structures and methods presented herein can be used alone or in conjunction with the DDC to yield additional benefits.

The disclosure describes various technical advantages over conventional semiconductor fabrication processing. One technical advantage is to provide a dopant profile indicative of a distinctive notch in order to enable tuning of the $V_T$ setting within a precise range. Another technical advantage is that the $V_T$ set range may be extended by appropriate selection of metals so that a very wide range of $V_T$ settings is accommodated on the die. Yet another technical advantage includes the use of a body bias to provide significant dynamic control of power consumption in DDC transistors. The result is the ability to independently control $V_T$ (with a low $\sigma V_T$) and $V_{DD}$, so that the body bias can be tuned separately from $V_T$ for a given device.

Certain embodiments of the present disclosure may enjoy some, all, or none of these advantages. Other technical advantages may be readily apparent to one skilled in the art from the following figures, description, and claims.

BRIEF DESCRIPTION OF THE DRAWINGS

For a more complete understanding of the present disclosure, reference is made to the following description taken in conjunction with the accompanying drawings, wherein like reference numerals represent like parts, in which:

FIG. 3A includes two tables of device features according to different embodiments.

FIGS. 4A-4L are flow diagrams showing one embodiment of an integrated circuit process flow.

FIGS. 7A-7J are flow diagrams showing another embodiment of an integrated circuit process flow.

DETAILED DESCRIPTION

Figure 1:
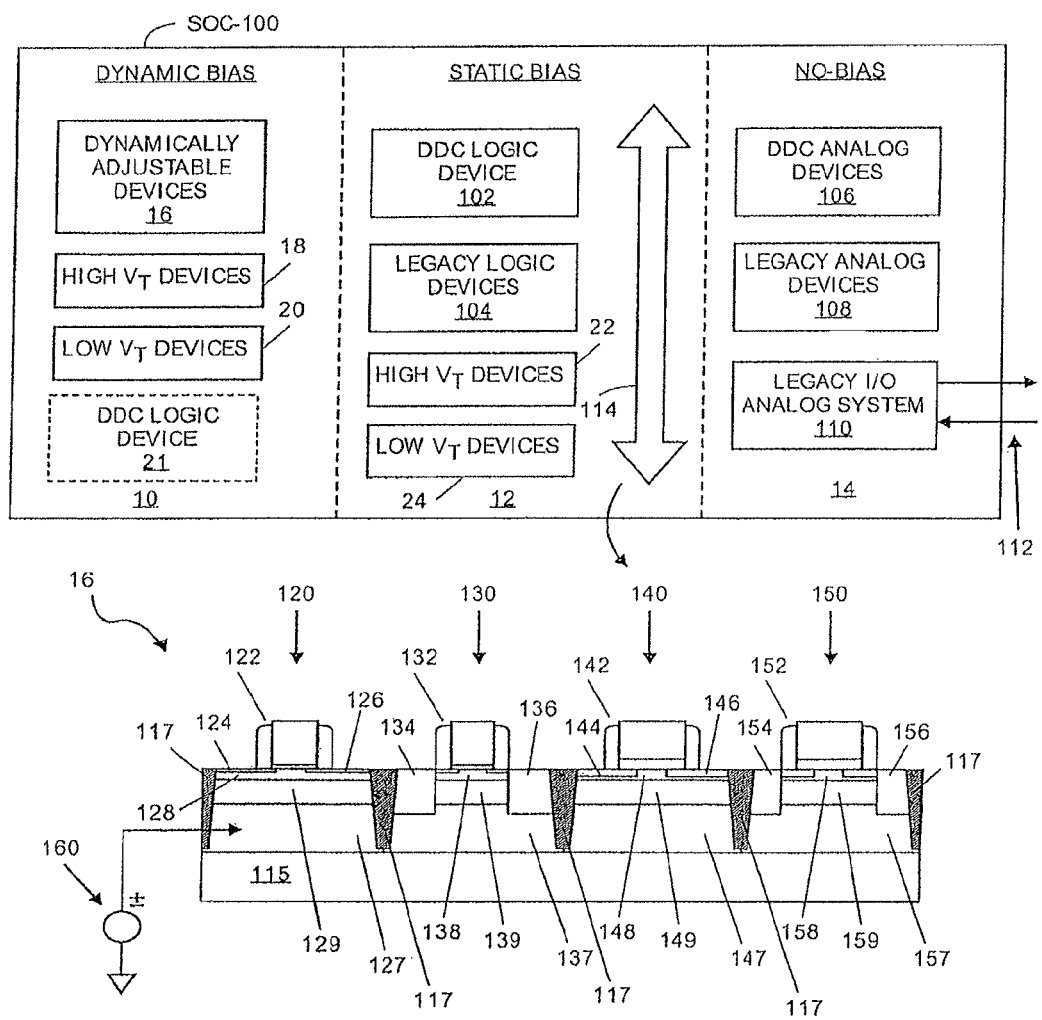
FIG. 1 shows a representative SoC with outlined groupings of DDC digital transistors, digital legacy transistors, DDC analog transistors, analog legacy transistors, high $V_T$ devices, low $V_T$ devices, and other devices, along with an exemplary profile.

Provided are novel structures and methods configured to reduce power consumption in a wide array of electronic devices and systems, and they can be produced together with a variety of different components, including both digital and analog devices, and also together with legacy devices in the same circuit. Provided are process friendly techniques for building a wide range of transistors on the same die with precise and wide ranging $V_T$ control and improved $\sigma V_T$. Furthermore, provided are structures that can be constructed on a singular SoC with the ability to separately set the body bias coefficient and $V_T$. Decoupling these two settings provides designers with the ability to mix and match widely disparate transistor device types on a single SoC.

The value of $V_T$ may be precisely set (with low $\sigma V_T$) using DDC structures, and a novel dopant profile indicative of a distinctive notch enables tuning of the $V_T$ setting within a precise range, in one example to about +/−0.2V. This $V_T$ set range may be extended by appropriate selection of metals so that a very wide range of $V_T$ settings is accommodated on the die. And, this is possible without necessarily requiring multiple separate masking steps for each transistor. With the addition of the accurate setting of both static and/or dynamic bias, different types of transistors can be constructed with a wide ranging $V_T$ within a substantially accurate range. For example, virtually any type of transistor may be constructed having a $V_T$ between −0.9 and +0.9 volts (for a 1.0 $V_{DD}$ transistor) and constructed on the same die.

Functionally, this means that the embodiments described herein provide widely applicable transistor process steps that allow cost effective manufacture of complex high and low $V_T$ or mixed signal circuits. Transistors formed from such process are well matched and/or capable of running in legacy or at various low power modes as desired.

Some of these novel structures and methods can be implemented largely by reusing existing bulk CMOS process flows and current infrastructure manufacturing technology, allowing the semiconductor industry as well as the broader electronics industry to avoid a costly and risky switch to alternative technologies that require expensive changes in fabrication processes and equipment. Different transistor designs, including both analog and digital transistors and a mixture of legacy and innovative structures, can be incorporated into a single integrated circuit or system on a chip (SoC) for improved power saving and performance benefits. Different power modes can be achieved as desired, including legacy modes or low power modes. Moreover, these new structures can be incorporated into the process flow together with legacy transistor and layout structures, reducing the risk to manufacturers of incorporating new structures in the process flow of an integrated circuit by avoiding extra process steps. As a result, there is little or no increase in expense of production of integrated circuits, such as SoC, that incorporate the novel power saving transistor structures.

Also provided are methods and structures for incorporating and using the innovations described herein in systems, such as in electronic products, to provide substantial benefits over conventional devices as a result of lower power operation. Such benefits include lower power consumption at the system level, improved system performance, improved system cost, improved system manufacturability and/or improved system reliability as a result of cooler low power systems that may be designed and manufactured according to the embodiments described and illustrated herein. As will be demonstrated, the innovations can advantageously be employed in a wide range of electronic systems including consumer devices such as personal computers, mobile phones, televisions, digital music players, set top boxes, laptop and palmtop computing devices, e-book readers, digital cameras, GPS systems, flat panel displays, portable data storage devices and tablets, as well as in a variety of other electronic devices. In some implementations, the transistors and integrated circuits can materially enhance the operation and, accordingly, the commercial suitability, of the electronic system as a whole. In some embodiments, innovative transistors, integrated circuits and systems that contain them as described herein may also enable more environmentally friendly implementations than alternative approaches.

These and other benefits provide an advancement in digital circuits that fulfills many needs of designers, producers, and consumers. These benefits can provide systems composed of novel structures that enable continued and further advancement of integrated circuits, resulting in devices and systems with improved performance. The embodiments and examples will be described herein with reference to transistors, integrated circuits, electronic systems, and related methods, and will highlight the features and benefits that the novel structures and methods provide at various levels of the manufacturing process and the chain of commerce, including to end users of electronic products.

The application of concepts inherent in these examples to structures and methods of producing integrated circuits and electronic systems will prove expansive. Accordingly, it will be understood that the spirit and scope of the inventions is not limited to these embodiments and examples, but is only limited by the claims appended herein and also in related and co-assigned applications.

In one embodiment, a novel nanoscale Field Effect Transistor (FET) structure is provided that has precisely controlled threshold voltage in comparison to conventional doped channel devices of the same channel length. In this context, precisely controlled threshold voltage includes the ability to set and possibly tune a $V_T$ value that provides significant improvement or reduction of $\sigma V_T$. This structure and methods of making it can allow FET transistors that have a low operating voltage as compared to conventional devices. One embodiment includes a nanoscale FET structure operable to have a depletion zone or region (i.e. deeply depleted channel, DDC) that extends from a gate to a highly doped screening layer set at a depth below the gate. In one embodiment, a channel region near the gate is substantially undoped as compared to a high concentration screening region located at a distance of at least ½ the gate length below the gate. This provides a substantially undoped channel region or layer (concentration of less than $5\times10^{17}$ atoms/cm$^3$ and typically formed as an epitaxially grown silicon layer) paired with a highly doped screening region or layer. Together, in operation, these structures act to define a deeply depleted zone or region that terminates electric fields emanating from the gate when a voltage that is approximately equal to or greater than the threshold voltage is applied to the gate.

In certain embodiments the screening layer is positioned to avoid direct contact with the source and the drain. In certain other embodiments, it may be formed as a sheet extending under multiple source/drain/channel/screening regions. The screening region thickness can typically range from 5 to 50 nanometers. The screening region is highly doped relative to the channel, the threshold voltage tuning region (if provided), and the P-well. In practice, the screening region is doped to have a concentration between $1\times10^{18}$ and $1\times10^{20}$ atoms/cm$^3$. In certain embodiments, dopant migration resistant layers of carbon, germanium, or the like can be applied above screening region to prevent dopant migration toward the undoped channel and gate.

While threshold voltage is primarily set by the combination of gate work function, body bias, channel thickness, and depth and dopant concentration of the screening layer, small adjustments to threshold voltage are possible by optional provision of a separate epitaxially grown silicon layer adjacent to the screening region. Such a threshold voltage tuning region has a dopant concentration less than the dopant concentration of the screening region. For typical applications the threshold voltage tuning region is doped to have average concentrations ranging from between $5\times10^{17}$ and $2\times10^{19}$ atoms/cm$^3$. When present, the threshold tuning region thickness can typically range from 2 to 50 nanometers in thickness. In certain embodiments, dopant migration resistant layers of carbon, germanium, or the like can be applied above and/or below the threshold voltage tuning region to prevent dopant migration into the channel region, or alternatively, from the screening region into the threshold voltage tuning region.

As will be appreciated, for logic devices below 100 nm, the DDC depth ($X_d$) may be established by the depth of the screening layer below the gate, and is typically one half of the gate length (i.e. ½ $L_G$), possibly equal to gate length (i.e.

$L_G$) or to intermediate fractions thereabout (e.g. ¾ $L_G$). In one example, DDC depth may be set greater than or about equal to one-half the channel length, which in operation allows for precise setting of the threshold voltage even at low operating voltages below one volt. Depending on the requirements of a particular application, different depths may provide different beneficial results. Given this disclosure, it will be understood that different DDC depths are possible in different applications, different device geometries, and various parameters of particular designs. Depending on the parameters of a particular application, different region thicknesses, dopant concentrations, and operating conditions used in forming the DDC transistor may provide different beneficial results.

As will be discussed, some of the structures and methods relate to a DDC design that can be produced together with legacy transistor devices in a monolithic circuit laid out on the same wafer and die. The DDC can permit CMOS devices having reduced $\sigma V_T$ compared to conventional bulk CMOS with highly doped channels, allowing for increased variability of $V_T$. The DDC design also can have a strong body effect compared to conventional bulk CMOS transistors, which can allow for improved body bias assisted control of transistor voltage threshold setting. There are many ways to configure the DDC to achieve different benefits, and additional structures and methods presented herein can be used alone or in conjunction with the DDC to yield additional benefits.

These structures and the methods of making the structures allow for FET transistors having both a low operating voltage and a low threshold voltage as compared to conventional nanoscale devices. Furthermore, DDC transistors can be configured to allow for the threshold voltage to be statically set with the aid of a voltage body bias generator. In some embodiments the threshold voltage can even be dynamically controlled, allowing the transistor leakage currents to be greatly reduced (by setting the voltage bias to upwardly adjust the $V_T$ for low leakage, low speed operation), or increased (by downwardly adjusting the $V_T$ for high leakage, high speed operation). Ultimately, these structures and the methods of making structures provide for designing integrated circuits having FET devices that can be dynamically adjusted while the circuit is in operation. Thus, transistors in an integrated circuit can be designed with nominally identical structure, and can be controlled, modulated or programmed to operate at different operating voltages in response to different bias voltages, or to operate in different operating modes in response to different bias voltages and operating voltages. In addition, these can be configured post-fabrication for different applications within a circuit.

Certain embodiments and examples are described herein with reference to transistors and highlight the features and benefits that the novel structures and methods provide transistors. However, the applicability of concepts inherent in these examples to structures and methods of producing integrated circuits is expansive and not limited to transistors or bulk CMOS. Accordingly, it will be understood in the art that the spirit and scope of the inventions is not limited to these embodiments and examples or to the claims appended herein and also in related and co-assigned applications, but may be advantageously applied in other digital circuitry contexts.

In the following description, numerous specific details are given of some of the preferred ways in which the inventions may be implemented. It is readily apparent that the inventions can be practiced without these specific details. In other instances, well known circuits, components, algorithms, and processes have not been shown in detail or have been illustrated in schematic or block diagram form in order not to obscure the inventions in unnecessary detail. Additionally, for the most part, details concerning materials, tooling, process timing, circuit layout, and die design have been omitted inasmuch as such details are not necessary to obtain a complete understanding of the inventions as they are considered to be within the understanding of persons of ordinary skill in the relevant art. Certain terms are used throughout the following description and claims to refer to particular system components. Similarly, it will be appreciated that components may be referred to by different names and the descriptions herein are not intended to distinguish between components that differ in name but not function. In the following discussion and in the claims, the terms "including" and "comprising" are used in an open-ended fashion, and thus should be interpreted to mean "including, but not limited to," for example.

Various embodiments and examples of the methods and structures mentioned above are described herein. It will be realized that this detailed description is illustrative only and is not intended to be in any way limiting. Other embodiments will readily suggest themselves to persons of ordinary skill in the art having the benefit of this disclosure. Reference will be made in detail to embodiments illustrated in the accompanying drawings. The same reference indicators will be used throughout the drawings and the following detailed description to refer to the same or like parts.

In the interest of clarity, not all of the routine features of the implementations and embodiments described herein are shown and described. It will, of course, be appreciated that in the development of any such actual implementation of the disclosure herein, numerous implementation-specific decisions will typically be made in order to achieve the developer's specific goals. Moreover, it will be appreciated that such a development effort might be complex and time-consuming, but would nevertheless be a routine undertaking of engineering for those of ordinary skill in the art having the benefit of this disclosure.

Also, concentrations of atoms implanted or otherwise present in a substrate or crystalline layers of a semiconductor to modify physical and electrical characteristics of a semiconductor will be described in terms of physical and functional regions or layers. These may be understood by those skilled in the art as three-dimensional masses of material that have particular averages of concentrations. Or, they may be understood as sub-regions or sub-layers with different or spatially varying concentrations. They may also exist as small groups of dopant atoms, regions of substantially similar dopant atoms or the like, or other physical embodiments. Descriptions of the regions based on these properties are not intended to limit the shape, exact location or orientation. They are also not intended to limit these regions or layers to any particular type or number of process steps, type or numbers of layers (e.g., composite or unitary), semiconductor deposition, etch techniques, or growth techniques utilized. These processes may include epitaxially formed regions or atomic layer deposition, dopant implant methodologies or particular vertical or lateral dopant profiles, including linear, monotonically increasing, retrograde, or other suitable spatially varying dopant concentration. The embodiments and examples included herein may show specific processing techniques or materials used, such as epitaxial and other processes described below and illustrated in figures below. These examples are only intended as illustrative examples, and are not nor should they be construed as limiting. The dopant profile may have one or more regions or layers with different dopant concentrations, and the variations in concentrations and how the regions or layers are defined, regardless of process, may or may not be detectable via techniques including infrared spectroscopy, Rutherford Back Scattering (RBS), Secondary Ion Mass Spectroscopy (SIMS), or other dopant analysis tools using different qualitative or quantitative dopant concentration determination methodologies.

In one embodiment, a building block for low power circuits can be configured with low power transistors, such as for example a low power field effect transistor as provided herein that is operable at a voltage $V_{DD}$ of 1.0 volt or lower. In one example, the transistor may include a polysilicon gate with a gate length less than 100 nanometers, where the gate includes a polysilicon layer and a dielectric layer. The device further includes a low doped epitaxial channel contacting the dielectric layer of the polysilicon gate. A highly doped screening layer may be positioned in a manner to extend below low doped epitaxial channel and above a transistor body. The screening layer may be treated to reduce dopant diffusion into the low doped epitaxial channel, as discussed in more detail below. The device includes a source and a drain, with a low doped epitaxial channel extending between the source and drain.

In certain embodiments, a body tap may also be included to permit application of a body bias voltage to the transistor body. Body biasing relies on the body effect phenomenon to modulate the $V_T$ of a MOSFET, and is commonly quantified as a body effect coefficient. As will be appreciated, forward body biasing (FBB) the body with respect to the source reduces $V_T$, increasing transistor speed. However, because of the exponential dependence of leakage on $V_T$, it also leads to a large increase in power usage. Similarly, reverse body biasing (RBB) reduces leakage at the cost of reduced speed and increased delay. In certain embodiments, application of a body bias permits increase of threshold voltage $V_T$ to a value greater than 0.3 volts, for example.

Body taps, schematically illustrated as a connection between a body bias generator and a transistor body, may be applied to individual devices, groups of devices, or entire circuits or sub-circuits on a given integrated circuit depending on the application. According to these embodiments, improved $\sigma V_T$ allows for a stronger body bias coefficient, which in turn allows for improved changes in $V_T$. In prior art systems, the body bias coefficient was improved by highly doping the channel, which resulted in a wide and undesirable range of $\sigma V_T$. Thus, a high threshold voltage was required for such devices to operate with body bias mediated control. According to embodiments described herein, devices can be constructed with low $\sigma V_T$ and highly tunable values of $V_T$. Furthermore, the body bias and $V_T$ can be separately and independently set and/or tuned, giving designers a unique ability to mix and match diverse components on a single SoC.

Again, novel structures and methods are configured to reduce power consumption in a wide array of electronic devices and systems, and they can be produced together with a variety of different components, including both digital and analog devices, and also together with legacy devices in the same circuit. According to the embodiments described herein, devices, systems and methods are provided that allow for greatly improved (lower) $\sigma V_T$, and also provide improved and strong body bias coefficient. Thus, a wide range of adjustable $V_T$ is possible with a strong body bias, resulting in a better performing device and system that operates at lower power. To accomplish this, process friendly techniques are provided for building a wide range of transistors on the same die with precise and wide ranging $V_T$ control and improved $\sigma V_T$. Furthermore, provided are structures that can be constructed on a singular SoC with the ability to separately set the body bias coefficient and $V_T$. Decoupling these two settings provides designers with the ability to mix and match widely disparate transistor devices on a single SoC, FIG. 1 shows an exemplary SoC 100 configured with several diverse digital and analog transistor configurations on silicon 115 that can be incorporated into a device using the methods described herein. According to the methods and processes discussed herein, a system having a variety of combinations of novel and legacy transistor devices and structures can be produced on silicon using bulk CMOS. In different embodiments, the chip may be divided into one or more areas where dynamic bias structures 10, static bias structures 12 or no-bias structures 14 exist separately or in some combination. In a dynamic bias section 10, for example, dynamically adjustable devices 16 may exist along with high and low $V_T$ devices 18, 20 and possibly DDC logic devices 21. In a static bias section 12 for example, DDC logic device 102 may exist along with legacy logic devices 104, and also with high and low $V_T$ devices 22, 24. In a section where there is no bias 14, DDC analog devices 106, legacy analog devices 108 and legacy I/O analog systems 110 having I/O communication channels 112 may exist together.

In this exemplary system, a variety of different devices can exist on a single SoC 100, which may be separated into different sections depending on the type of bias desired for each section. Thus, an SoC 100 may include DDC digital logic devices 102, legacy digital logic devices 104, DDC analog devices 106, legacy analog devices 108, and legacy input and output (I/O) analog circuits and systems 110, high and low $V_T$ devices 18, 20, 22, 24, and possibly other devices, which may be interconnected to each other within the circuit via a common bus 114, wire traces (not shown), or other interconnections. The devices are formed or otherwise processed as bulk CMOS on a common substrate 115, typically silicon or other similar substrate.

The SoC 100 includes at least one or more devices 106 that have DDC cross-section profiles, an example of which is shown here as a variety of both analog and digital transistors 120, 130, 140, 150, all of which can be formed together on substrate 115. The first device 120 is a digital transistor having a gate stack 122 and spacers, source and drain 124/126, a shallow well 127 (or body of the transistor) underneath a deeply depleted channel 128 and screening layer 129 that extends between the shallow trench isolated (STI) structures 117. The significance of this profile is the low power characteristic possible by this and other devices by virtue of the deeply depleted channel and screening layer. Another digital device 130 has a gate stack 132 and spacers, source and drain 134/136 and a shallow well 137 underneath a deeply depleted channel 138. Unlike device 120, this digital device 130 has a screening layer 139 that, along with DDC 138, extends between the source and drain 134/136. Like device 120, the significance of this profile is the low power characteristic possible by this and other devices by virtue of the deeply depleted channel and screening layer.

The third and fourth devices from the left are analog devices that share some of the physical characteristics of the digital devices in their channel regions, providing power saving features for these and other similar analog devices. Digital device 140 is a digital transistor having a gate stack 142 and spacers, source and drain 144/146, a shallow well 147 underneath a deeply depleted channel 148 and screening layer 149 that extends between the STI Structures 117. Like the digital devices described above, the significance of this analog device profile is that the low power characteristic possible by this and other analog devices by virtue of the deeply depleted channel and screening layer. Another digital device 150 has a gate stack 152 and spacers, source and drain 154/156 and a shallow well 157 underneath a deeply depleted channel 158. Unlike device 140, this digital device 150 has a screening layer 159 that, along with DDC 158, extends between the source and drain 154/156. Like device 140, the significance of this profile is the low power characteristic possible by this and other devices by virtue of the deeply depleted channel and screening layer. These and other devices will be illustrated and described further below.

In some applications, there may be the desire to apply a bias voltage to the body 127 of the transistor, such as bias voltage source 160 shown in FIG. 1. According to one embodiment, the $V_T$ of a given device or multiple devices may be dynamically set by applying a bias voltage to the body. Thus, and again, body taps, schematically illustrated as a connection between bias voltage source 160 and a transistor, may be applied to individual devices, groups of devices, or entire circuits or sub-circuits on a given integrated circuit depending on the application.

According to these embodiments, improved $\sigma V_T$ allows for a stronger body bias coefficient that allows for improved changes in $V_T$. These devices may have either high or low $V_T$, and may be constructed with different parameters. Furthermore, these devices can be constructed on a singular SoC with the ability to separately set the body bias coefficient and $V_T$. Again, decoupling these two settings provides designers with the ability to mix and match widely disparate transistor devices on a single SoC. As a result, the $V_T$ settings of disparate devices, such as long and short channel devices for example, may be adjusted and matched to establish power agreement among the different devices. In practice, the adjustment of $V_T$ may be relatively small in comparison with the total $V_T$ of either device, for example 0.2V. Larger changes in $V_T$ may be made with other processes, such as the construction of metal gates, gate work functions, selective EPI deposition, ion implants, annealing, and other processes that provide more extensive changes in $V_T$.

Referring to FIG. 2, a brief process flow chart 200 for producing different types of DDC structures for analog and digital device is illustrated. The process illustrated here is intended to be general and broad in its description in order not to obscure the inventive concepts, and more detailed embodiments and examples are set forth below. These along with other process Steps allow for the processing and manufacture of integrated circuits that include DDC structured devices together with legacy devices, allowing for designs to cover a full range of analog and digital devices with improved performance and lower power.

Moreover, with the ability to adjust $V_T$, disparate transistors can be matched, allowing very different devices to be produced on the same silicon wafer. And, the novel structures can be formed together with legacy devices using well known processing techniques and design rules. This is made possible by separating the setting of the body bias coefficient from the setting of $V_T$.

In Step 202, the process begins at the well formation, which may be one of many different processes according to different embodiments and examples. As indicated in 203, the well formation may be before or after STI (shallow trench isolation) formation 204, depending on the application and results desired. Boron (B), indium (I) or other P-type materials may be used for P-type implants, and arsenic (As) or phosphorous (P) and other N-type materials may be used for N-type implants. For the PMOS well implants, the P+ implant may be implanted within a range from 10 to 80 keV, and at concentrations from $1 \times 10^{13}$ to $8 \times 10^{13}/cm^2$. As+ may be implanted within a range of 5 to 60 keV, and at concentrations from $1 \times 10^{13}$ to $8 \times 10^{13}/cm^2$. For NMOS well implants, the boron implant B+ implant may be within a range of 0.5 to 5 keV, and within a concentration range of $1 \times 10^{13}$ to $8 \times 10^{13}/cm^2$. A germanium implant Ge+, may be performed within a range of 10 to 60 keV, and at a concentration of $1 \times 10^{14}$ to $5 \times 10^{14}/cm^2$. A carbon implant, C+, may be performed at a range of 0.5 to 5 keV, and at a concentration of $1 \times 10^{13}$ to $8 \times 10^{13}/cm^2$.

Some devices on the wafer are DDC type devices and others are non-DDC type devices, a process may include the same process flow as that described herein, where some implants may be selectively masked over certain devices that do not need DDC process.

The well formation 202 may include a beam line implant of Ge/B (N), As (P), followed by an epitaxial (EPI) pre-clean process, and followed finally non-selective blanket EPI deposition, as shown in 202A. Alternatively, the well may be formed using a plasma implant of B (N), As (P), followed by an EPI pre-clean, then finally a non-selective (blanket) EPI deposition, 202B. The well formation may alternatively include a solid-source diffusion of B(N), As(P), followed by an EPI pre-clean, and followed finally by a non-selective (blanket) EPI deposition, 202C. As yet another alternative, well formation may simply include well implants, followed by in-situ doped selective EPI of B (N), P (P). As will be described further below, the well formation may be configured with different types of devices in mind, including novel DDC structures, legacy structures, high $V_T$ structures, low $V_T$ structures, improved $\sigma V_T$, standard or legacy ( )$_T$. Embodiments described herein allow for any one of a number of devices configured on a common substrate with different well structures and according to different parameters.

STI formation 204, which, again, may occur before or after well formation 202, may include a low temperature trench sacrificial oxide (TSOX) liner, discussed in more detail below together with FIGS. 6A-H, at a temperature lower than 900° C.

The gate stack 206 may be formed or otherwise constructed in a number of different ways, from different materials, and of different work functions. One option is a poly/SiON gate stack 206A. Another option is a gate-first process 206B that includes SiON/Metal/Poly and/or SiON/Poly, followed by High-K/Metal Gate. Another option, a gate-last process 206C includes a high-K/metal gate stack wherein the gate stack can either be formed with "Hi-K first-Metal gate last" flow or and "Hi-K last-Metal gate last" flow. Yet another option, 206D is a metal gate that includes a tunable range of work functions depending on the device construction, N(NMOS)/P(PMOS)/N(PMOS)/P(NMOS)/Mid-gap or anywhere in between. In one example, a gate electrode for a NMOS has a work function (WF) of 4.05 V±200 mV, and a gate electrode for a PMOS has a WF of 5.01 V±200 mV.

Next, in Step 208, Source/Drain tips may be implanted, or optionally may not be implanted depending on the application. The dimensions of the tips can be varied as required, and will depend in part on whether gate spacers (SPCR) are used. In one option, there may be no tip implant in 208A.

Next, in optional steps 210 and 212, PMOS or NMOS EPI layers may be formed in the source and drain regions as performance enhancers for strained channels. Those skilled in the art will understand that there is a wide body of documentation in the area of strained channels.

For gate-last gate stack options, in Step 214, a Gate-last module is formed. This may be only for gate-last processes 214A.

These and other features will be described in more detail and with examples below.

Figure 2A:
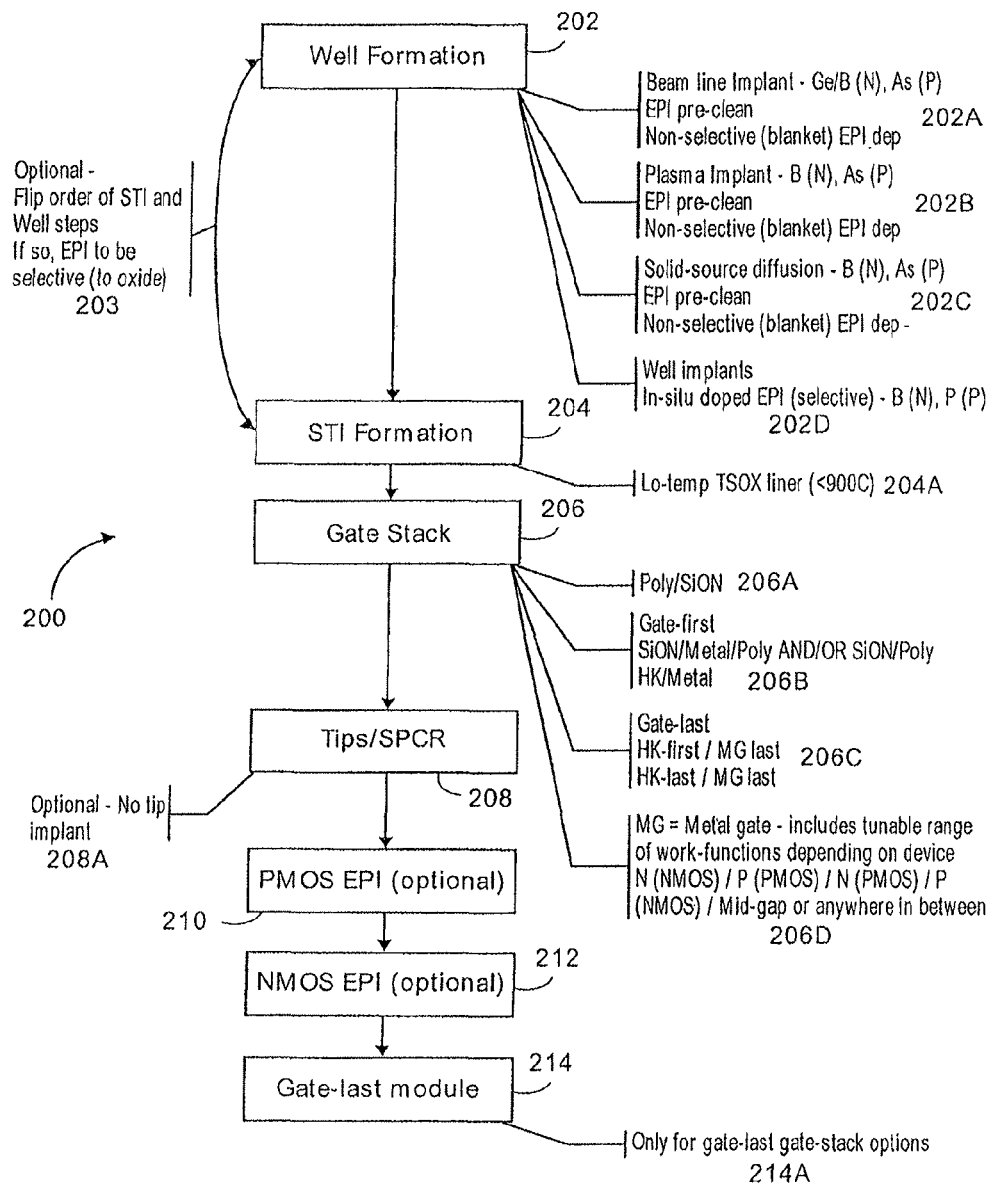
FIG. 2A is a general flow chart showing different process steps related to processing different analog and digital devices according to different embodiments.
Figure 2B:
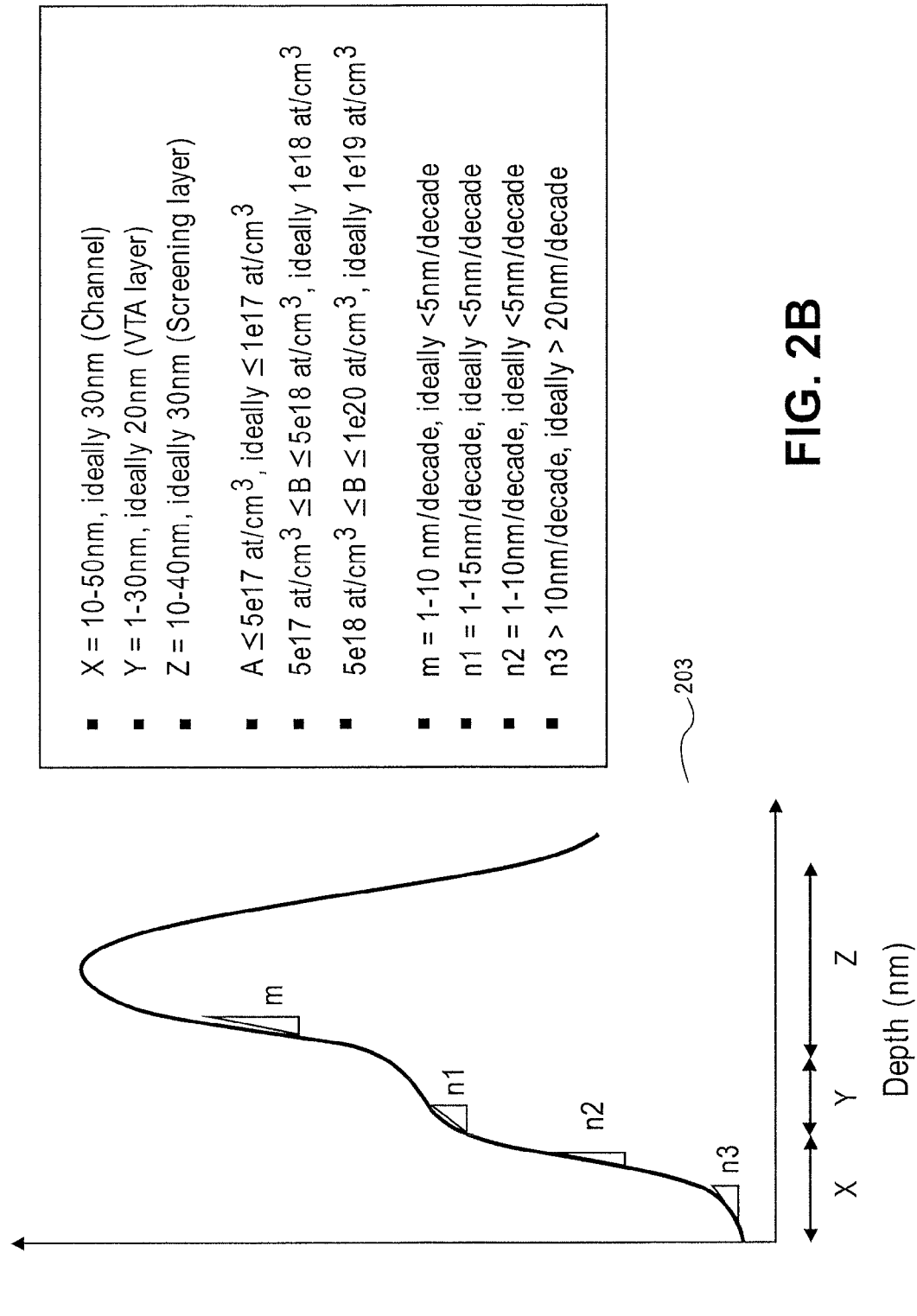
FIG. 2B is a diagram illustrating a dopant profile configurable according to various embodiments.

Referring to FIG. 2B, a graph 203 is shown illustrating different ranges of different channel layers in a transistor device. These ranges are measurements of depth and concentration that define the different layers of the device, including channel, threshold voltage setting layer and screening layer. These different layers are formed within the substrate using various processes, including those examples described herein. These ranges of depth and concentrations define the ranges of possibilities of examples in which body bias ($V_{BB}$) and threshold voltage ($V_T$).

X=10-50 nm, ideally 30 nm (Channel)
Y=1-30 nm, ideally 20 nm (VTA layer)
Z=10-40 nm, ideally 30 nm (Screening layer)
A≤5e17 at/cm$^3$, ideally ≤1e17 at/cm$^3$
5e17 at/cm$^3$≤B≤5e18 at/cm$^3$, ideally 1e18 at/cm$^3$
5e18 at/cm$^3$≤C≤1e20 at/cm$^3$, ideally 1e19 at/cm$^3$
m=1-10 nm/decade, ideally <5 nm/decade
n1=1-15 nm/decade, ideally <5 nm/decade
n2=1-10 nm/decade, ideally <5 nm/decade
n3>10 nm/decade, ideally >20 nm/decade

EXAMPLES

Assume B is 5e18
As B increases to 1e19, $V_T$ increases (by up to 0.5V)
As B decreases to 0, $V_T$ decreases (by up to −0.5V)
Assume X is 30 nm
As X increases to 50 nm, $V_T$ decreases (by up to −0.5V)
As X decreases 10 nm, $V_T$ increases (by up to 0.5V)
Assume C is 1e19
As C increase to 2e19, body coeff. increases by 40%
As C decreases to 5e18, body coeff. decreases by 40%
Assume Y is 15 nm
As Y increases to 30 nm, $V_T$ decreases (by up to −0.5V)
As Y decreases to 1 nm, $V_T$ increases (by up to 0.5V)

Figure 2C:
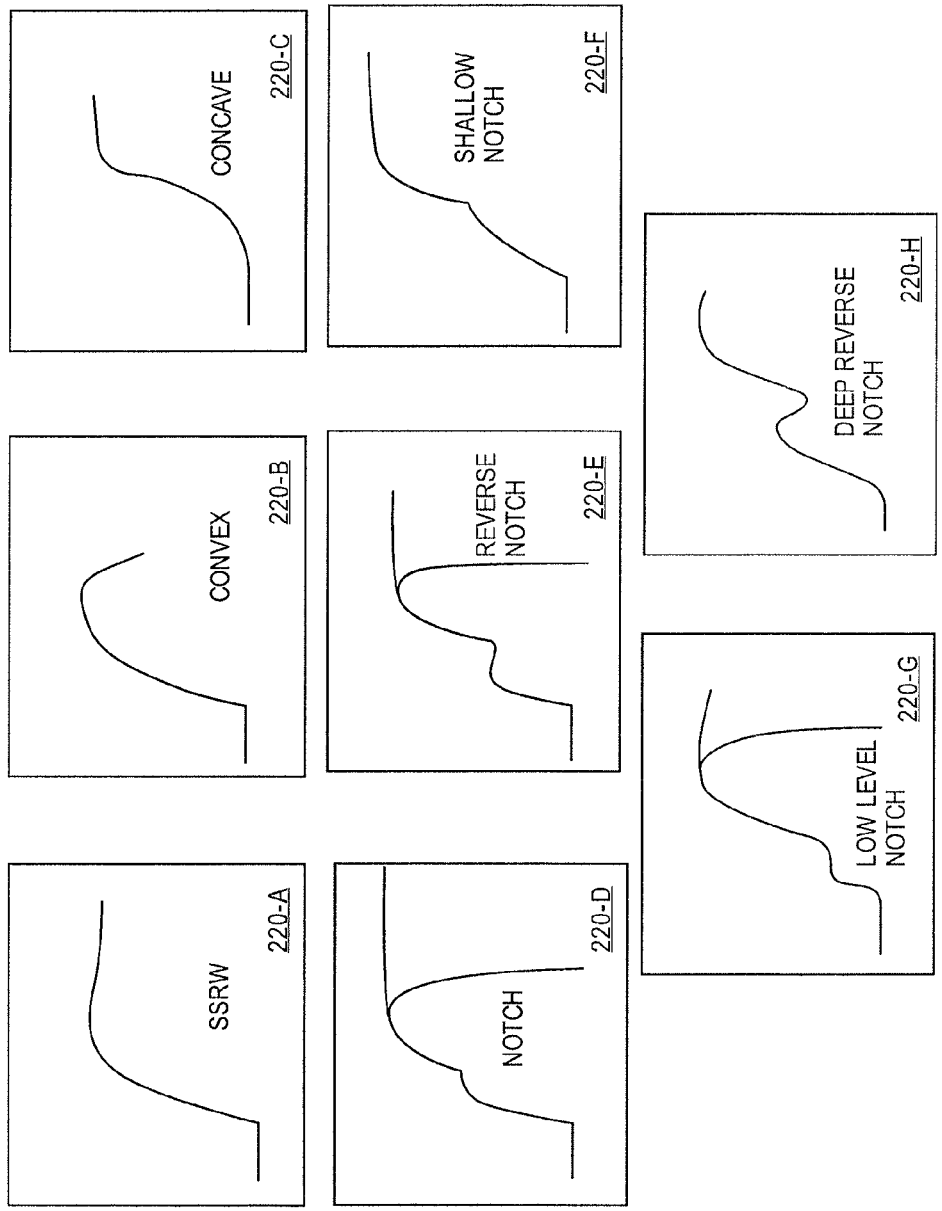
FIGS. 2C and 2D are diagrams illustrating various dopant profiles configured according to various embodiments.
Figure 2D:
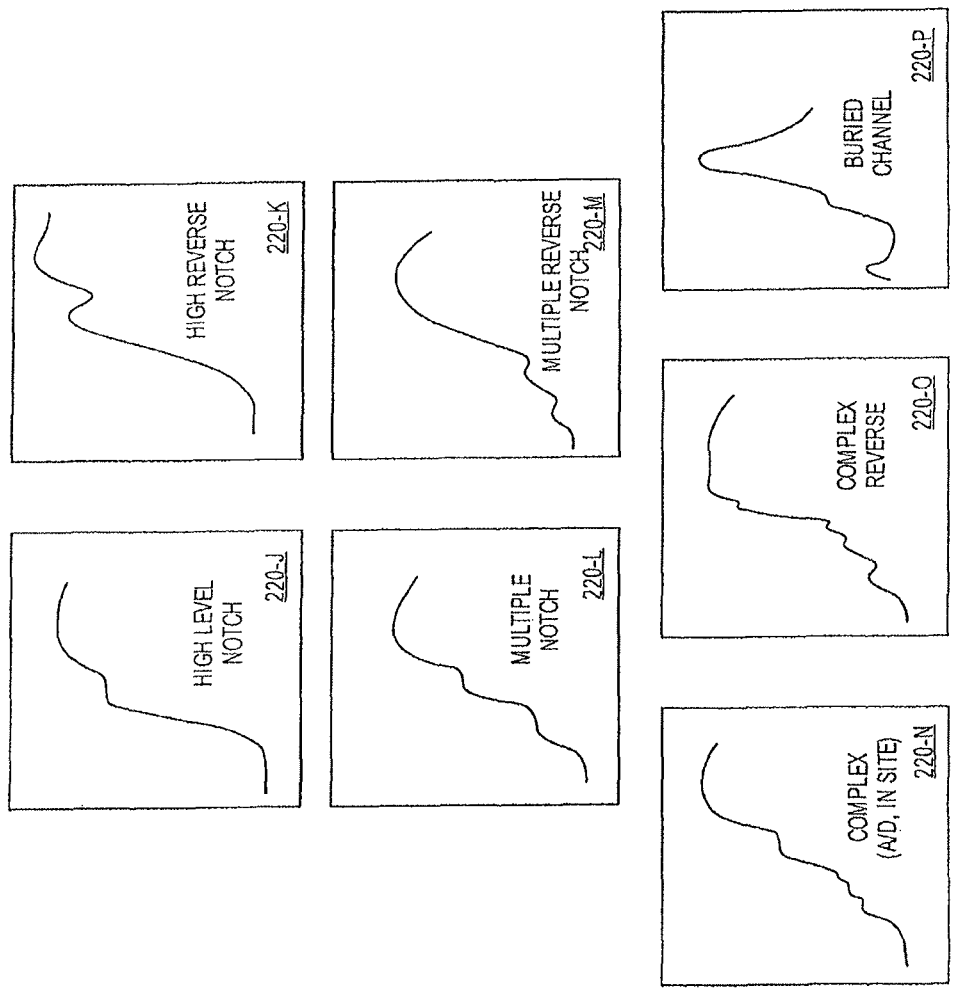

Referring to FIGS. 2C and 2D, various doping profiles are shown configured according to the ranges above. Profiles 220-A, 220-B and 220-C illustrate prior art profile curves, including SSRW or retrograde implant that can be performed without an EPI layer, Convex and Concave profiles respectively that can be formed without an EPI layer as well but with out-diffusion only. According to embodiments described herein, the notched curves illustrate profiles of the different layers that define the channel region, $V_T$ setting layer and screening layer that provide unique characteristics. These characteristics include the ability to separately control $V_T$ and $V_{BB}$ in individual transistors. Depending on where the notch is located, different characteristics of a transistor can be achieved. Different configurations are illustrated in FIGS. 2C and 2D, 220-D through 220-P. Example 220-D includes a notch with an intermediary inflection point that is 90° or greater, and can be produced with a single EPI layer when forming the wells and channels of a device. A reverse notch 220-E has an intermediary inflection that is less than 90°, indicating a relative drop in dopant concentration between the $V_T$ setting layer and the screening layer, and can be produced with a single EPI layer that is graded or with dual EPI layers when forming the wells and channels of a device. A shallow notch 220-F has a notch angle that is greater than 120°, indicating a relatively smoother concentration contrast from the $V_T$ setting layer and the screening layer, and can be produced with a single EPI layer that is graded when forming the wells and channels of a device. A low level notch 220-G is indicative of a lower concentration of dopants in the $V_T$ setting layer, and can be produced with a single EPI layer when forming the wells and channels of a device. A deep reverse notch 220-H indicates a deeper intermediary drop in concentration between the $V_T$ setting layer and the screening layer compared to the shallow reverse notch, and can be produced with a single EPI layer that is graded or with dual EPI layers when forming the wells and channels of a device. A high level notch in 220-J illustrates and example of relatively high dopant concentrations in the $V_T$ setting layer, and a leveling off before the screening layer, and can be produced with a single EPI layer when forming the wells and channels of a device. High reverse notch 220-K illustrates and example of a relatively high dopant level in the $V_T$ screening layer, followed by an intermediate drop in the dopant level before the screening layer, and can be produced with a single EPI layer that is graded or with dual EPI layers when forming the wells and channels of a device. Other variations are possible given the embodiments described above, including a multiple notch profile 220-L, and can be produced with dual or multiple EPI layers when forming the wells and channels of a device, and multiple reverse notches 220-M, and can be produced with a single or multiple EPI layers that are graded when forming the wells and channels of a device. Other variations are also possible, such as a complex profile 220-N, complex reverse profile 220-O, buried channel 220-P, and other variations of the channel profile that may be produced using single or multiple EPI layers, graded EPI layer or layers, and other processes described herein and known to those skilled in the art to adjust the dopant levels at different depths of the channel. Those skilled in the art will understand that other profiles are possible given this disclosure.

Figure 3:
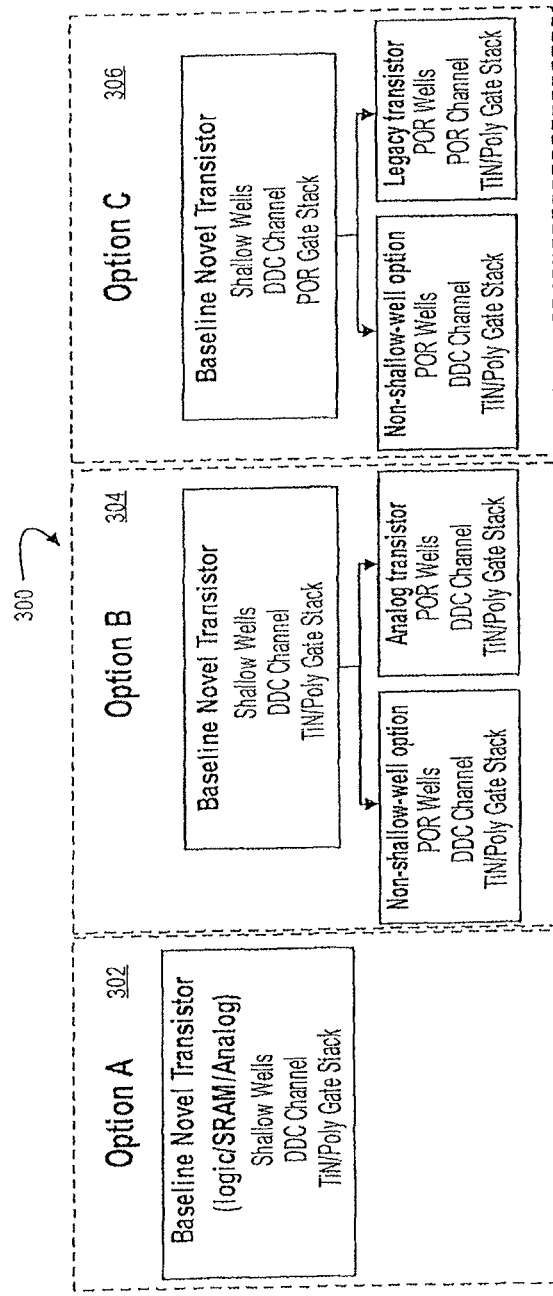
FIG. 3 is an example of a transistor process structure illustrating process steps according to different embodiments.

Referring to FIG. 3, examples 300 of various options for structures are illustrated, and their process flows are illustrated in FIGS. 4A-4L. Option A 302 illustrates a baseline novel transistor structure that can be used for logic circuits, SRAM devices, or analog devices for example, which includes transistors having a shallow well, a DDC channel, and a TiN/Poly gate stack. In one example, Option A includes a transistor having a Metal/Poly or Nitride of Metal/Poly hybrid gate stack. The metal and nitride of metal could include TaN, TiN, TiAlN, Mo or Ni, or other metals or other nitrides of metals, where the resulting work function can be tuned from midgap to that of P+ or N+ poly work function. Furthermore, ALD (Atomic Layer Deposition) may be used as a deposition technique for example. Methods of deposition may optionally include PVD (Physical Vapor Deposition or CVD (Chemical Vapor Deposition). Option B, 304, includes baseline novel transistor structure, shallow wells, a DDC channel, and a TiN/Poly gate stack, and further includes a non-shallow well option having POR wells, a DDC channel and a TiN/Poly gate stack together with an analog transistor having POR wells, a DDC channel and a TiN/Poly gate stack. Option C 306 includes shallow wells, a DDC channel and a POR gate stack, with optional non-shallow wells having POR wells, DDC channel and TiN/Ploy gate stack.

The different options provide different device characteristics, and provide the ability to adapt an N-type work function in a gate that can be used on a PMOS analog device. Referring to Table 2, various devices are charted to show compatibility with NMOS and PMOS structures and Table 3 shows the applicability of the three options for shallow wells, non-shallow wells, legacy devices and how many masks are added for each options' flow. The mask count varies with each transistor combination, and, as shown in Table 3, the additional masks required may be as few as one or as many as three depending on which option is desired.

FIGS. 4A-L illustrate a baseline for a novel transistor structure that can be used for logic circuits, SRAM devices, or analog devices for example, which includes transistors having a shallow well, a DDC channel, and a TiN/Poly gate stack. The process starts with a silicon wafer, which is typically used to form multiple integrated circuits thereon. FIGS. 4A-L will show one example of the processing of several different circuit components by way of a progressive series of cross-sections of a silicon wafer. FIGS. 5A-5J and 6A-6M will illustrate alternative embodiments. There is cross-over and removal of different structures as the process progresses, where some of the structures are substituted or otherwise eliminated. Accordingly, labels in the progressive figures will necessarily be eliminated, thus not all numbering labels will not be shown in all figures through to the end. This example will illustrate processes for processing component devices including a PMOS DDC logic transistor, an NMOS DDC logic transistor, a PMOS DDC analog transistor, an NMOS DDC analog transistor, a PMOS legacy logic transistor, an NMOS legacy logic transistor, a PMOS legacy analog transistor, an NMOS legacy logic transistor, high $V_T$ devices, low $V_T$ devices, and other devices on a single SoC. Those skilled in the art will understand that different combinations and permutations of these and other devices are possible given the examples described herein, and also that the following example is merely for illustrative purposes.

Figure 4A:
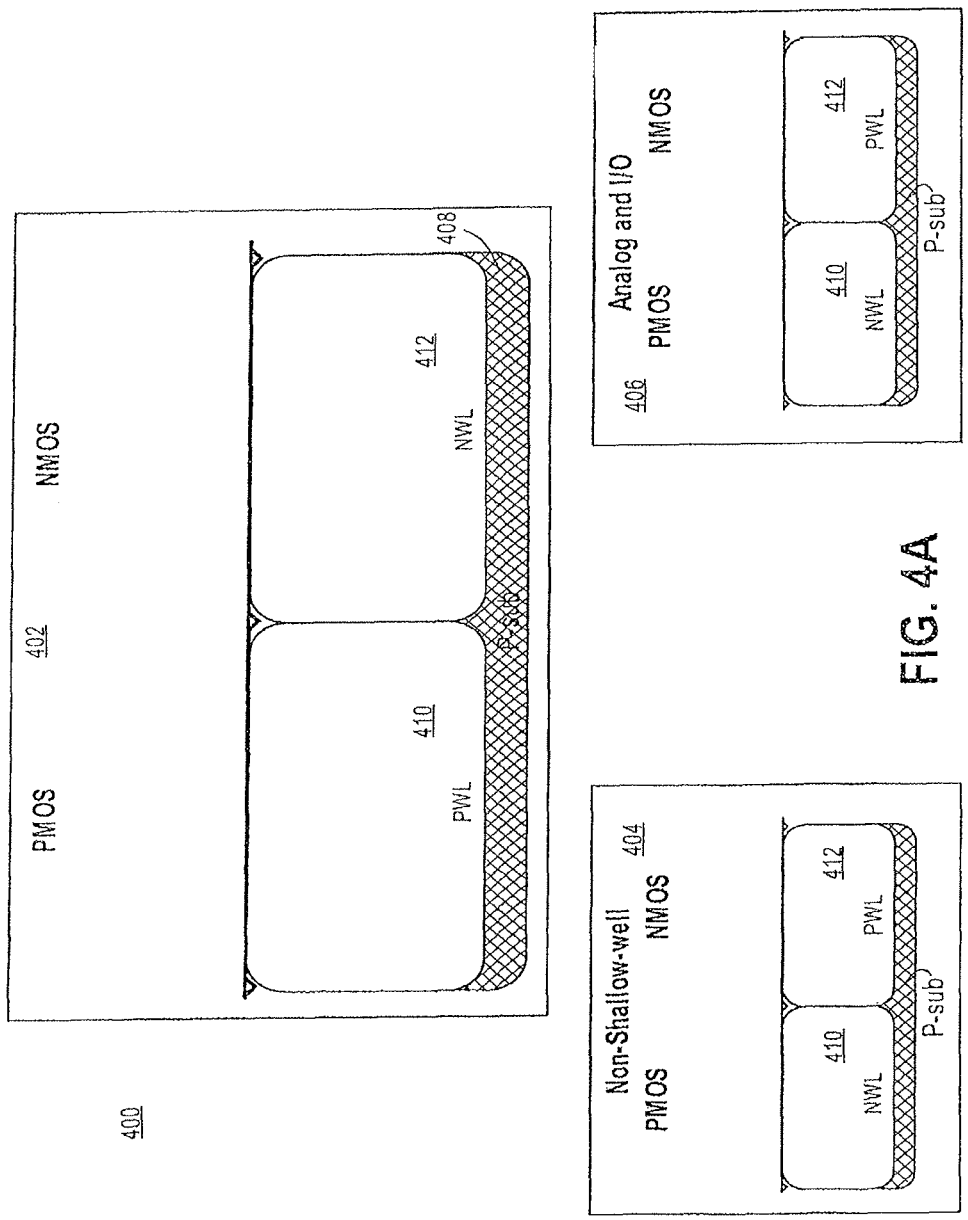

In FIG. 4A, the device 400 includes a P-type substrate 402. The STI is first aligned, followed by P-type well (PWL) patterning and implant to form PWL 410 and N-type well (NWL) patterning to form NWL 412. In alternative embodiments, non-shallow well 404 and analog and input/output circuits (I/O) 406 can be formed using the same base structure as shown. In one example, N-well=As (50-150 keV, 1e13-1e14), and P-well=B (10-80 keV, 1e13-1e14). According to one embodiment, well patterning is done before STI patterning, which is opposite of conventional known flows. Also, some devices may get shallow wells that provide added transistor and circuit functionality. In the case of shallow-well devices, the N-well is formed in the NMOS transistor, and P-well is formed in the PMOS transistor. In the case of non-shallow-well devices, the N-well is formed in PMOS transistor and vice-versa.

Figure 4B:
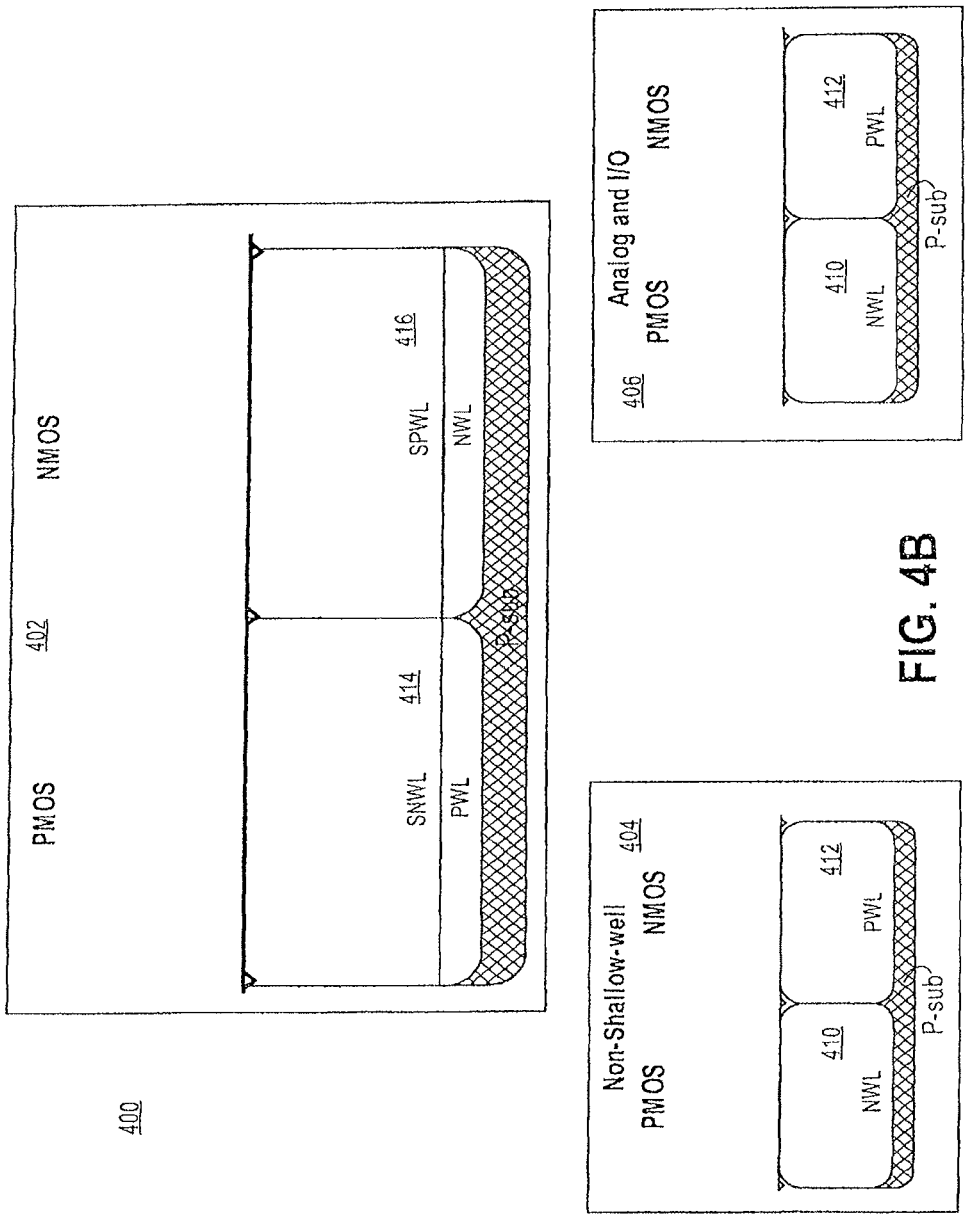

Referring to FIG. 4B, shallow wells 414 (shallow N-type well) and 416 (shallow P-type well) are implanted with separate patterning to mask each when the other is being implanted. For non-shallow well devices 404 and also analog and I/O devices 406, no shallow wells are implanted for this example. In one example, the SN-well is implanted with As (15-80 keV, 1e13-1e14), and the SP-well is implanted with B (5-30 keV, 1e13-1e14). In this example, shallow-wells are optional and can be formed or blocked using litho masking to make both types of transistors on same wafer.

Figure 4C:
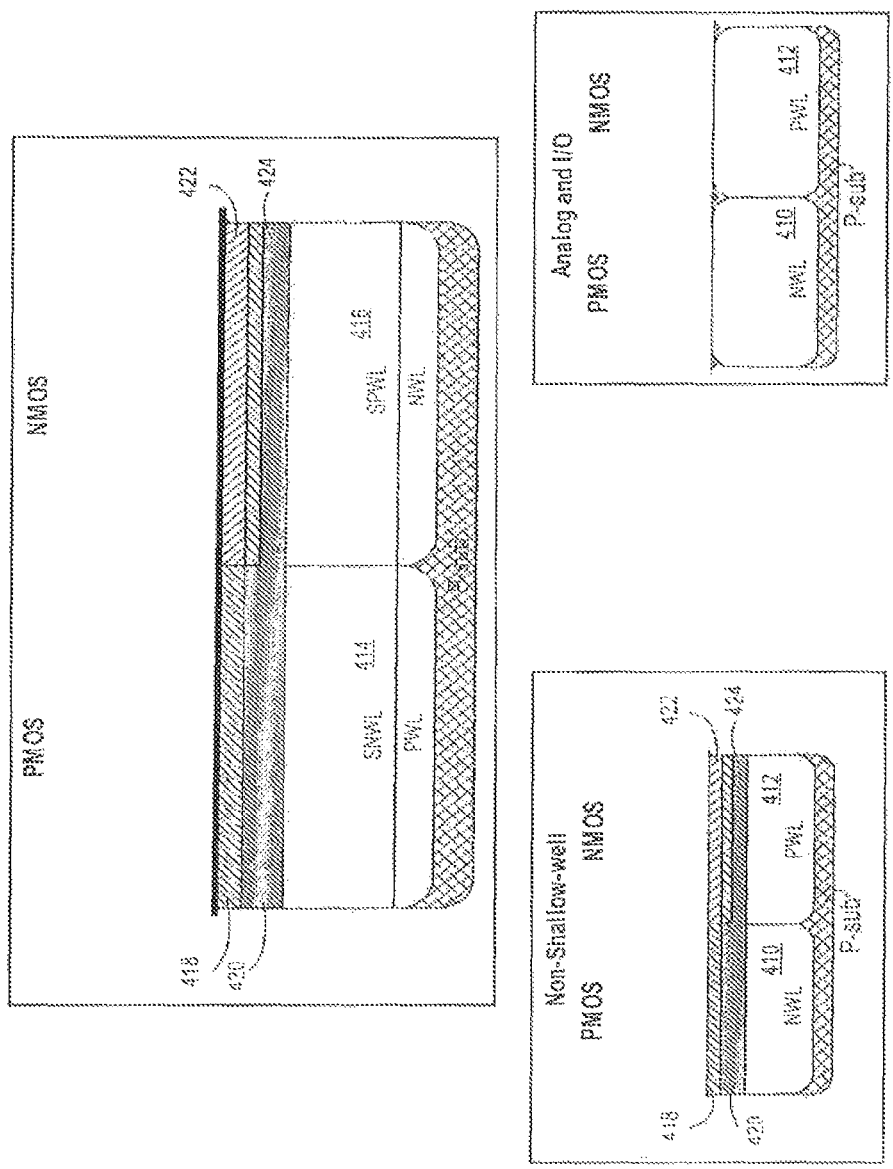

In FIG. 4C, N-type screening is performed to implant As 420 over the shallow N-well, and P-type screening is performed to implant Ge, B or C 424 over the shallow P-well. Also, Logic VTP ($V_T$ setting layer for the P-type device) patterning 418 implant is performed for setting the $V_T$ setting layer over the shallow N-well. Similarly, Logic VTN ($V_T$ setting layer for the N-type device) patterning 422 implant is performed for setting the $V_T$ setting layer over the shallow P-well. The same layers are formed in the same manner for the non-shallow well device, but not for the analog and I/O Devices in this example. In this example, P-type-screening may be a combination of any one or all of Ge, B and C implants, for example (Ge 30-70 keV 5e14-1e15), B (0.5-2.5 keV, 1e13-5e14), C (2-8 keV, 5e13-5e14)). The N-type screening layer may be implanted with a combination of any one or all of As or P, for example (As (3 k-8 k 2e13-2e14), P (2 k-5 k 2e13-2e14)). The VTN may be a combination of B and or $BF_2$ (example dose, energy=B (0.1 k-5 k 1e12-5e14), $BF_2$ (0.5 k-20 keV 1e12-5e14)). The VTP may be a combination of As and/or P (example dose, energy=As (1 k-20 k 1e12-5e14, Phos (0.5 k-12 keV 1e12-5e14)).

Figure 4D:
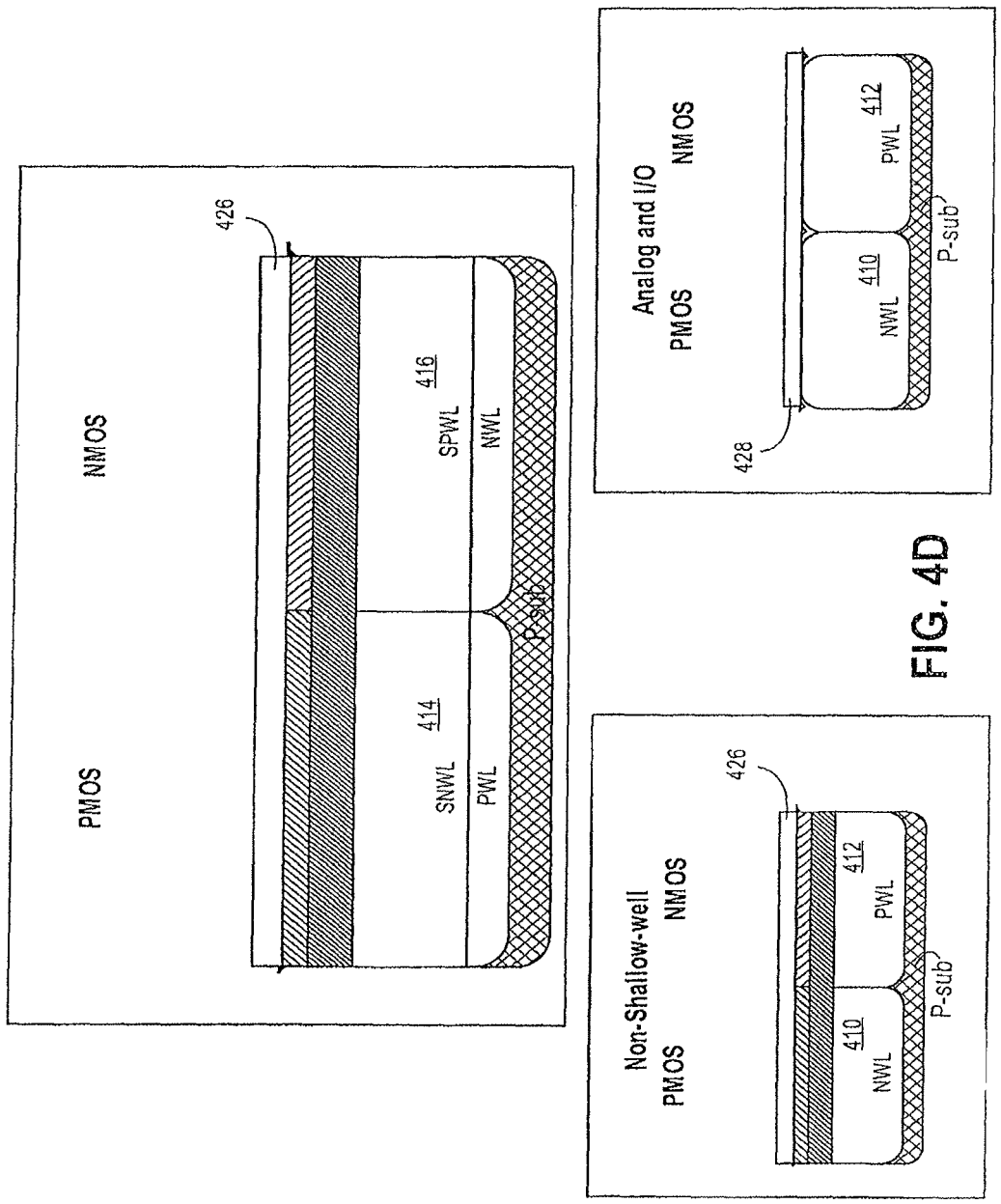

Referring to FIG. 4D, two steps are performed for each type of device, first a DDC Channel EPI pre-clean, followed by a DDC channel EPI deposition to give EPI layer 426. In one example, an intrinsic layer of Si (10-80 nm) may be deposited epitaxially on the entire wafer including DDC and non-DDC wells. Before deposition, a combination of surface treatments may be performed to ensure pristine interface between EPI and the substrate to provide an optimum surface treatment in order to maintain low defect densities in the EPI layer. The screen layers may only need to be formed in wells where DDC transistors are desired. Other regions may be masked off using lithography. Also, the VTA layer dose/energies may be determined by $V_T$ desired in the device, for example, to make either high-$V_T$ or low-$V_T$ devices, one would need more or less dose respectively.

Figure 4E:
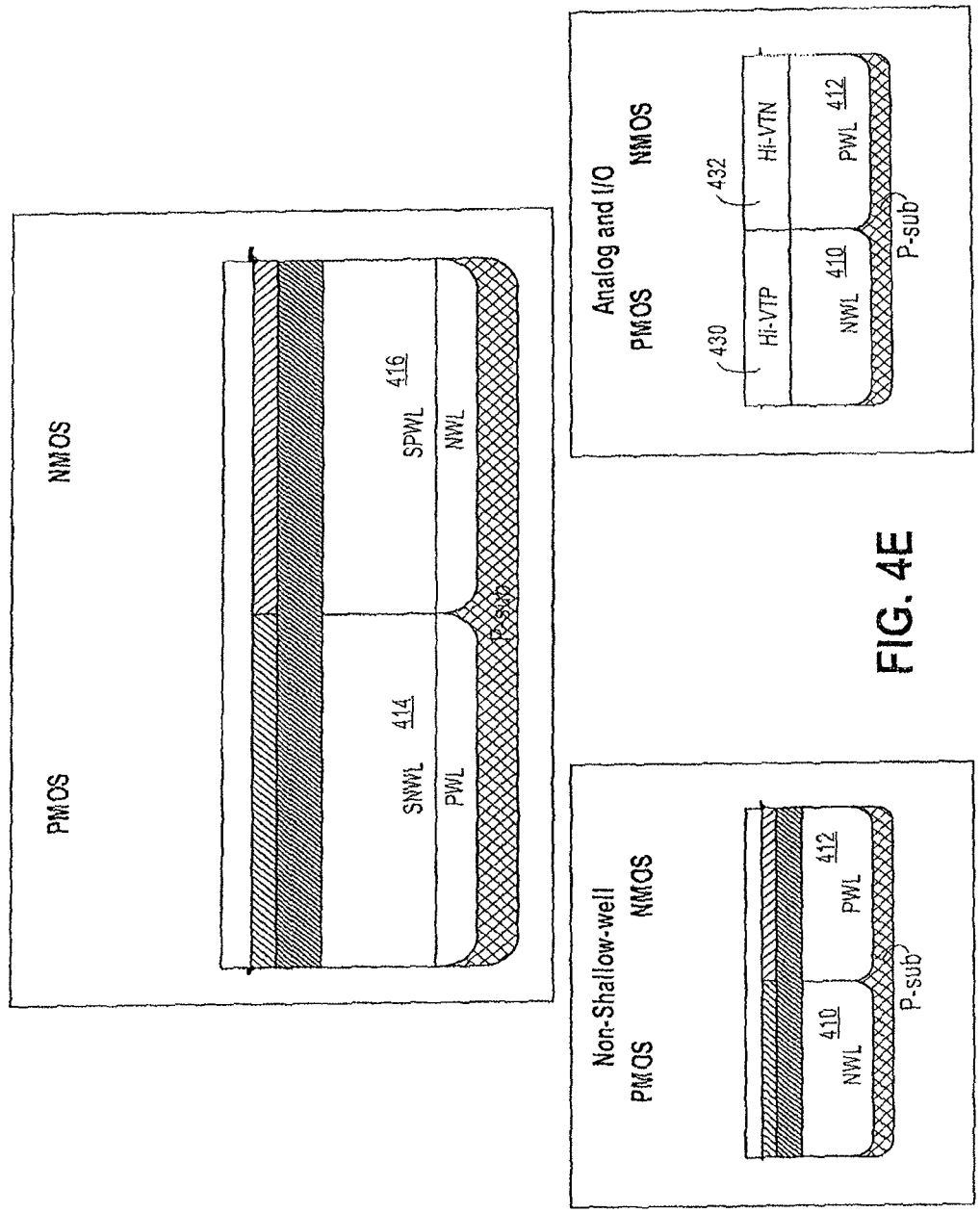

Referring to FIG. 4E, high $V_T$ patterning and implants 430, 432 are formed for the analog device's P-well and N-well respectively. In this example, an intrinsic layer of Si (10-80 nm) is deposited epitaxially on the entire wafer including DDC and non-DDC wells. In one example, before deposition, a combination of surface treatments may be performed to ensure a pristine interface between EPI and the substrate. It may be important to ensure the proper surface treatment in order to maintain low defect densities in the EPI layer.

Figure 4F:
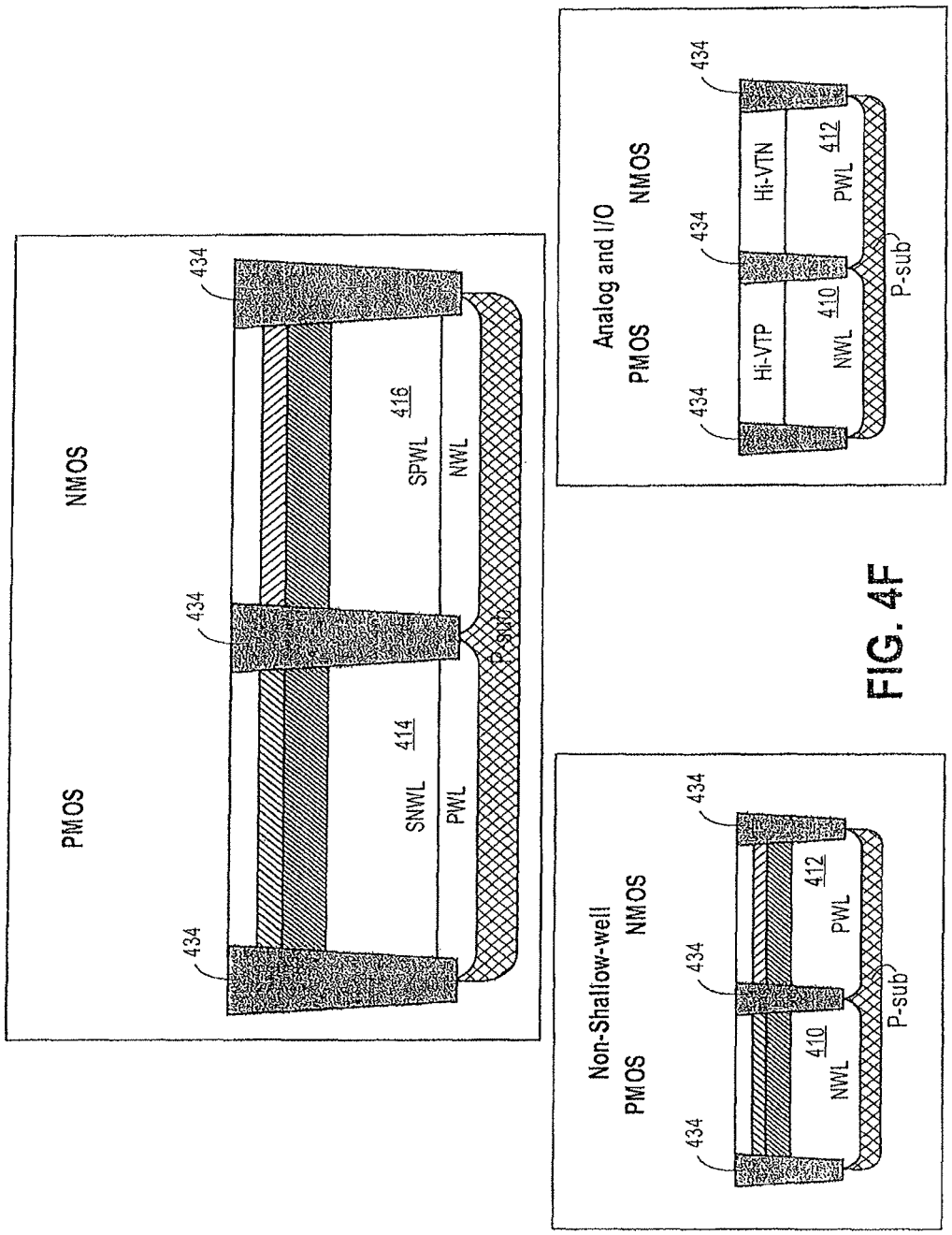

Referring to FIG. 4F, STI patterning and etch followed by STI Fill/polish and sacrificial oxidation are performed on all devices to form STIs 434. Conventional shallow trench isolation process may be used to define active regions in the silicon. In practice, temperature cycle during STI formation may need to be restricted <900° C. in order to be compatible with the well-stack.

Figure 4G:
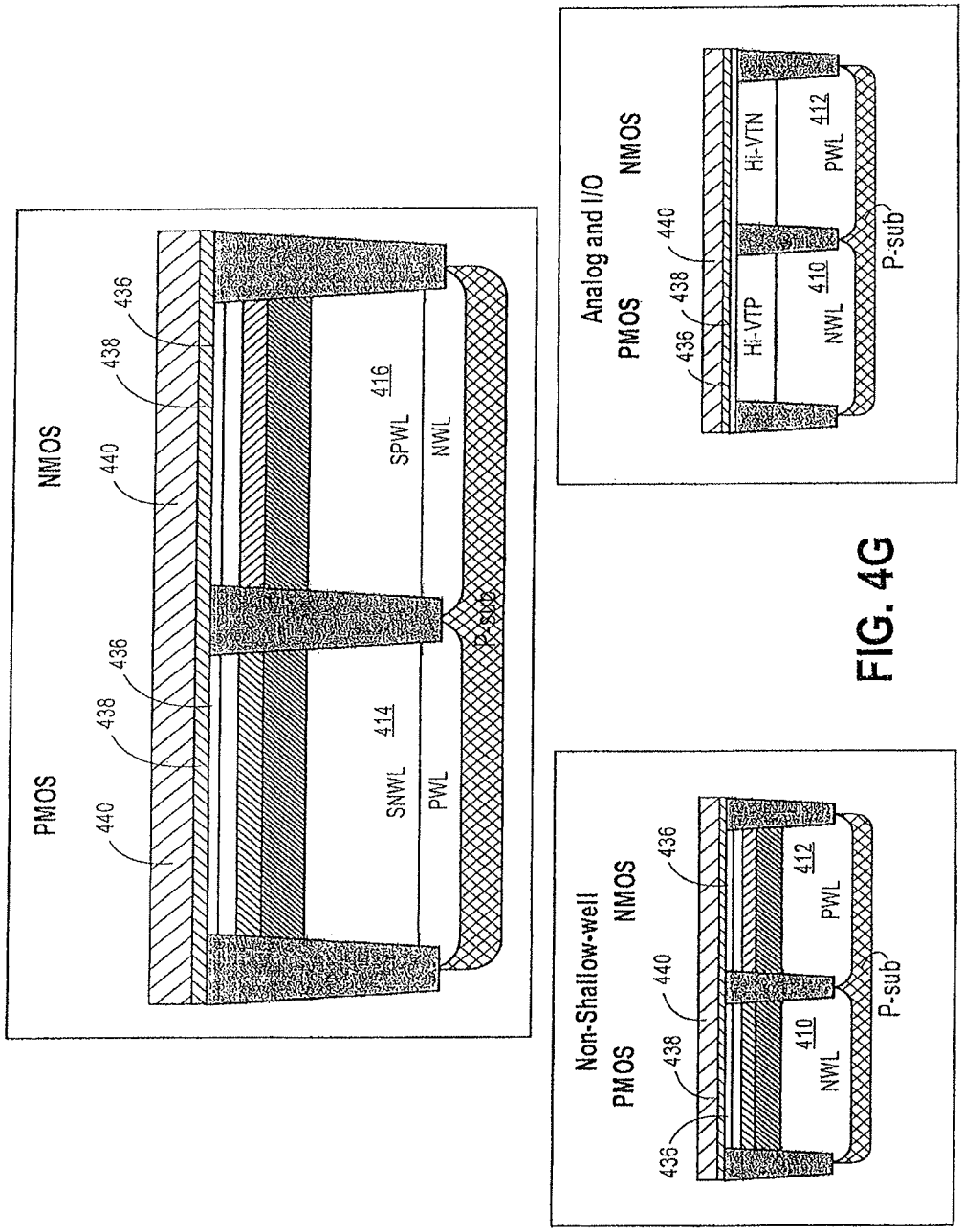

In FIG. 4G, gate dielectric such as $SiO_2$, high-K or SiON for example formation is performed to form gate dielectric layer 436 for each device. A thick gate dielectric layer 436), which may be a high K or $SiO_2$ is formed over the analog and I/O device. Next, ALD TiN deposition (2-4 nm in this example) 438 followed by a poly-silicon deposition (5-10 nm for this example) 440 is performed on each of the shallow well, non-shallow well and analog I/O devices to give layers 438 and 440. Here, a thin layer of SiON may be grown over exposed Si regions using conventional techniques to serve as gate dielectric. SiON may be replaced by high-K dielectric in some cases. The dielectric may be capped with thin layer (2-5 nm) of ALD mid-gap metal or nitride of metal such as TiN. The Metal layer may be capped with thin layer of poly-Si (5 nm). In some embodiments, a simple $SiO_2$/poly-Si dummy gate stack may be used, which may be replaced later by high-K metal gate in a replacement gate flow.

Figure 4H:
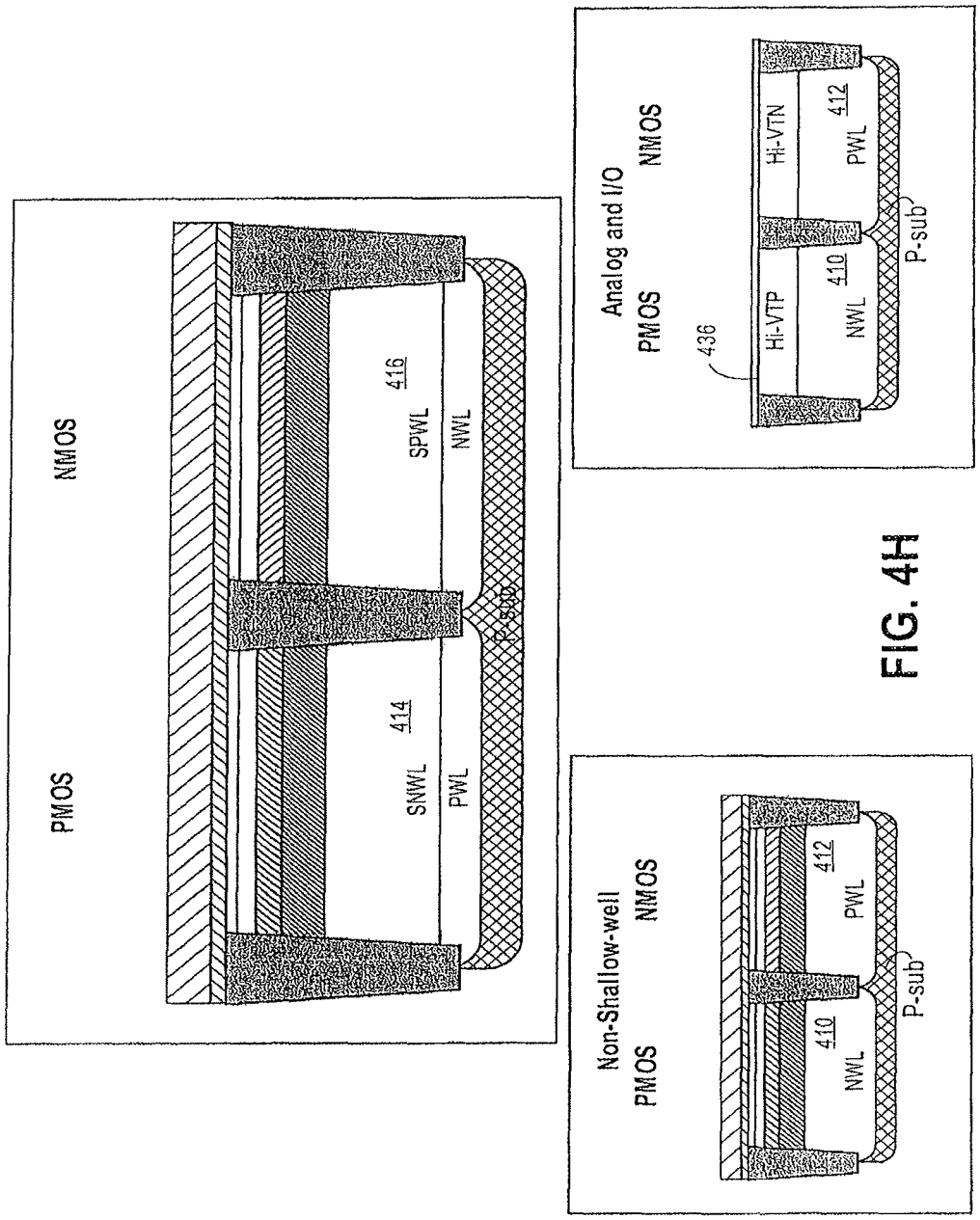
Figure 41:
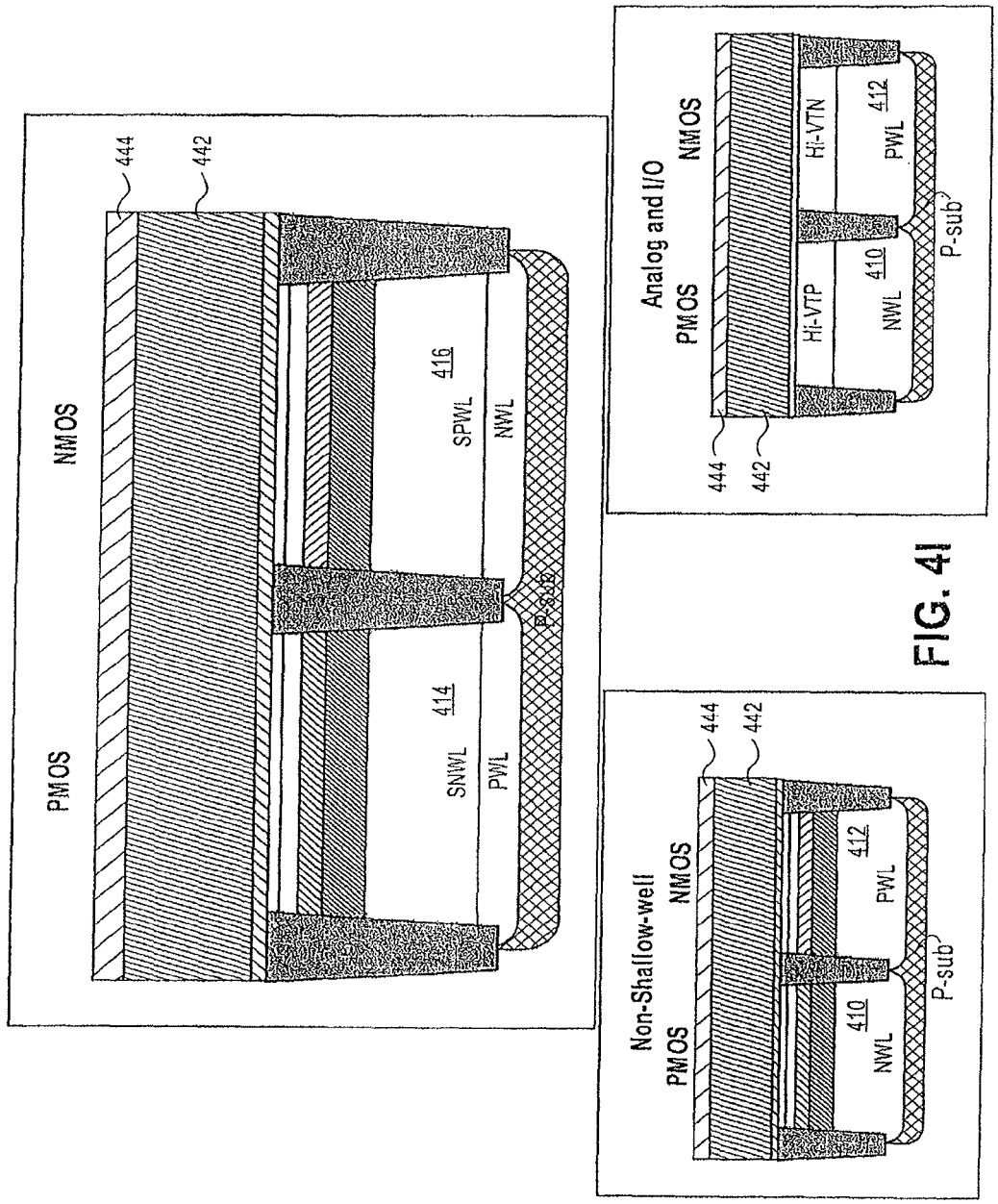

In FIG. 4H, the TiN layer 438 is stripped off of the analog and I/O device. Here, devices such as analog and I/O devices in which metal gate is not desired are then exposed using lithography. Poly-Si and TiN are stripped off from those regions. With multiple devices on a circuit, resist is then removed from the wafer to leave behind some devices with metal and some without.

In FIG. 4I, a Poly-Si layer deposition is performed 442, where poly-Si is then deposited over the entire wafer, to a thickness of 80-100 nm in one example. This may be followed by planarization to remove any topography caused by the earlier 5 nm poly-Si dep. This is then followed with HM deposition to assist in poly-Si patterning using conventional lithography, giving layer 444.

Figure 4J:
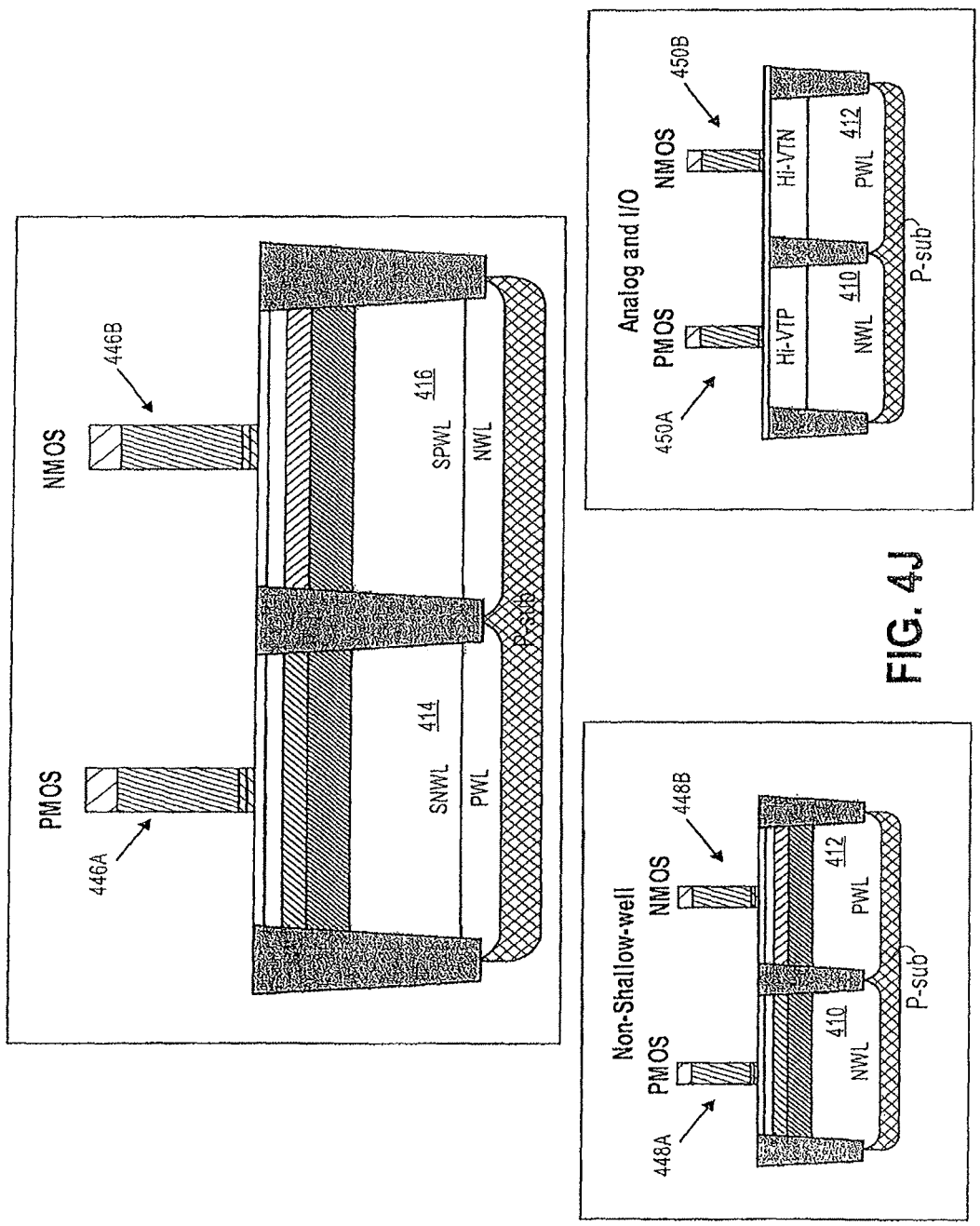

Referring to FIG. 4J, Poly-Si is patterned to form gates 446A, 446B (448A, 448B for non-shallow well devices) over the wafer. In some devices, there may be a poly-Si gate. In other devices, there will be TiN/Poly-Si stacked gate. In other devices there will be shallow-wells with or without DDC well-stacks, such as analog and I/O devices, gates 450A, 450B.

Figure 4K:
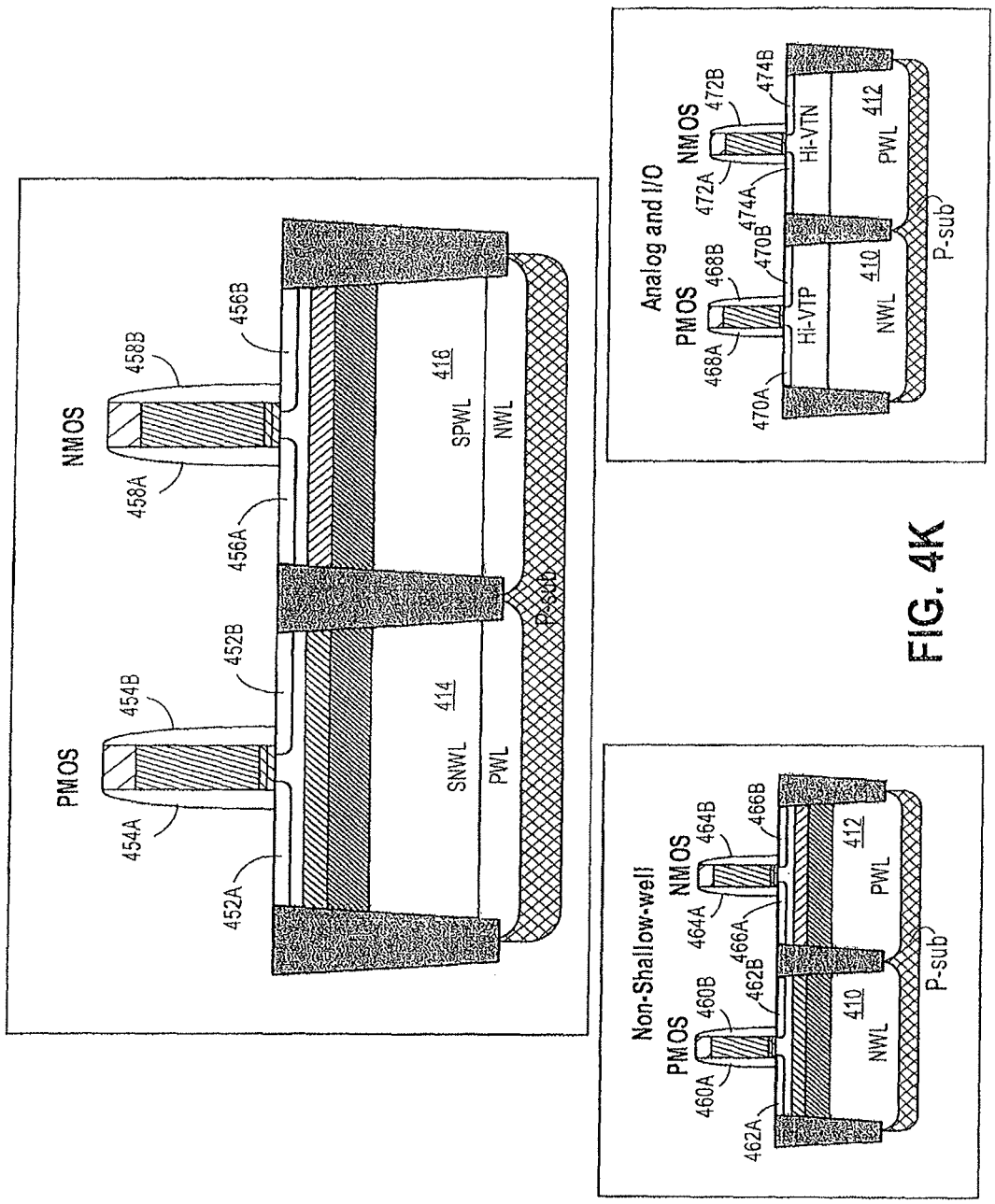

Referring to FIG. 4K, source and drain region and spacers are added to each device (S/D 452A, 452B, 456A, 456B and spacers 454A, 454B, 458A, 458B for shallow well devices; S/D 462A, 462B, 466A, 466B and spacers 460A, 460B, 464A, 464B for non-shallow well devices; and S/D 470A, 470B, 474A and 474B and spacers 468A, 468B, 472A, 472B for analog and I/O devices.). In one example, conventional processing may be used to implant N and P extension junctions and form spacers over the poly-Si.

Figure 4L:
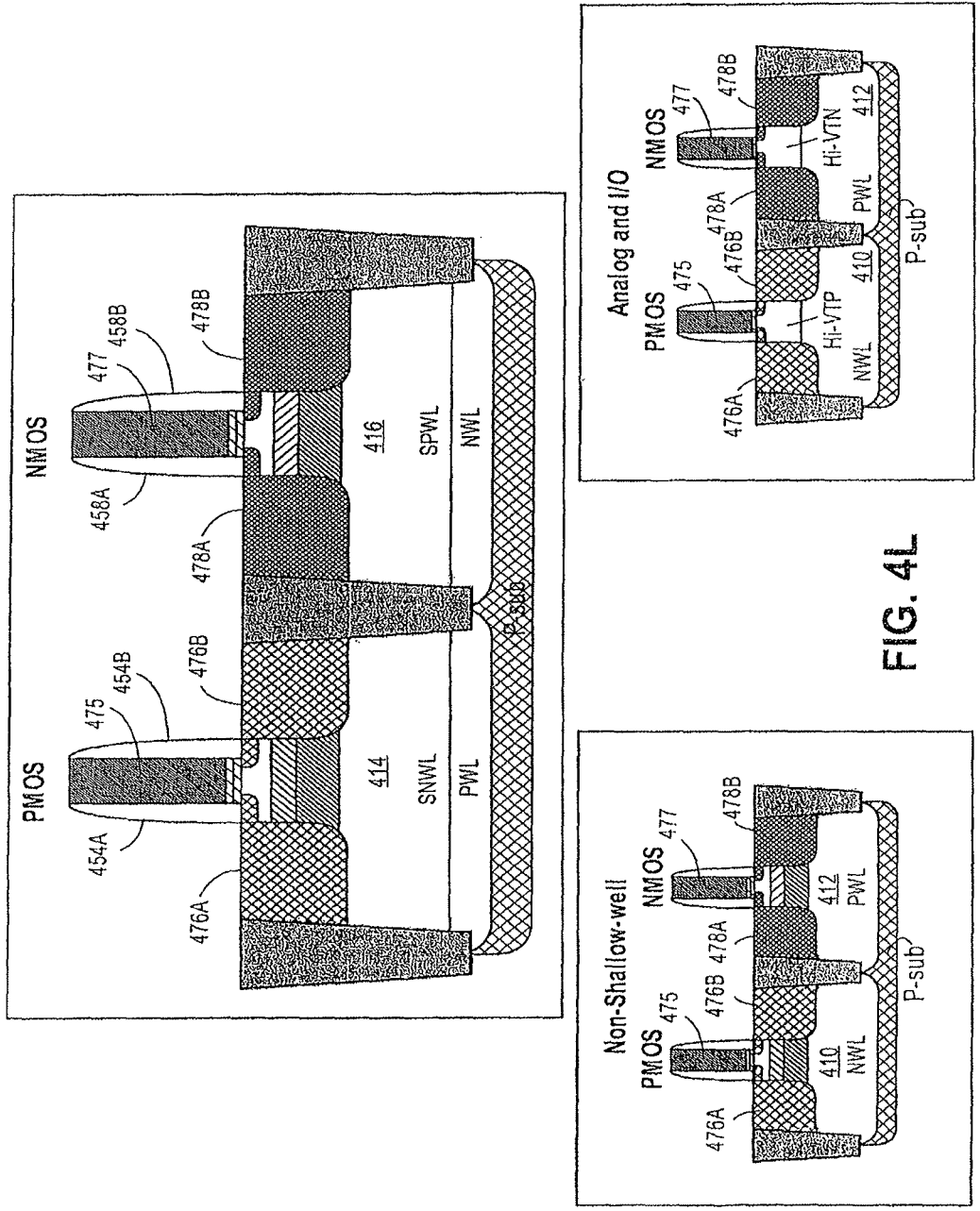

Referring to FIG. 4L, once spacers are formed, deep S/D junctions 476A, 476B, 478A, 478B are formed in each NMOS and PMOS devices using conventional techniques in each device. In some cases, it is possible to integrate SiGe in the S/D regions of the PMOS device, while Si or SiC EPI can be integrated into the NMOS device. Subsequent steps may be similar to well established CMOS processing. Gate material 475 and 477 results between the spacers. According to one embodiment, by using this process flow, it is possible to form NMOS and PMOS devices with or without shallow-wells and with poly gate or metal gate stacks on a single wafer.

Figure 5A:
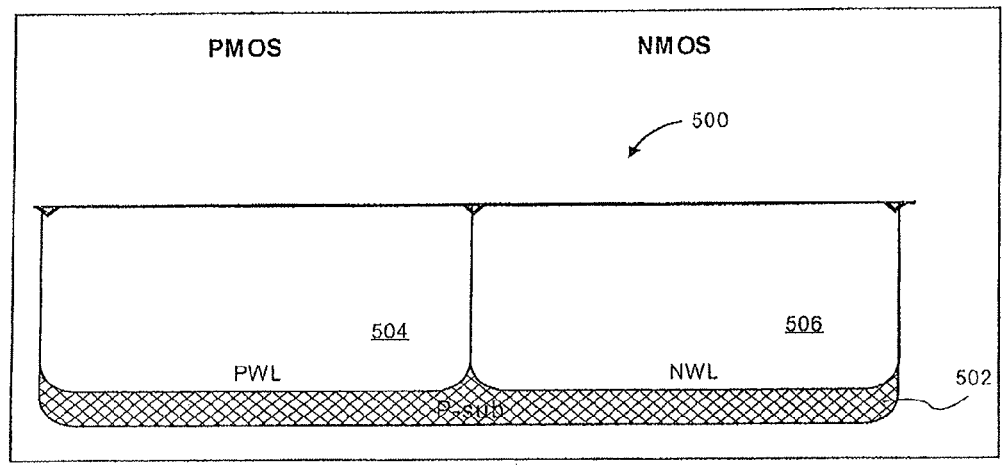
FIGS. 5A-5J are flow diagrams showing another embodiment of an integrated circuit process flow.

FIGS. 5A through 5J illustrate an alternative embodiment with a Gate-Last configuration. In FIG. 5A, the device 500 includes a P-type substrate 502. P type well 504 (PWL) and N-type well 506 (NWL) are implanted with separate patterning to masks for each when the other is being implanted. Similar to above, in one example, N-well is implanted with As (50-150 keV, 1e13-1e14), and P-well is implanted with B (10-80 keV, 1e13-1e14). Similar to the discussion above, well patterning may done before STI patterning, which is opposite of conventional known flows.

Figure 5B:
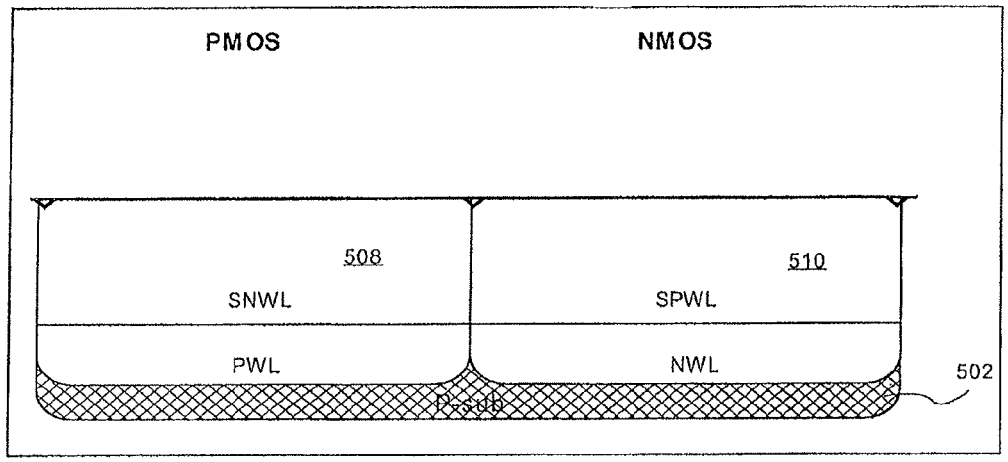

Referring to FIG. 5B, shallow wells 508 (shallow N-type well) and 510 (shallow P-type well) are implanted with separate patterning to masks for each when the other is being implanted. Similar to above, in one example, the SN-well is implanted with As (15-80 keV, 1e13-1e14), and the SP-well is implanted with B (5-30 keV, 1e13-1e14). In this example, shallow-wells are optional and can be formed or blocked using litho masking to make both types of transistors on same wafer. In the case of shallow-well devices, the N-well is formed in the NMOS transistor, and P-well is formed in the PMOS transistor. In the case of non-shallow-well devices, the N-well is formed in PMOS transistor and vice-versa.

Figure 5C:
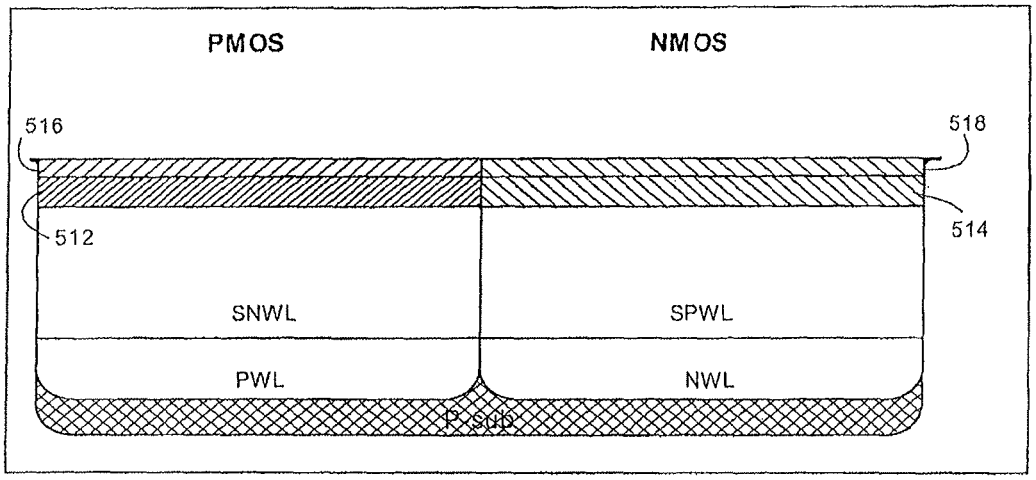

In FIG. 5C, N-type screening is performed to implant As 512 over the shallow N-well, and P-type screening is performed to implant combinations of Ge/B/C 514 over the shallow P-well. Also, Logic VTP ($V_T$ setting layer for the PMOS device) patterning 516 L/S/H implant is performed for setting the $V_T$ setting layer over the P-well. Similarly, Logic VTN ($V_T$ setting layer for the NMOS device) patterning 518 L/H/S implant is performed for setting the $V_T$ setting layer over the N-well. In this example, the P-screen may be the combination of any one or all of Ge, B and C implants. For the N-screen, the process may be a combination of either or both of As or P. The screening layers only need to be formed in wells where DDC transistors are desired. Other regions may optionally be masked off using lithography. Also, the VTA layer dose/energies may be determined by $V_T$ desired in the device, for example, to make either high-$V_T$ or low-$V_T$ devices, one would need more or less dose respectively.

Figure 5D:
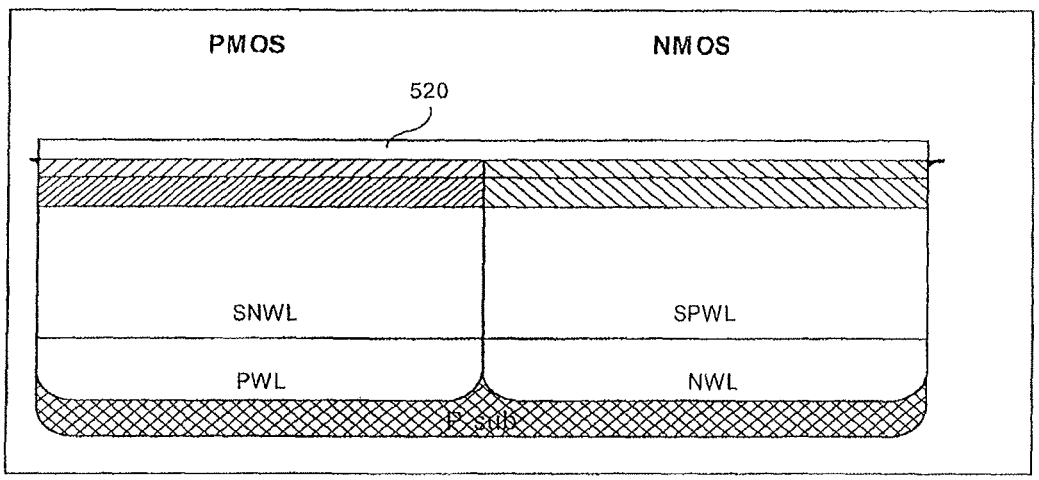

Referring to FIG. 5D, two steps are performed for EPI deposition, first a DDC Channel EPI pre-clean, followed by a DDC channel EPI deposition to give EPI layer 520.

Figure 5E:
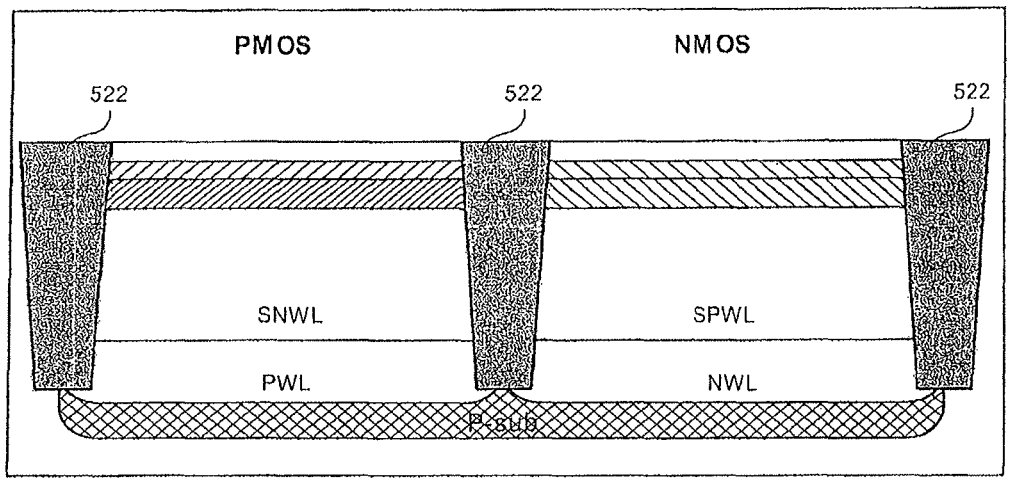

Referring to FIG. 5E, STI patterning and etch followed by STI Fill/polish and sacrificial oxidation are performed on all devices to form STIs 522. Conventional shallow trench isolation process may be used to define active regions in the silicon. In practice, temperature cycle during STI formation may need to be restricted <900° C. in order to be compatible with the well-stack.

Figure 5F:
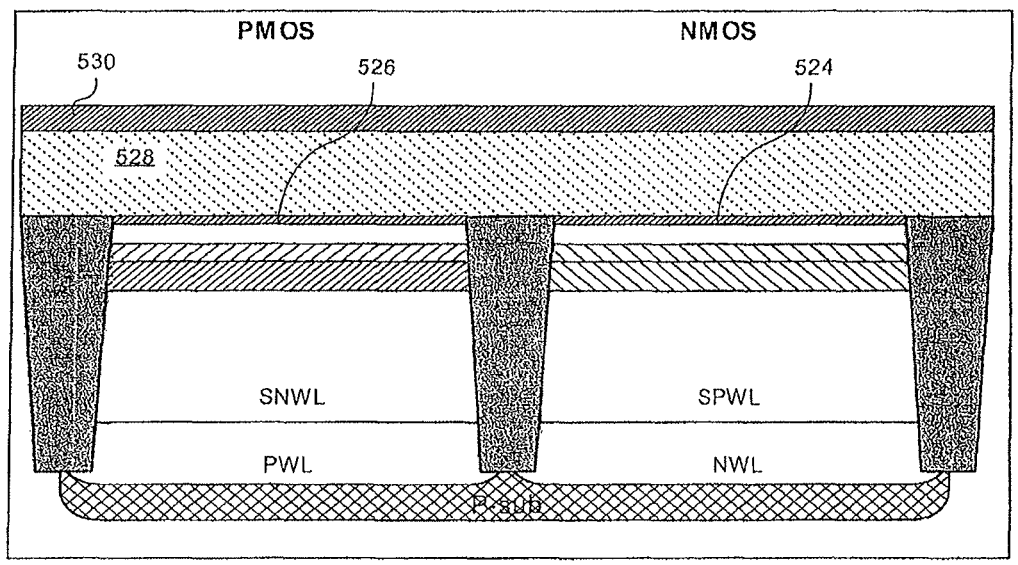

In FIG. 5F, gate dielectric formation is performed to form layer 524, 526 for each respective device. A dummy poly silicon layer 528 is formed over both devices, for example a dummy poly silicon deposition at 80 nm. Layer 530 is subsequently added.

Figure 5G:
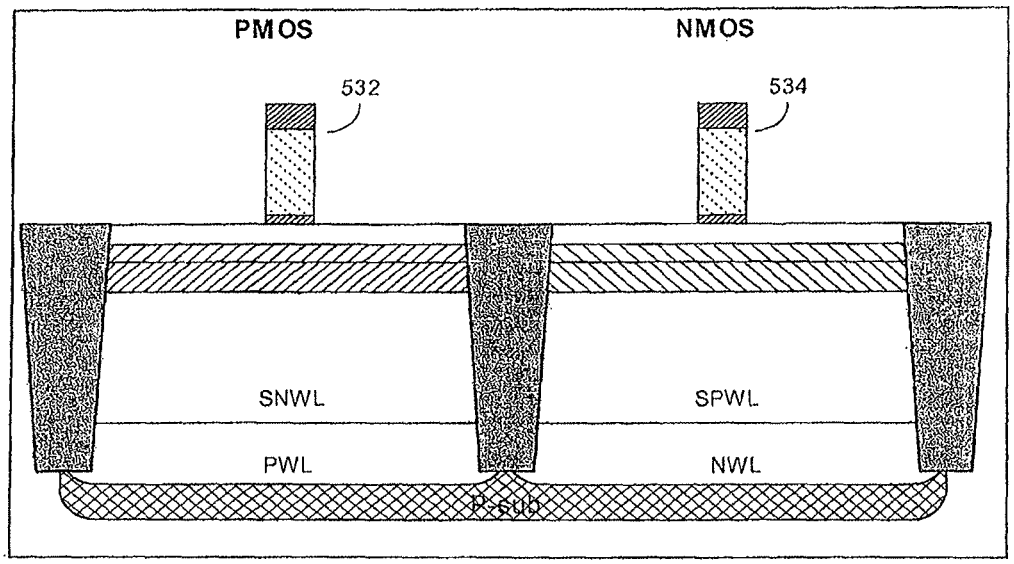

In FIG. 5G, Poly is patterned to form gates 532, 534 over the wafer. This can be performed with HM (Hard Mask)/Poly patterning followed by post-poly etch cleaning processes.

Figure 5H:
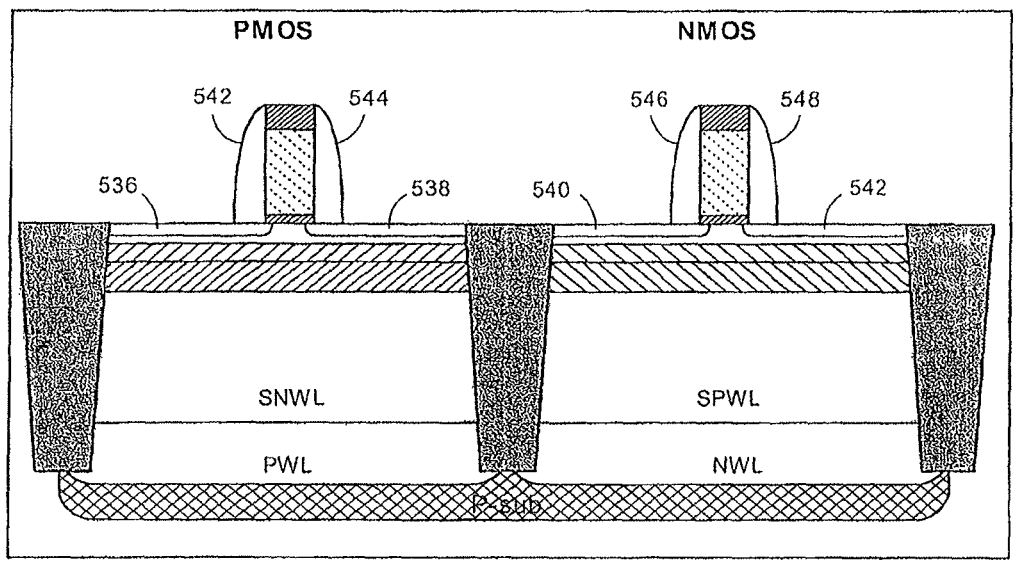

In FIG. 5H, source/drain structures and spacers are added to each device (S/D 536, 538 and 540, 542) (Spacers 542, 544 and 546, 548). In one example, conventional processing may be used to implant N and P extension junctions and form spacers over the poly-Si. The tips may be formed with a first NTP patterning and implant for the source and drain over the shallow N-well, and the PTP patterning and implant for forming the source and drain over the shallow P-well. The spacers can be formed by a pre-clean and deposition followed by a spacer etch and cleaning process.

Figure 5I:
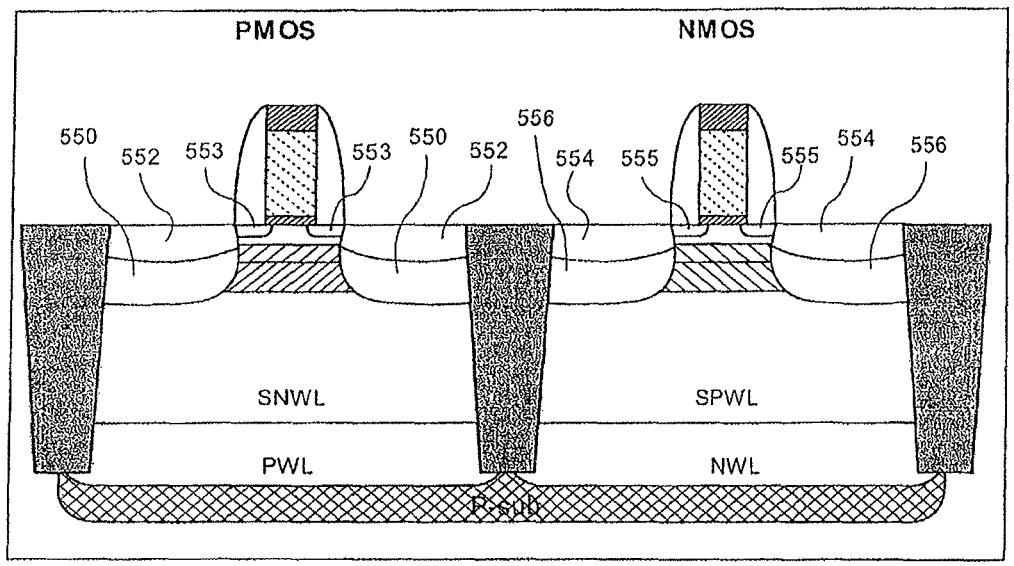
Figure 5J:
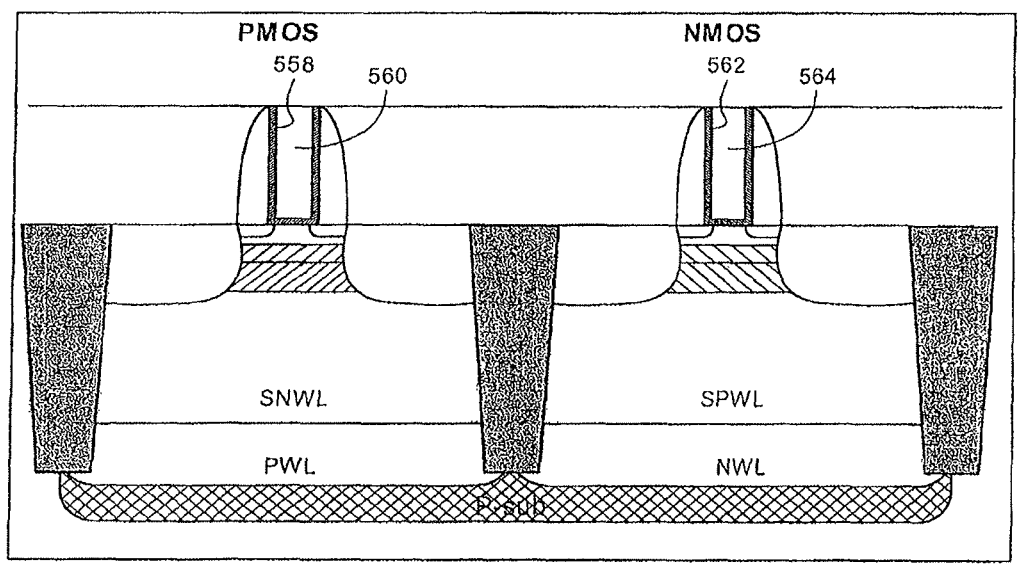

Next, shown in FIG. 5I, the sources and drains on the PMOS device can be formed by a PSD (p-type source/drain) patterning and implant with the NMOS device masked off. The sources and drains of the NMOS device can be formed by a NSD patterning and implant with the PMOS device masked off. Each source and drain of both devices can then be activated with an anneal process to give the sources and drains for each device.

Again, this alternative process is termed a Gate-Last process, which is not done in conventional processes. In the final steps, shown in FIG. 5J, the gate formation is performed using several steps. First, there is an ILD deposition and polish, followed by the dummy gate removal in space 564, followed by High-K/Metal Gate deposition and NMOS metal deposition 558 and PMOS metal deposition 562 in each respective device using mask patterning. Finally the fill metal is formed followed by a metal polish.

Figure 6A:
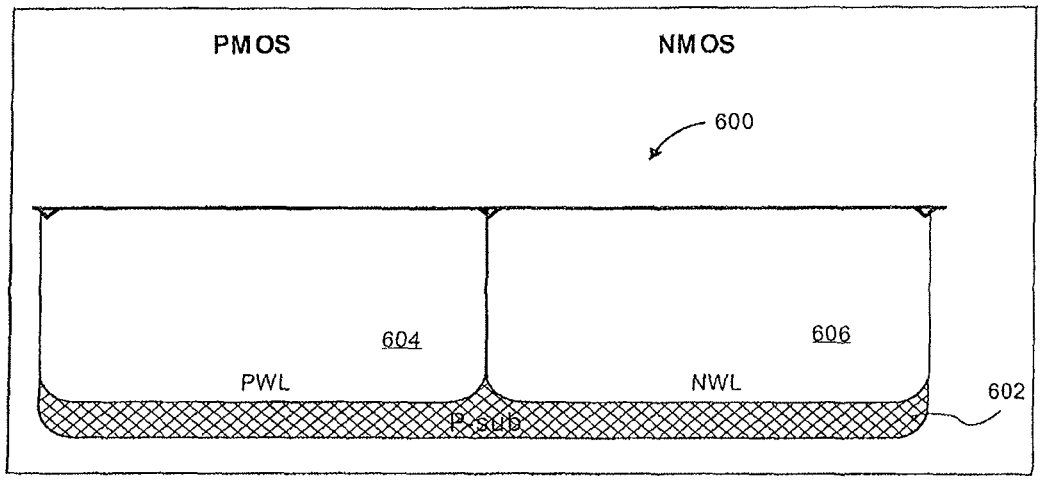
FIGS. 6A-6M are flow diagrams showing another embodiment of an integrated circuit process flow.

FIGS. 6A-6M show another alternative embodiment, where a selective in-situ EPI process is used. In FIG. 6A, in the device 600 includes a P-type substrate 602. The STI is first aligned, followed by P-type well (PWL) patterning and implant to form PWL 604 and N-type well (NWL) patterning to form NWL 606. As discussed above, in alternative embodiments, non-shallow well 604 and analog and input/output circuits (I/O) can be formed using the same base structure as shown. In one example, N-well is implanted with As (50-150 keV, 1e13-1e14), and P-well is implanted with B (10-80 keV, 1e13-1e14). According to one embodiment, well patterning is done before STI patterning, which is opposite of conventional known flows.

Figure 6B:
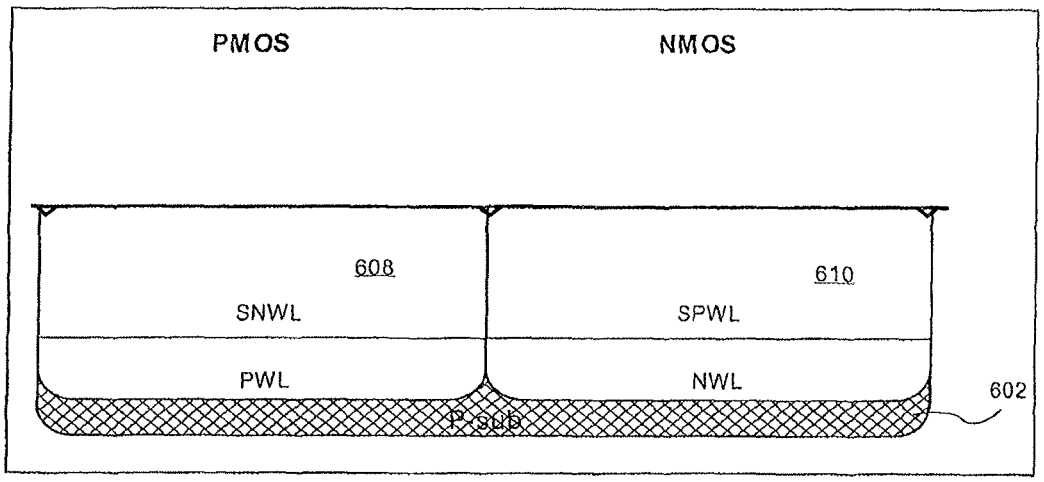

Referring to FIG. 6B, shallow wells 608 (shallow N-type well) and 610 (shallow P-type well) are implanted with separate patterning to mask each when the other is being implanted. In one example, the SN-well is implanted with As (15-80 keV, 1e13-1e14), and the SP-well is implanted with B (5-30 keV, 1e13-1e14). In this example, shallow-wells are optional and can be formed or blocked using litho masking to make both types of transistors on same wafer.

Figure 6C:
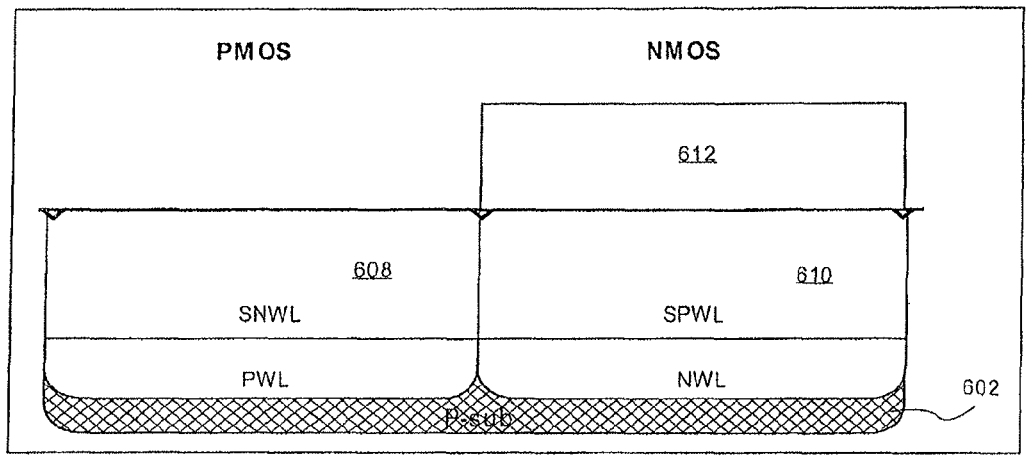
Figure 6D:
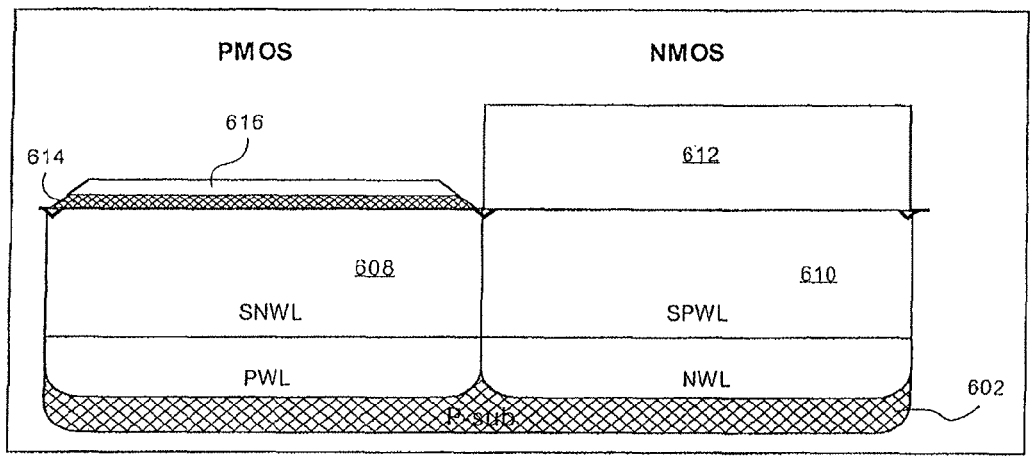

Referring to FIG. 6C, oxide deposition of oxide layer 612 on the SPWL is performed to expose the SNWL 608. Next, referring to FIG. 6D, an in-situ As step-doped EPI film is deposited. Illustrated are two layers 614, 616, and there may be an optional third layer. In one process, a single EPI film is deposited with step doping, where the initial layer is 10-30 nm As=1e19, a middle layer is 2 nm to 10 nm As=5e18, and a top layer is 5 nm to 20 nm As less than or equal to 5e17. In another example, only two layers are deposited to form a single EPI film using step doping by first depositing an initial layer at 10-30 nm As=5e19, followed by a top layer 5 nm to 20 nm As less than or equal to 5e17. In one example, the facet is contained within STI width, i.e. $Width_{Facet} < 0.5 \times Width_{STI}$, and the facet width is approximately 7 nm for every 10 nm of film thickness.

Figure 6E:
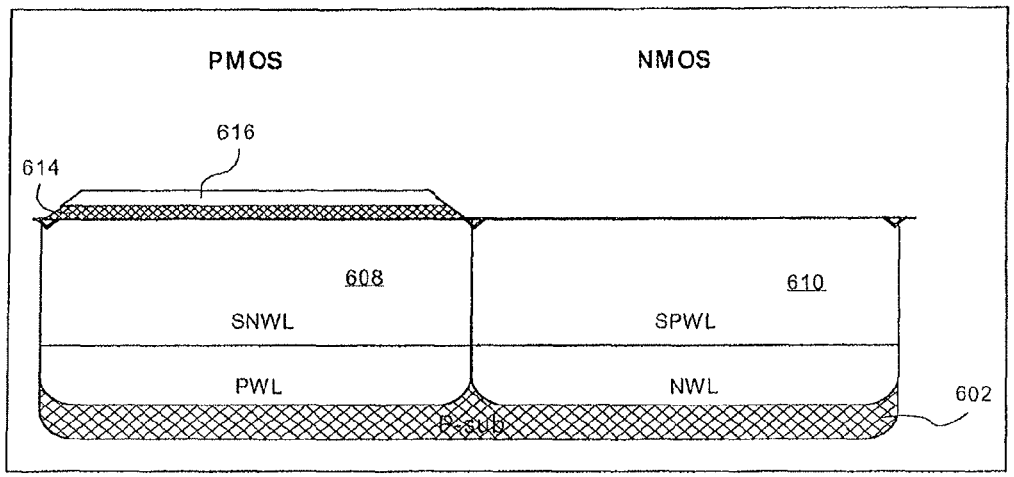
Figure 6F:
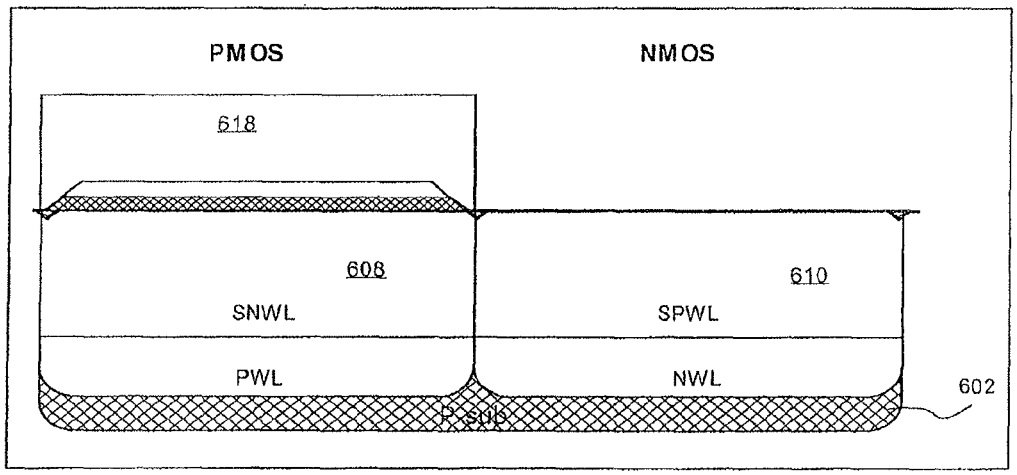

Referring to FIG. 6E, the oxide 612 is stripped, and in FIG. 6F an oxide layer 618 is deposited over the new structure over the SNWL 608.

Figure 6G:
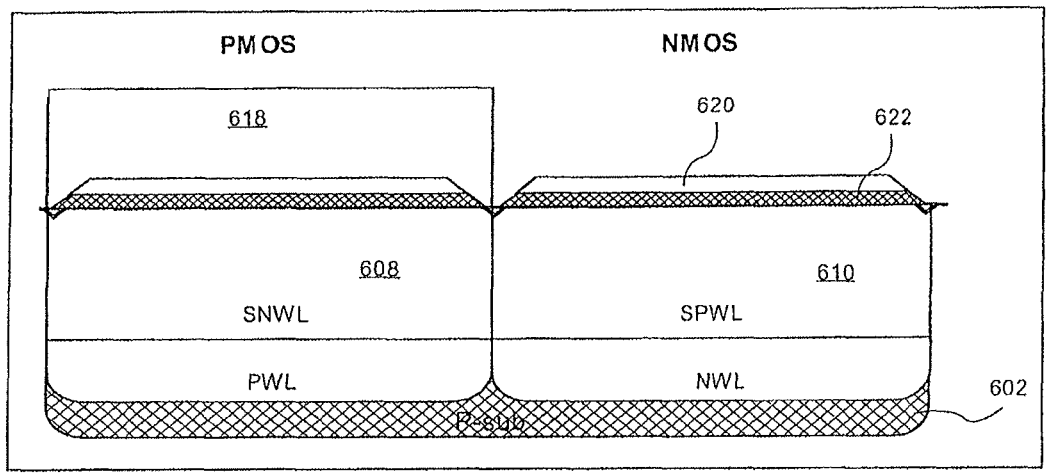
Figure 6H:
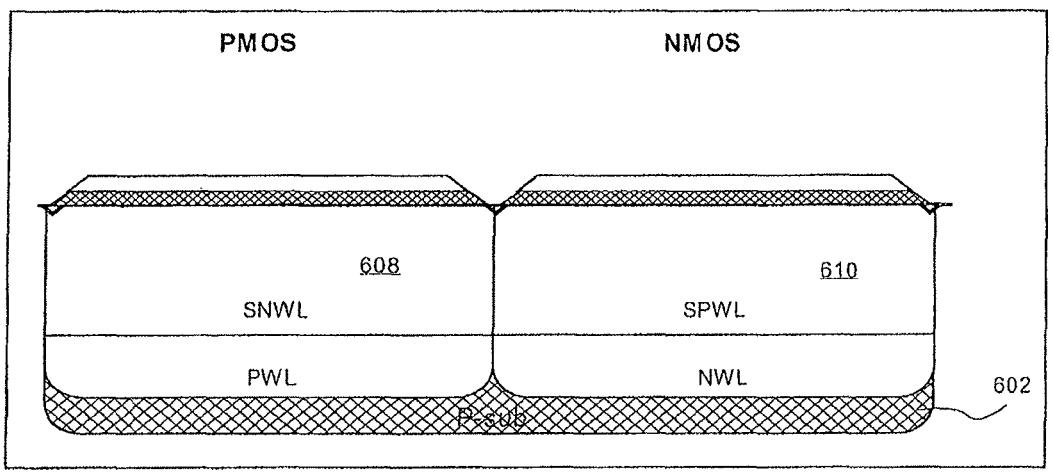

In FIG. 6G, the new layers 620, 622 are formed in the same or similar member as the structures 614, 616 of FIG. 6E, but it is doped with Boron instead of Arsenic. In one process, a single EPI film is deposited with step doping, where the initial layer is 10-30 nm B=1e19, a middle layer is 2 nm to 10 nm B=5e18, and a top layer is 5 nm to 20 nm B less than or equal to 5e17. In another example, only two layers are deposited to form a single EPI film using step doping by first depositing an initial layer at 10-30 nm B=5e19, followed by a top layer 5 nm to 20 nm B less than or equal to 5e17. Oxide 618 is stripped in FIG. 6H, leaving the two matching structures over the SNWL 608 and SPWL 610 respectively.

Figure 6I:
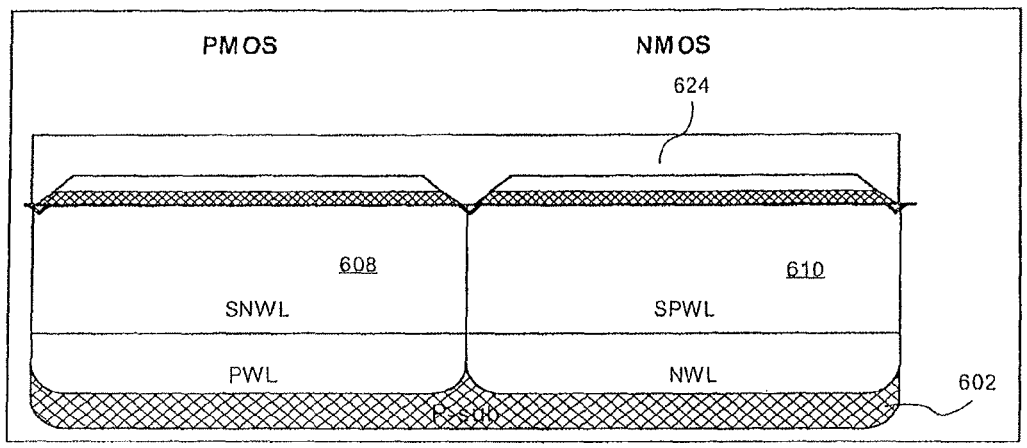

In FIG. 6I, STI pad oxide (Lo-T thermal) and nitride deposition (Lo-T CVD) gives new pad oxide layer 624. In practice, the different facets can be doped and hence have different oxidation rates.

Figure 6J:
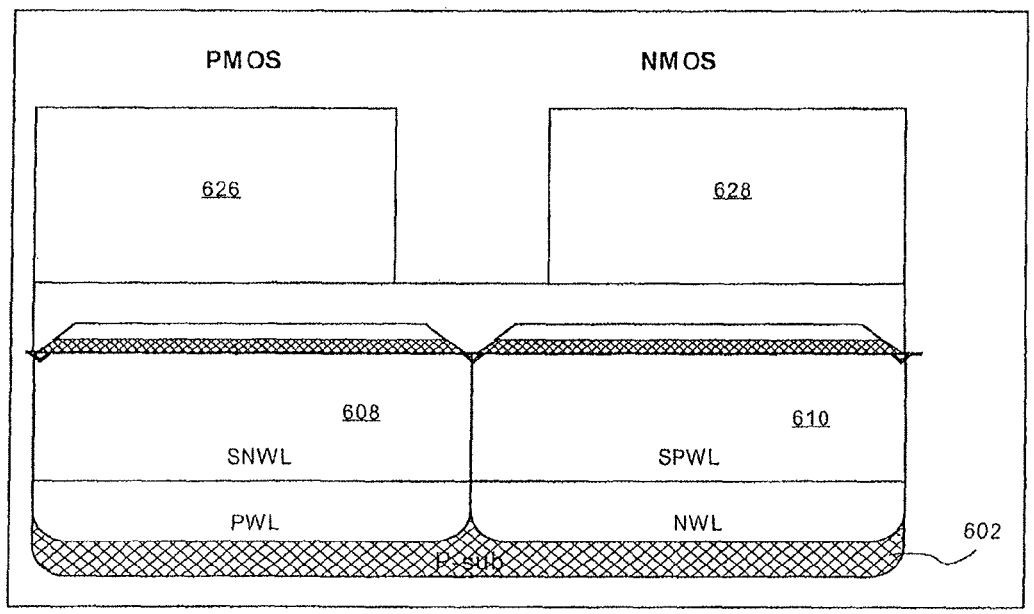
Figure 6K:
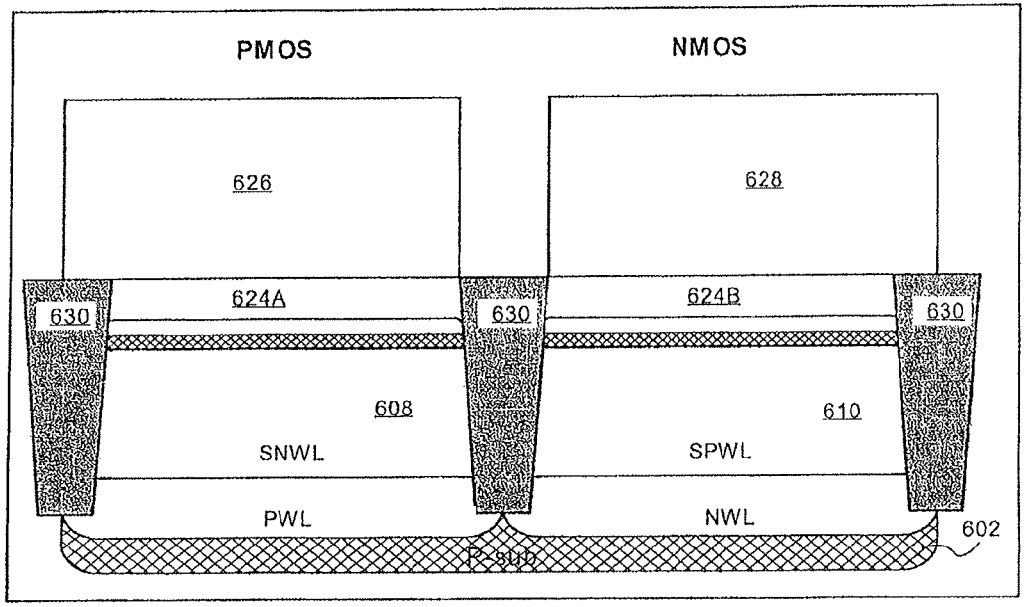
Figure 6L:
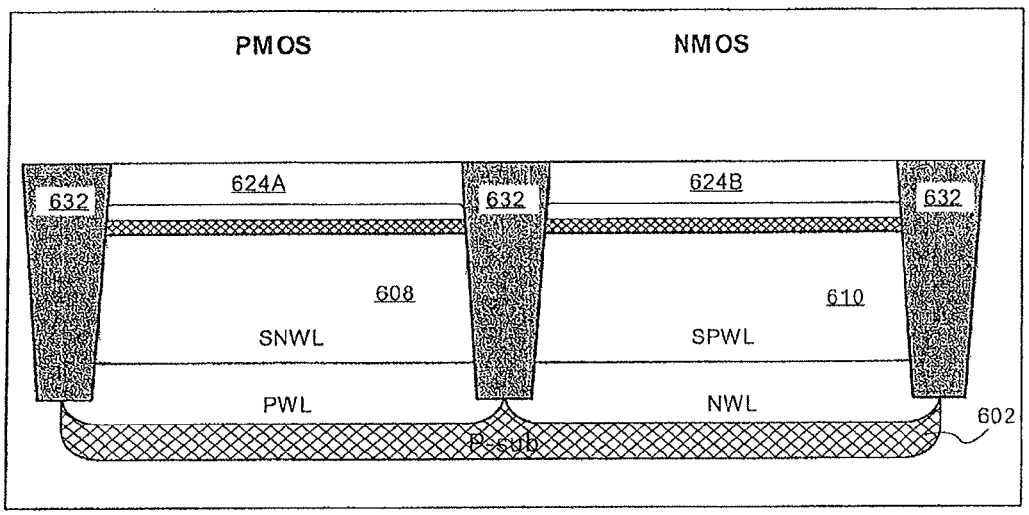
Figure 6M:
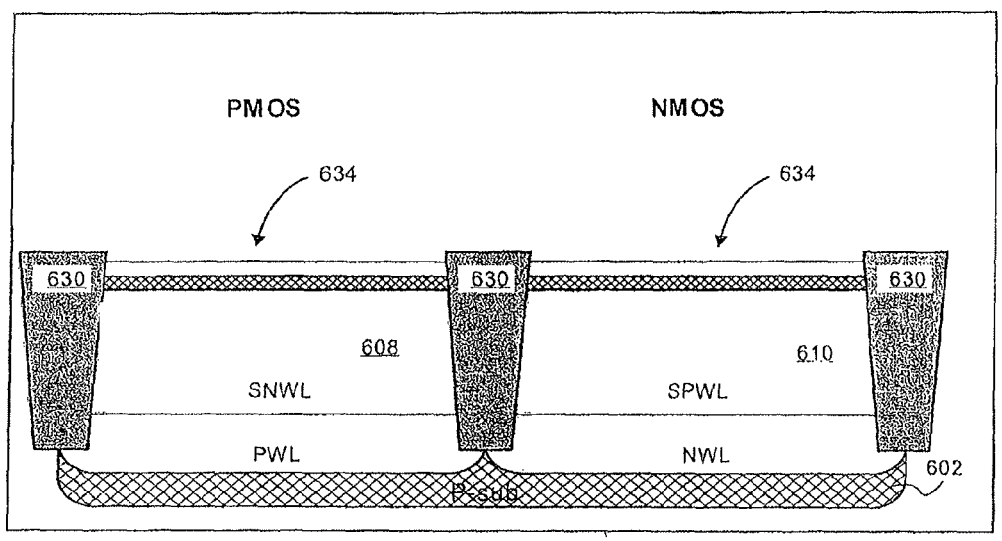

In FIG. 6J, STI lithography layers 626, 628 are deposited over the respective N and P wells to mask the separate transistors in preparation for the STI process. In practice, a minimum STI width is preferred, such as an STI width that is greater than two times the maximum facet width. In FIG. 6K, the STI space is etched and cleaned to give STI space 630. In FIG. 6L, resist layers 626, 628 are removed and cleaned, and STI trench sacrificial oxide and HDP, CVD or SOD fills may be performed to form the STIs 632, followed by an oxide CMP to stop on nitride. In FIG. 6M, nitride is removed, by hot peroxide wet etch for example, followed by a step height adjustment (by HF wet etch for example) to give the well formations 634.

According to one embodiment, a low thermal budget Shallow Trench Isolation (STI) process is provided to control the dopant thermal diffusion in the channel and wells to device specifications described in the previous sections. In processing, the thermal budget of a particular flow is a function of time and temperature. If either can be reduced relative to the other, it can provide a direct economic and device benefit to the process. As further background, modern IC technology employs STI as means of isolating individual transistor from electrically interacting with each other. A novel low thermal budget isolation process is provided herein for advanced CMOS processes. This process flow eliminates the traditional high thermal budget steps used in typical integrated circuit manufacturing. A stacked grown/deposited PAD oxide replaces the traditional high thermal budget (>900° C./>15 min) thermal oxide. The new low thermal budget stacked process may start with an ultra-thin grown buffer oxide. The purpose of the buffer oxide is to maintain the atomically smooth and pristine surface of the Silicon, as it is followed by a low thermal budget deposited oxide of lower film quality. The thermal budget of the grown buffer oxide could be <600° C. and <120 seconds. The overall thermal budget of the atomically pristine buffer oxide is kept low by reducing its thickness to less than 2 nm. The buffer oxide could be a chlorinated oxide as means of gettering metallic impurities from the surface of the incoming wafers. To complete the final stack of the PAD oxide to its final thickness of approximately 11 nm, a low thermal budget deposited oxide is utilized. A PECVD (plasma enhanced chemical vapor deposition) or LPCVD (low pressure chemical vapor deposition) deposited oxide at <500° C. could be deposited to reach the final thickness of the Pad Oxide. The initial grown buffer oxide may also consume some of the incoming silicon surface, defects and impurities. Subsequent wet etch removal of this oxide later in the process can provide an atomically smooth silicon surface for the purpose of the gate dielectric formation. The top surface of this silicon also acts as the channel of the CMOS device for both NMOS and PMOS devices. An alternative low thermal budget pad oxidation could be employed with fast steam oxidation in vertical diffusion furnaces.

Again, according to one embodiment, a process is provided for low thermal budget processing. An isolation nitride follows pad oxide processing. Isolation nitride can be utilized as a CMP stopping layer. The density and thickness of this nitride determines the post gap-fill trench profile, dishing and over-hang. Typical isolation nitride is generally done in vertical diffusion furnaces at high temperatures. Such family of nitrides in general is formed to have a tensile stress in the range of 200 MPa to 1 GPa. A PECVD nitride layer with a tunable stress of 3 GPa tensile and −3 GPa compressive nature can be deposited. The fundamental nitride film characteristics such as index of refraction, stress, density and polish rate could be adjusted to match specific process conditions required for a given product.

The process is followed by STI litho and patterning. Typical 45 nm node STI uses a pitch and depth of approximately 200/200 nm. At the 32 nm node, the pitch and depth can be reduced to approximately 150/200 nm. A nitride etch followed by oxide etch exposes the silicon surface for the final isolation silicon etch. A chlorine based chemistry can then be used to etch the silicon with the desired trench profile. Post silicon etch, a wet etch chemistry, may be used to clean the silicon surface from etch residues. A two step low thermal budget oxidation may be utilized for an asymmetric oxidation of silicon corners and sidewalls, leading to rounded corners, which can reduce leakage in the resulting transistor. The trench is then filled by an oxide gap-fill process such as High Density Plasma, Spin-On-Dielectric or Sub Atmospheric Chemical Vapor Deposition. The deposition process may be performed at less than 500° C., a significant reduction in processing temperature.

The high thermal budget densification of this deposited gap-fill oxide (>900° C./>15 min) is required to reduce the etch rate and hardened the oxide for subsequent Chemical Mechanical Polish steps. This high thermal budget densification step is replaced by a Rapid Thermal Processing (RTP) technique or other rapid thermal annealing techniques such as exposure to a laser pulse. The frequency and pulse ranges of a laser could be optimized to either maximum absorption of the heat by gap-fill oxide or maximum absorption by the surrounding silicon. The surrounding silicon will then transfer the heat to adjacent gap-fill oxide in the trenches. The process is then followed by Chemical Mechanical Polishing, utilizing nitride as an etch stop layer followed by a dry or controlled wet etch of the oxide to reduce the etch rate. To control the wet etch rate of the deposited gap-fill oxide a chemistry is chosen to minimize the etch rate by first nitridizing the oxide in a nitridizing agent gas such as $NH_3$ or dual nitridizing/oxidizing gas agent such as $N_2O$. The etch rate of the nitrided gap-fill oxide is significantly reduced thus allowing for thermal budget of the densification step to be reduced significantly.

FIGS. 7A-7H illustrate one example of this alternative approach, showing a process flow configured to reduce the thermal budget in the manufacturing process, saving manufacturing costs. The process of forming device 700 in FIG. 7A starts with a P+ Substrate 702, followed by a P-substrate EPI layer 704, then a buffer oxide layer 705 then pad oxide layer 706, and finally an isolation nitride layer 708. In one embodiment, an incoming wafer may be produced with a P$^-$ type EPI over P$^+$ Substrate. The pad oxide may be approximately a 10 nm thermal oxide, produced at approximately 900° C., and in a VDF Process. The pad oxide is a buffer oxide, and may be PECVD oxide deposited. The isolation nitride may be an approximate 100 nm CVD Nitride, produced at approximately 500° C., in a VDF Process. The isolation nitride may be a PECVD isolation nitride.

Figure 7A:
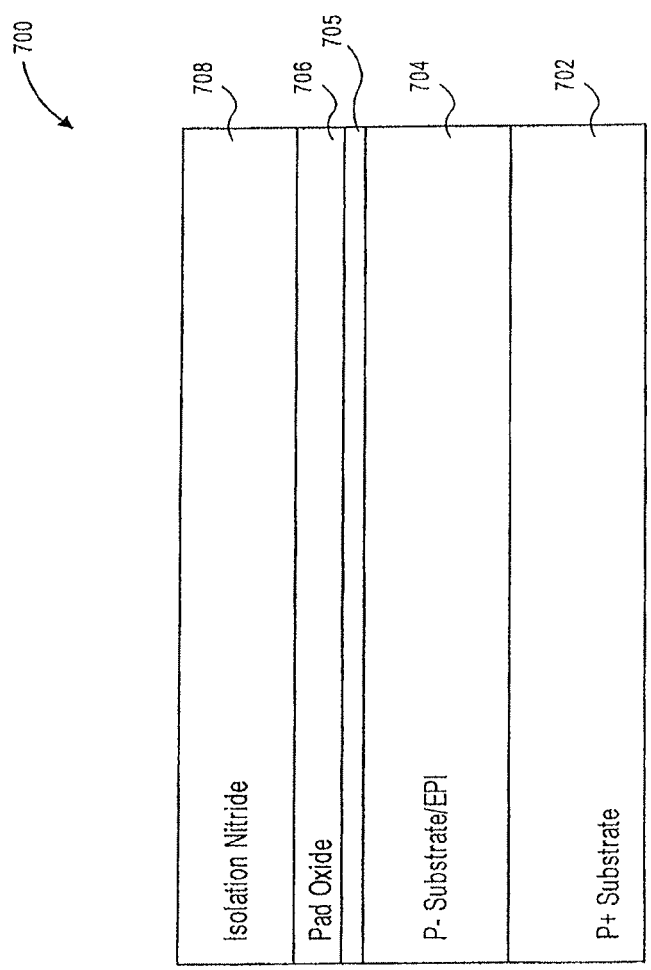
Figure 7B:
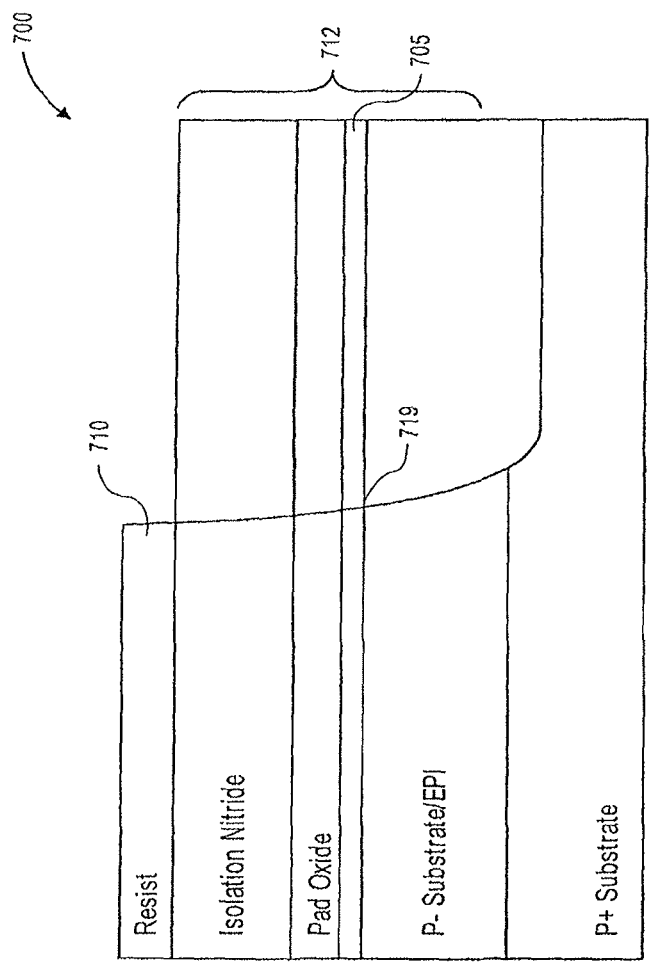

In FIG. 7B, a resist layer 710 is deposited over the isolation nitride. This allows for the removal of the layers 712, including the isolation nitride, pad oxide, the P substrate, and part of the P$^+$ substrate. This may be performed by first performing a nitride dry etch, followed by a pad oxide dry etch, followed by a silicon etch to a certain depth. According to this embodiment, the removal of the layers results in an STI trench that is below the P$^-$ substrate and trenches into part of the P$^+$ substrate, allowing for a proper isolation of well structures for a DDC structure formed together with various different devices.

Figure 7C:
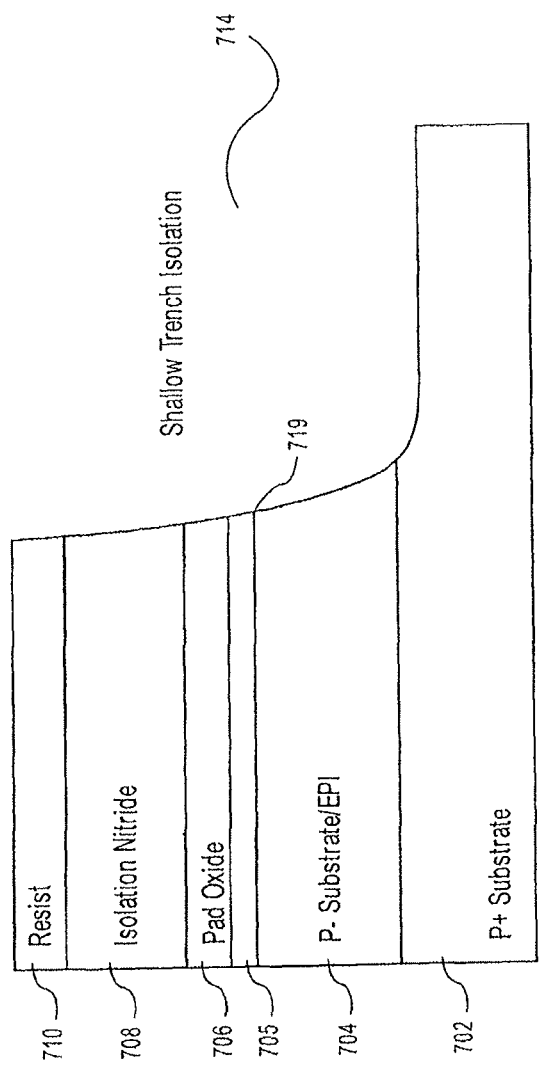
Figure 7D:
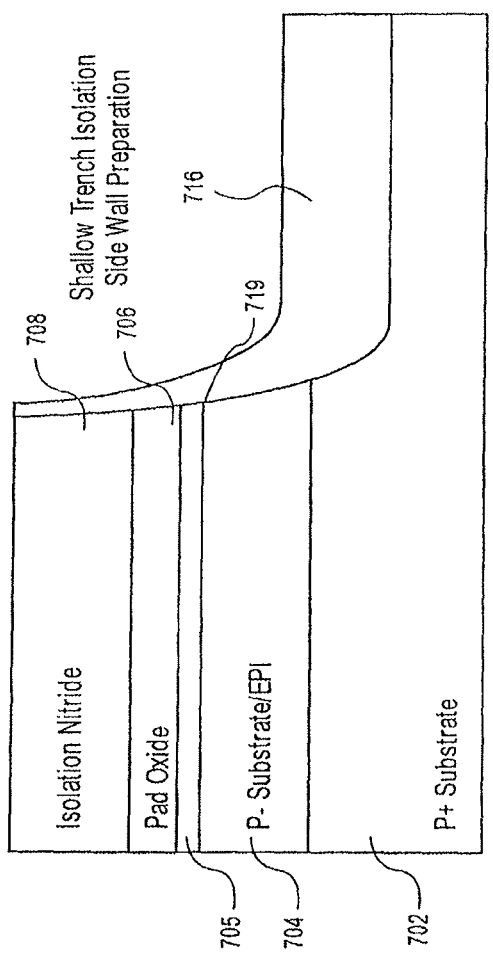
Figure 7F:
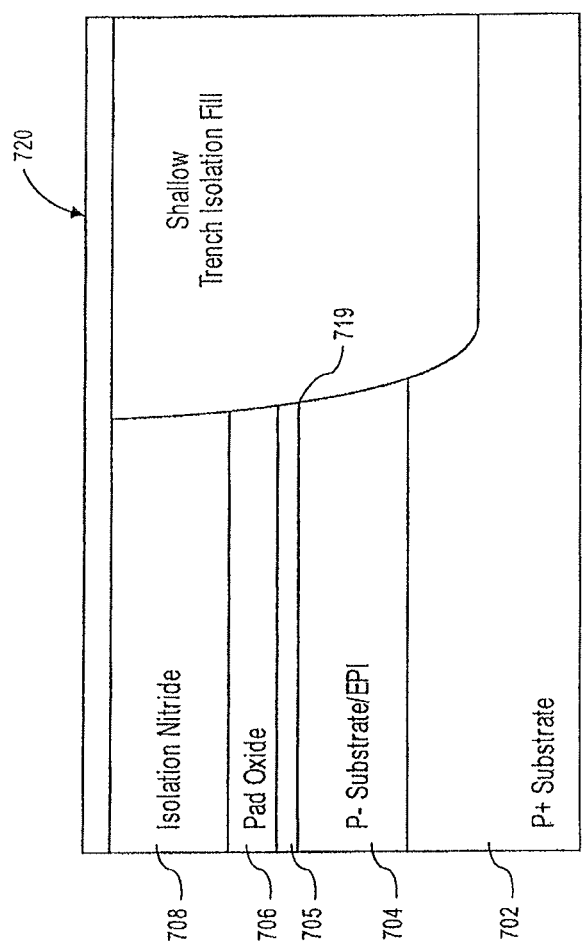
Figure 7G:
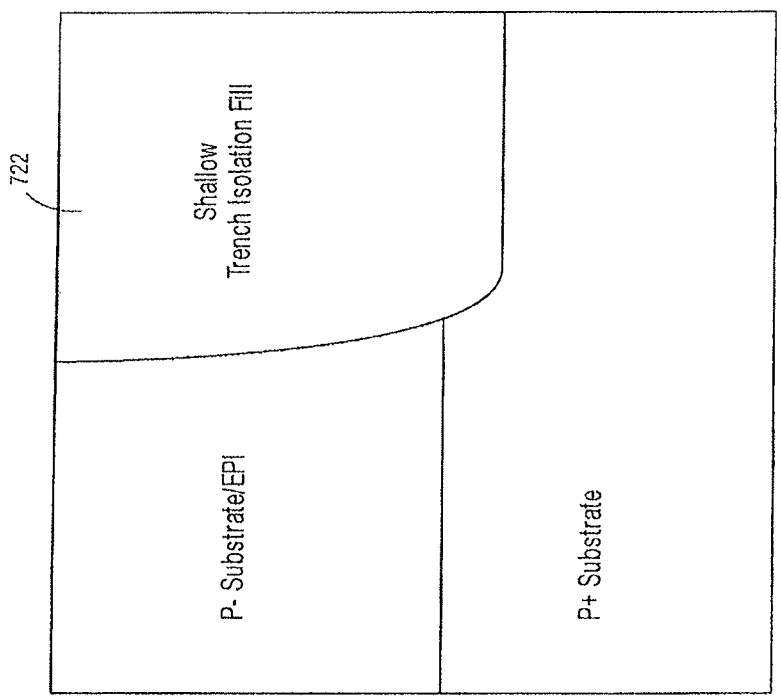
Figure 7H:
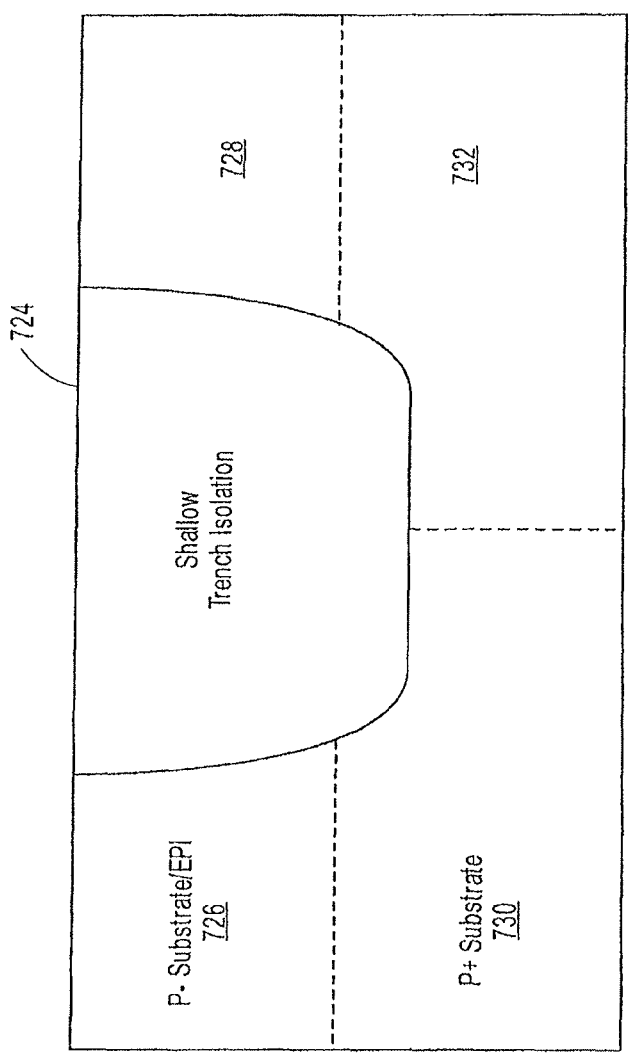
Figure 71:
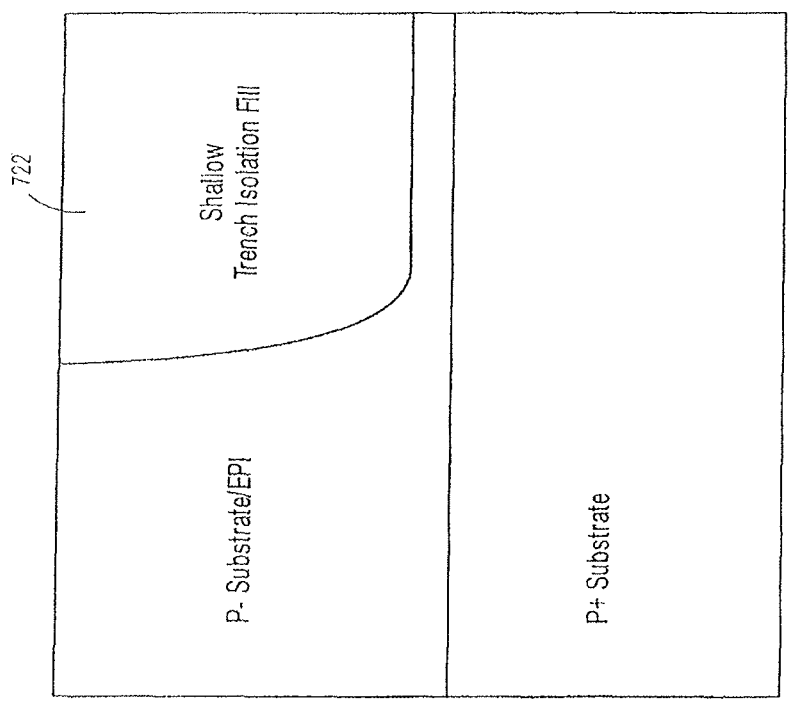

In FIG. 7C, the result shows the shallow trench 714, ready for STI structure formation. In FIG. 7D, a side wall preparation 716 formed by high temperature oxidation followed by a high temperature nitridation, effectively leaving an extended pad oxide layer with pad oxide layer 706 and side wall preparation layer 716 together. One of the benefits of this side wall preparation layer is that it protects the P$^-$ substrate to some extent, and, when the shallow trench isolation (STI) fill is performed as in FIG. 7E, the corner around the P$^-$ substrate 719 is rounded. This rounded corner reduces leakage in the resulting transistor device. In one example, the STI fill of FIG. 7E may be performed by HDP compressive oxide in up to a 32 nm node design. The SACVD (sub-atomic chemical vapor deposition) tensile oxide post may be used for the 32 nm node design. SOD (spin on dielectric) may be used for the 32 nm Node, and may require high temperature anneal. In FIG. 7F, a chemical mechanical polish (CMP) may be performed, where the top layer 720 above the isolation nitride layer 708 is reduced by chemical mechanical polish. In practice with current processing devices, the layer automatically stops short of the isolation nitride layer. In FIG. 7G, the pad oxide layer is etched away with a HF pad oxide etch process, and the isolation nitride is etched away with a phosphoric etch process. The result is the P$^+$ substrate having the P$^-$ substrate EPI and having a high quality shallow trench isolation fill 722. FIG. 7H shows the resulting structure that can be produced for multiple devices, such as the two partial devices shown, one possibly with P$^-$ substrate 726 for a P-type transistor, and the other 728 that can be either a P$^-$ substrate over a N$^+$ substrate over a P$^-$ substrate, or other configured device and separated from the other device with STI 724.

Figure 7J:
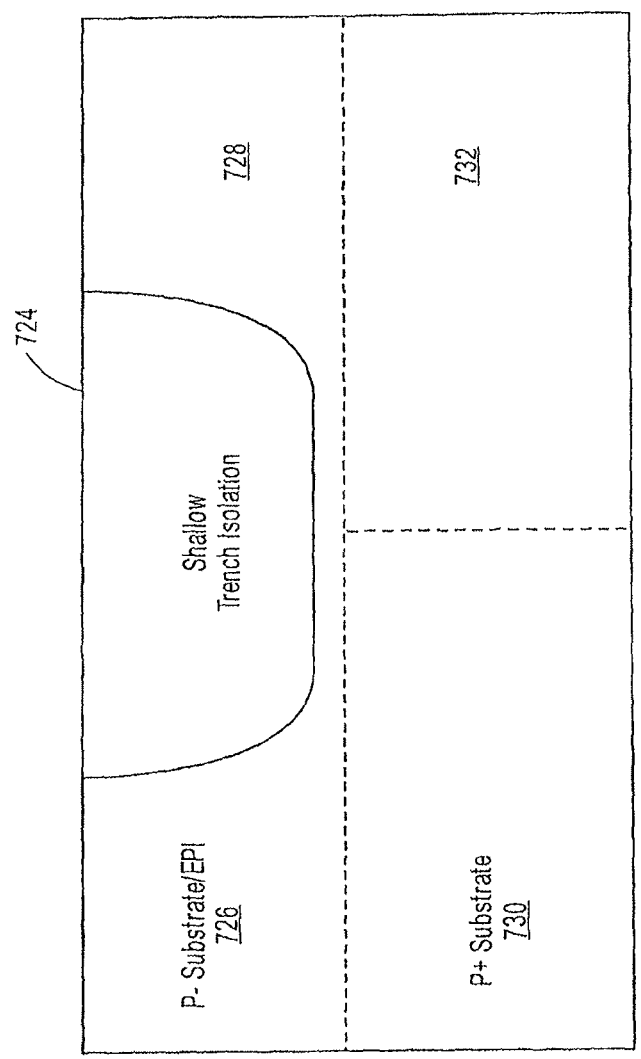

FIGS. 7I and 7J show an alternative embodiment, where the STI trench isolation fill 722 reaches down into the P$^-$ substrate, and not down into the P$^+$ substrate. In devices, such as non-DDC configured devices, this configuration may be desired, since the deeper isolation of the STI is not required in some devices.

According to various embodiments described herein, different dopant profiles may be achieved within certain ranges. These ranges illustrated and the parameters set out are intended as examples, and those skilled in the art will understand that the benefits of the embodiments described and illustrated herein are attainable generally about or within those ranges.

In practice, designers and manufacturers gather statistical data from mathematical models and sample measurements from actual circuits to determine the variance of threshold voltages of a circuit design. The voltage differential mismatch between transistors, whether derived from manufacturing variations or RDFs, is determined as $\sigma V_T$. In order for the circuit as a whole to operate, the operating voltage $V_{DD}$ must be chosen in view of $\sigma V_T$. Generally the larger the variance, the higher the $\sigma V_T$, such that the operating voltage $V_{DD}$ must be set higher for the transistor to operate properly. With multiple device implemented across a circuit, $V_{DD}$ may need to be set at the highest overall value in order for the circuit to operate properly.

A structure and method of its production are provided that reduces $\sigma V_T$, reducing the range of variance of the threshold voltage of the transistors across the integrated circuit. With reduced $\sigma V_T$, the static value of $V_T$ can be set more precisely and can even be varied in response to a changing bias voltage. The threshold voltage for nominally identical devices across a circuit may be more accurately set with decreased $\sigma V_T$, thus allowing the device to operate using a lower operating voltage $V_{DD}$ and, therefore, consume less power. Moreover, with more headroom to vary $V_T$ for a given transistor or group of transistors, devices can be operated at different modes corresponding to different bias voltages for particular modes. This may add functionality to many devices and systems and may particularly benefit devices where fine control of device power modes is useful.

In the various processes described herein, while dopants can be implanted or co-deposited during epitaxial growth, further high temperature processing can promote dopant diffusion through the silicon lattice. High temperature process steps required to form transistor structures can result in dopant atoms moving from a screening layer into the previously undoped channel, or even migrate into a gate oxide. There are several methods provided herein to address the prevention of dopant diffusion in different process flows, such as for example when thermal annealing procedures are performed in a process.

In one method, carbon can be introduced into the screening via implant or the growth of a silicon carbide (SiC)

epitaxial layer. During annealing for example, substitutional carbon traps (via a kick-out mechanism) any mobile carriers such as boron or phosphorus. The addition of carbon helps to prevent diffusion during the high thermal cycles a poly-silicon gate transistor typically experiences.

Indium is known to form a cluster with boron which is not mobile. However, this also leads to low dopant activation of boron. Thus, methods to achieve both high activation and low diffusion include the co-implantation of indium and boron. Several examples are included herein, and others are possible given this disclosure, including these examples and other processes used together in different combinations. In one exemplary process, co-implantation of indium and boron can be performed such that their peaks align. Different ratios between the peaks of indium and boron along with anneal options such as Flash and Laser will result in high concentration and sharp profiles. In another example, co-implantation of indium and boron can be performed such that the peak of indium is closer to the surface then boron. Boron diffusing to the surface will be slowed by the indium while the screening and $V_T$ layer will achieve high activation. In yet another example, co-implantation of indium and born can be performed such that the peak of the indium is closer to the substrate then the boron. This will prevent indium from diffusing into the substrate allowing high concentration to exist in the screening layer. In still another example, molecular forms of boron and carbon may be used.

While carbon is useful in preventing migration of boron or other dopants, carbon itself may migrate into the undoped channel, increasing scattering and reducing channel mobility. To prevent carbon diffusion, the following procedure can be useful. If carbon and boron are co-implanted into amorphous silicon, a low temperature anneal may be used to re-grow the silicon layer. During this low temperature anneal, carbon re-grows substitutionally. This is because, when a process begins with crystal on silicon, it needs to be made amorphous, or amorphized, for processing so that is no longer in a crystalline state. It must then after be annealed to place it back in the crystalline state, or re-crystallized. Re-growth of crystal on silicon from the amorphous state can then be achieved. With carbon located in interstitial locations in the crystal lattice, carbon will substitute silicon atoms in the lattice. Thus, carbon re-grows substitutionally.

This re-growth results in a large concentration of silicon interstitials. With subsequent anneals, these interstitials diffuse rapidly towards the surface and pull boron from the screening region into the channel region. Additionally, the substitutional Carbon becomes interstitial via a kick-out mechanism which retards the boron diffusion. This interstitial carbon also diffuses towards the surface and would normally cause mobility degradation of the channel and create undesired surface states.

However, in this process embodiment, as the boron, excess interstitials and carbon move to the surface, a high temperature anneal followed by oxidation or a high temperature oxidation acts to consume boron, carbon and interstitial concentration that have moved to the surface. The oxidation process will create additional interstitials, so this oxidation needs to be thin (approximately 2 nm). The oxide is then stripped and the undoped silicon channel is epitaxially grown on the contamination free surface. The undoped EPI has reduced exposure to the mobile carbon and boron which has been removed from the system via the oxide growth and strip. Additionally, a similar oxidation can be used after the EPI growth before the gate oxidation. This additional oxidation can be in addition to the first oxidation or instead of the first oxidation.

During implantation, significant damage is introduced into the silicon. The resulting interstitials assist the Boron in diffusing quickly. According to one embodiment, by removing the implant damage, the interstitials can be eliminated allowing for less diffusion and more abrupt junctions. Two methods of achieving this are plasma implantation and doped spin on glass. In a spin on glass process, a high dose of silicon dioxide is placed on the surface of the silicon. For plasma implantation, a high dose of highly doped plasma is deposited on the surface. Here, there is no penetration or deposition into the substrate, no implantation occurs. When annealed, dopants are drawn in at the solid solubility, where the higher temperature causes a higher solid solubility. Dopants can then be affected by thermally annealing to draw in more dopants without damaging the silicon structure. The result is a higher doping achieved with abrupt junctions, and damage to the silicon is greatly reduced.

In one embodiment, SiGe can be used to slow the diffusion of boron from the screening layer into the channel. SiGe can be deposited on top of the substrate. Dopants can be implanted in the substrate or directly co-deposited during epitaxial growth of the SiGe layer. A Si layer is still deposited as the channel. The SiGe prevents diffusion from these doped layers into the Si channel.

Delta doping of C/N/Ge/Cl/F can be used at the interface between the screening layer and the EPI layer. This layer serves to prevent dopant diffusion across the layer. This layer also minimizes the amount of dopant in the system that could diffuse into the channel of the device or segregate into the gate.

Source/drain and source/drain extensions may incur damage from the formation of the DDC channel area. Due to polysilicon requiring both deep implants and high thermal anneals to prevent poly depletion, damage and dopants introduced to the channel area via lateral straggle can create large diffusion from the DDC channel stack into the channel (via interstitials or co-diffusion effects). As poly depletion effects cannot be sacrificed, there is no way to lower the implant energy/dose or the anneal criteria. Two methods to keep channel doping from getting to the DDC channel stack is the use of RSD and secondary spacers.

A second spacer can be used to increase the lateral distance from the SD implant and the DDC channel dose to prevent damage to silicon when implanting dopants. This spacer may or may not be removed after the SD implant and before silicidation. With increased lateral Si between the Si and the DDC channel, there is a decrease in the effect of lateral straggle.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Accordingly, the specification and drawings are to be regarded in an illustrative rather than a restrictive sense.

What is claimed is:

1. An integrated circuit die containing a first device of a first conductive type and a second device of a second conductive type different from the first conductive type,
the first device of the first conductive type comprising:
a first well of the first conductive type in a semiconductor substrate;
a first shallow well of the second conductive type on the first well;
a first screening layer on the first shallow well;

a first threshold voltage tuning layer on the first screening layer to provide a first threshold voltage set notch by a doping combination of at least the first screening layer and the first threshold voltage tuning layer;
a first substantially undoped channel layer on the first threshold voltage tuning layer; and
a first gate stack having a first work function on the first substantially undoped channel layer;
the second device of the second type comprising:
a second well of the first conductive type in the semiconductor substrate;
a second screening layer on the second well;
a second threshold voltage tuning layer on the second screening layer to provide a second threshold voltage set notch by a doping combination of at least the second screening layer and the second threshold voltage tuning layer;
a second substantially undoped channel layer on the second threshold voltage tuning layer;
a second gate stack having a second work function on the second substantially undoped channel layer; and
an isolation film formed in the semiconductor substrate separates the first device from the second device,
wherein the first threshold voltage tuning layer comprises such dopants concentration that a first vertical dopant profile formed by the first channel layer, the first threshold voltage tuning layer, and the first screening layer, creates the first threshold set notch with a shallow configuration, and wherein the second threshold voltage tuning layer comprises such dopants concentration that a second vertical dopant profile formed by the second channel layer, the second threshold voltage tuning layer, and the second screening layer, creates the second threshold set notch, and wherein the first shallow well is separated from the semiconductor substrate by the isolation film and the first well.

2. The integrated circuit die of claim 1, further comprising:
a body tap coupled to the second well, the body tap operable to selectively apply a bias thereto to adjust a threshold voltage of the second device.

3. An integrated circuit die containing a first device of a first conductive type and a second device of a second conductive type different from the first conductive type,
the first device of the first conductive type comprising:
a first well of the first conductive type in a semiconductor substrate;
a first shallow well of the second conductive type on the first well;
a first screening layer on the first shallow well;
a first threshold voltage tuning layer above the first screening layer to provide a first threshold voltage set notch by a doping combination of at least the first screening layer and the first threshold voltage tuning layer;
a first dopant migration resistant layer between the first threshold voltage tuning layer and the first screening layer;
a first substantially undoped channel layer on the first threshold voltage tuning layer; and
a first gate stack having a first work function on the first substantially undoped channel layer;
the second device of the second type comprising:
a second well of the first conductive type in the semiconductor substrate;
a second screening layer on the second well;
a second threshold voltage tuning layer above the second screening layer to provide a second threshold voltage set notch by a doping combination of at least the second screening layer and the second threshold voltage tuning layer;
a second substantially undoped channel layer on the second threshold voltage tuning layer;
a second gate stack having a second work function on the second substantially undoped channel layer; and
an isolation film formed in the semiconductor substrate separates the first device from the second device,
wherein the first threshold voltage tuning layer comprises such dopants concentration that a first vertical dopant profile formed by the first channel layer, the first threshold voltage tuning layer, and the first screening layer, creates the first threshold set notch, and wherein the second threshold voltage tuning layer comprises such dopants concentration that a second vertical dopant profile formed by the second channel layer, the second threshold voltage tuning layer, and the second screening layer, creates the second threshold set notch, and wherein the first shallow well is separated from the semiconductor substrate by the isolation film and the first well.

4. An integrated circuit die containing a first device of a first conductive type and a second device of a second conductive type different from the first conductive type,
the first device of the first conductive type comprising:
a first well of the first conductive type in a semiconductor substrate;
a first shallow well of the second conductive type on the first well;
a first screening layer on the first shallow well;
a first threshold voltage tuning layer on the first screening layer to provide a first threshold voltage set notch by a doping combination of at least the first screening layer and the first threshold voltage tuning layer;
a first substantially undoped channel layer on the first threshold voltage tuning layer; and
a first gate stack having a first work function on the first substantially undoped channel layer;
the second device of the second type comprising:
a second well of the first conductive type in the semiconductor substrate;
a second screening layer on the second well;
a second threshold voltage tuning layer above the second screening layer to provide a second threshold voltage set notch by a doping combination of at least the second screening layer and the second threshold voltage tuning layer;
a second dopant migration resistant layer between the second threshold voltage tuning layer and the second screening layer;
a second substantially undoped channel layer on the second threshold voltage tuning layer;
a second gate stack having a second work function on the second substantially undoped channel layer; and
an isolation film formed in the semiconductor substrate separates the first device from the second device,
wherein the first threshold voltage tuning layer comprises such dopants concentration that a first vertical dopant profile formed by the first channel layer, the first threshold voltage tuning layer, and the first screening layer, creates the first threshold set notch, and wherein the second threshold voltage tuning layer comprises such dopants concentration that a second vertical dopant profile formed by the second channel layer, the second threshold voltage tuning layer, and the second screening layer, creates the second threshold set notch, and wherein the first shallow well is separated from the semiconductor substrate by the isolation film and the first well.

5. The integrated circuit die of claim 1, wherein the first gate stack comprises metal or nitride of metal.

6. The integrated circuit die of claim 1, wherein the second gate stack comprises metal or nitride of metal.

7. The integrated circuit die of claim 1, wherein second threshold set notch has a shallow configuration.

* * * * *